(12) United States Patent
Kocon et al.

(10) Patent No.: US 10,573,718 B2
(45) Date of Patent: Feb. 25, 2020

(54) VERTICAL HIGH-VOLTAGE MOS TRANSISTOR

(71) Applicant: Texas Instruments Incorporated, Dallas, TX (US)

(72) Inventors: Christopher Boguslaw Kocon, Mountain Top, PA (US); Simon John Molloy, Allentown, PA (US); John Manning Savidge Neilson, Norristown, PA (US); Hideaki Kawahara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/347,325

(22) Filed: Nov. 9, 2016

(65) Prior Publication Data

US 2017/0062573 A1    Mar. 2, 2017

Related U.S. Application Data

(63) Continuation of application No. 14/563,706, filed on Dec. 8, 2014, now Pat. No. 9,525,035.

(51) Int. Cl.
*H01L 29/40* (2006.01)
*H01L 29/78* (2006.01)
(Continued)

(52) U.S. Cl.
CPC .......... *H01L 29/404* (2013.01); *H01L 21/763* (2013.01); *H01L 29/0696* (2013.01); *H01L 29/086* (2013.01); *H01L 29/0865* (2013.01); *H01L 29/0878* (2013.01); *H01L 29/0882* (2013.01); *H01L 29/1095* (2013.01); *H01L 29/407* (2013.01); *H01L 29/41741* (2013.01); *H01L 29/41766* (2013.01); *H01L 29/66348* (2013.01); *H01L 29/66666* (2013.01); *H01L 29/66712* (2013.01); *H01L 29/66727* (2013.01); *H01L 29/7802* (2013.01);
(Continued)

(58) Field of Classification Search
CPC . H01L 29/404; H01L 29/407; H01L 29/0696; H01L 29/0865; H01L 29/41741; H01L 29/41766; H01L 29/7811; H01L 29/7802; H01L 29/1095
See application file for complete search history.

(56) References Cited

U.S. PATENT DOCUMENTS 5,763,301 A    6/1998    Rha et al.
8,748,976 B1   6/2014    Kocon et al.
(Continued)

OTHER PUBLICATIONS

"Lecture 9 Mosfet(II) Mosfet I-V Characteristics (contd.);" http://web.mit.edu/6.012/www/SP07-L9.pdf, 6.012 Spring 2007.

*Primary Examiner* — Michael Jung
(74) *Attorney, Agent, or Firm* — Andrew R. Ralston; Charles A. Brill; Frank D. Cimino

(57) ABSTRACT

A vertical, high-voltage MOS transistor, which has a source region, a body contact region, and a number of trenches structures with field plates, and a method of forming the MOS transistor increase the on-state resistance of the MOS transistor by reducing the trench pitch. Trench pitch can be reduced with metal contacts that simultaneously touch the source regions, the body contact regions, and the field plates. Trench pitch can also be reduced with a gate that increases the size of the LDD region.

26 Claims, 45 Drawing Sheets

(51) Int. Cl.
  *H01L 29/08*    (2006.01)
  *H01L 29/417*   (2006.01)
  *H01L 29/66*    (2006.01)
  *H01L 29/06*    (2006.01)
  *H01L 21/763*   (2006.01)
  *H01L 29/10*    (2006.01)

(52) U.S. Cl.
  CPC ........ *H01L 29/7803* (2013.01); *H01L 29/783* (2013.01); *H01L 29/7811* (2013.01); *H01L 29/7827* (2013.01); *H01L 29/7832* (2013.01)

(56) References Cited

U.S. PATENT DOCUMENTS

| | | |
|---|---|---|
| 2007/0138544 A1 | 6/2007 | Hirler et al. |
| 2008/0081440 A1 | 4/2008 | Parsey, Jr. et al. |
| 2009/0085059 A1 | 4/2009 | Yusuda et al. |
| 2010/0219462 A1 | 9/2010 | Darwish et al. |
| 2010/0315159 A1* | 12/2010 | Kocon ................. H01L 27/088 327/564 |
| 2011/0006361 A1 | 1/2011 | Darwish et al. |
| 2013/0105887 A1 | 5/2013 | Zuniga et al. |
| 2013/0193502 A1 | 8/2013 | Kocon et al. |
| 2013/0200451 A1* | 8/2013 | Yilmaz ............... H01L 29/4236 257/331 |
| 2014/0197486 A1 | 7/2014 | Kocon et al. |
| 2014/0252485 A1 | 9/2014 | Hao et al. |

* cited by examiner

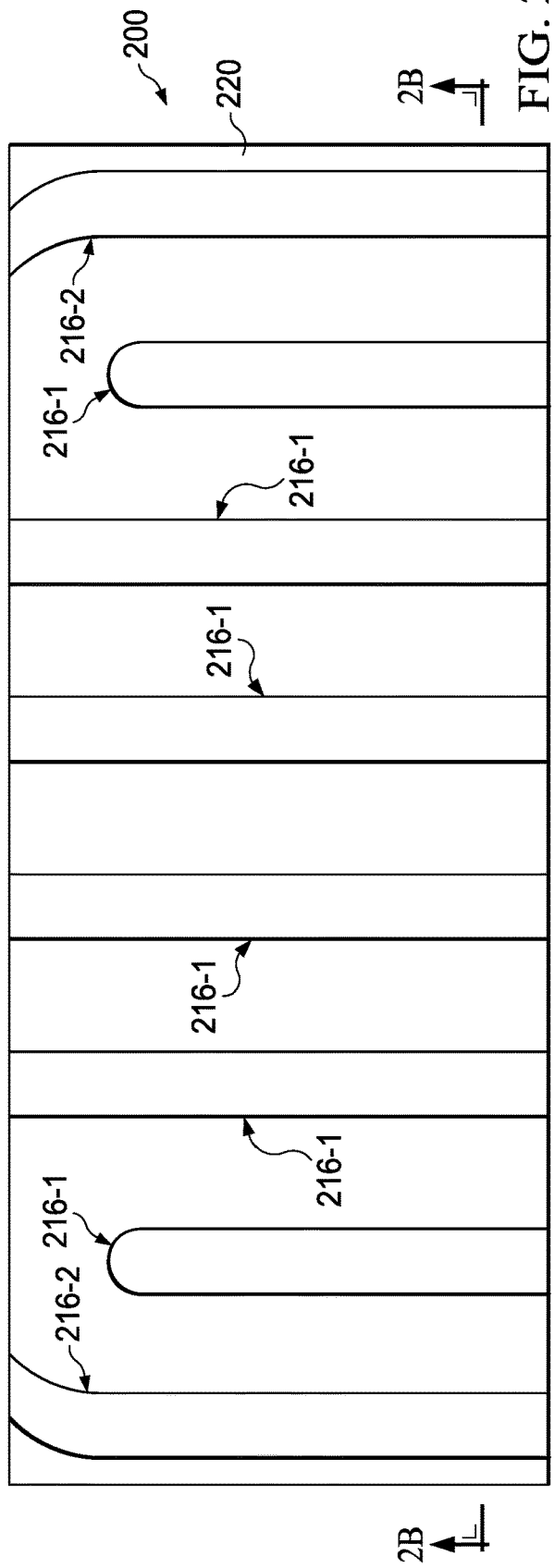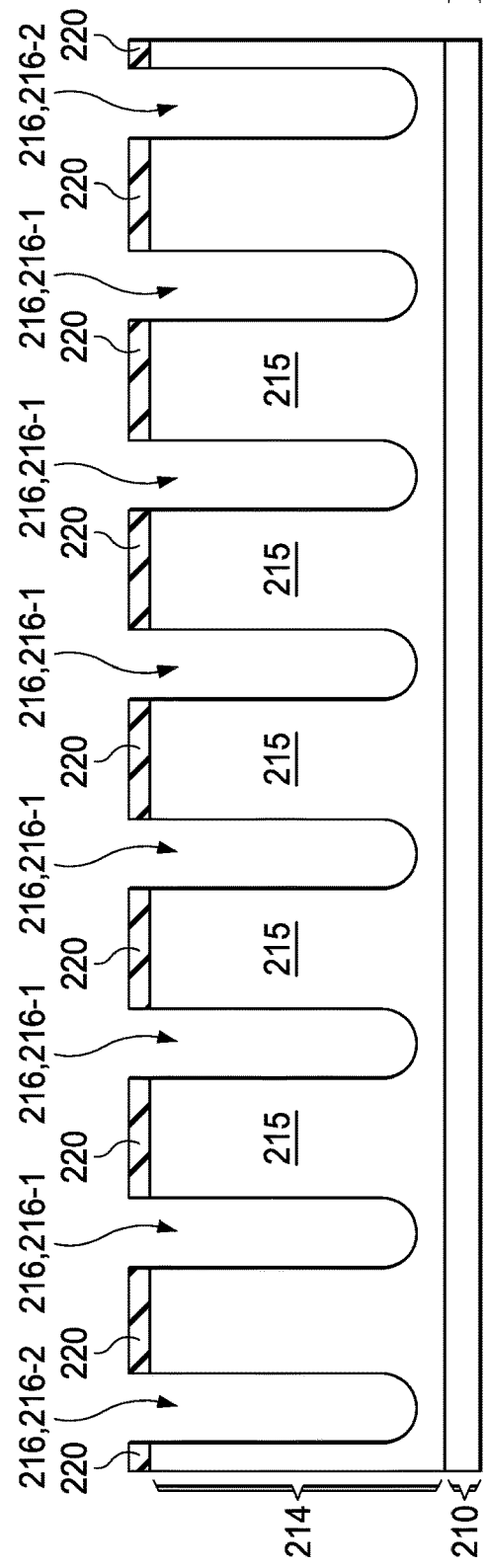

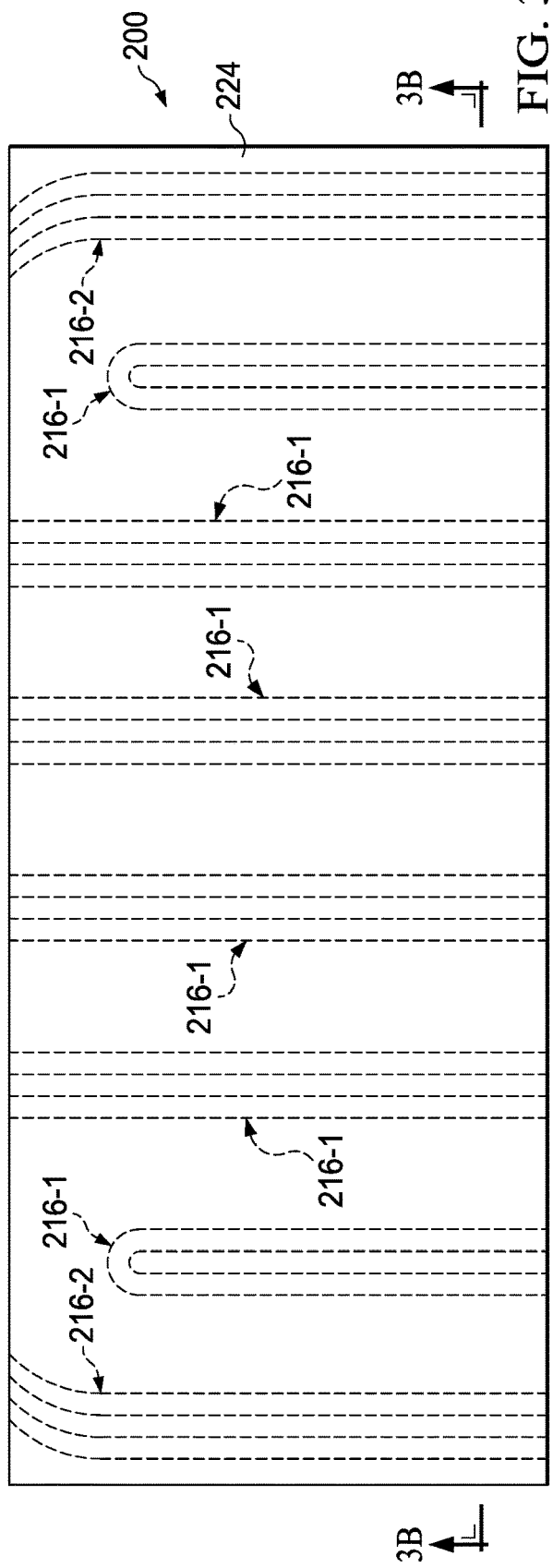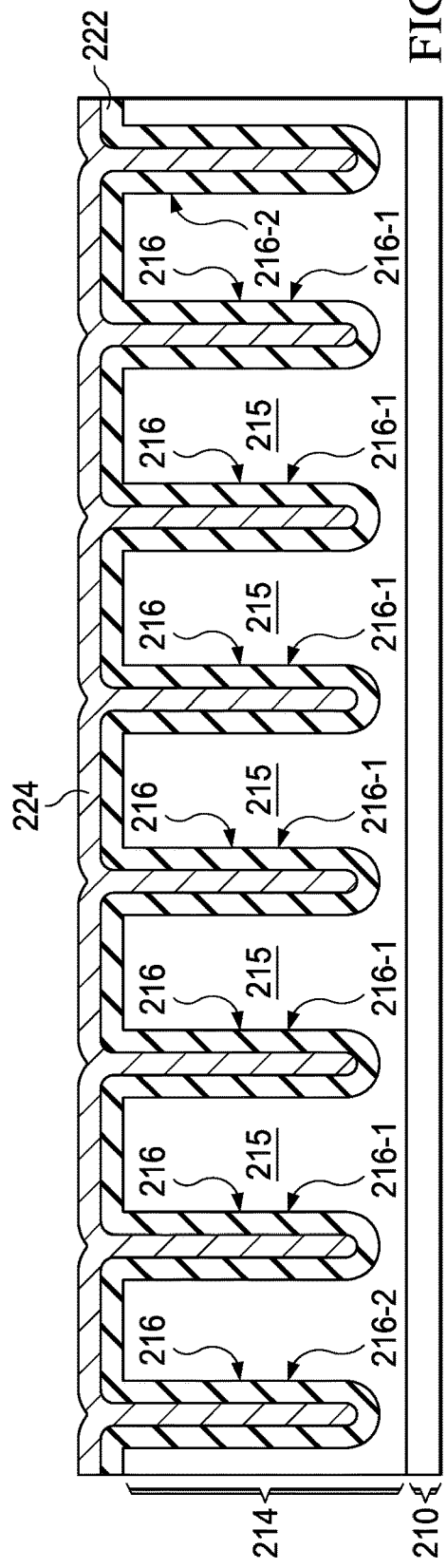

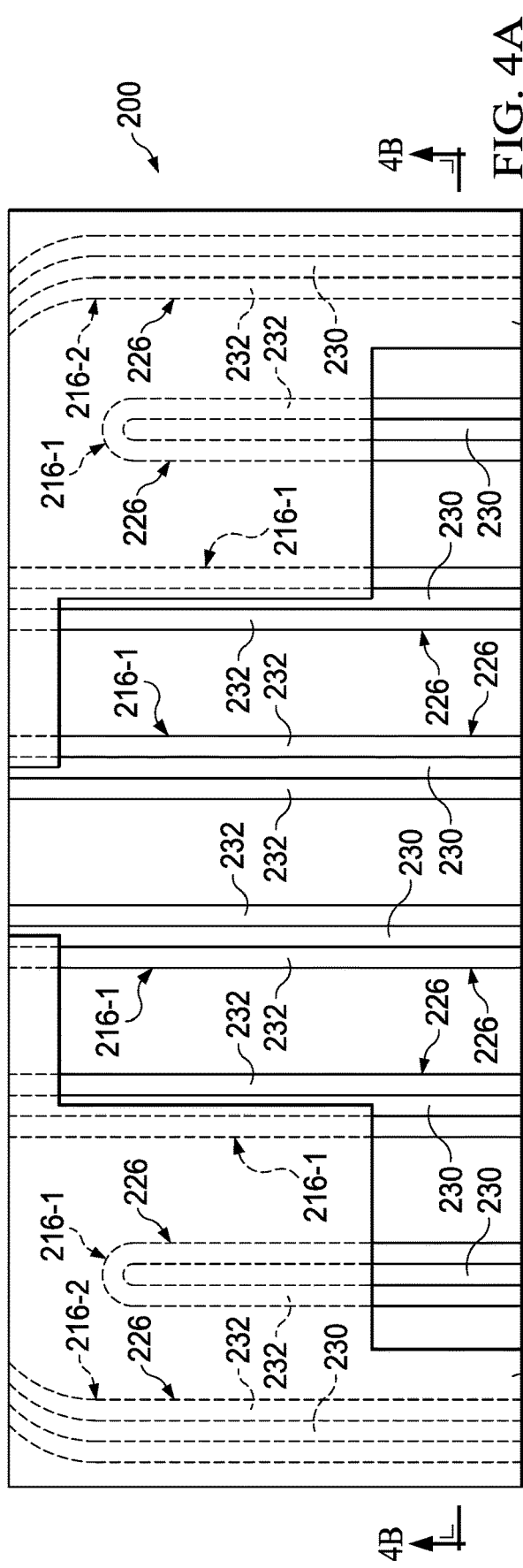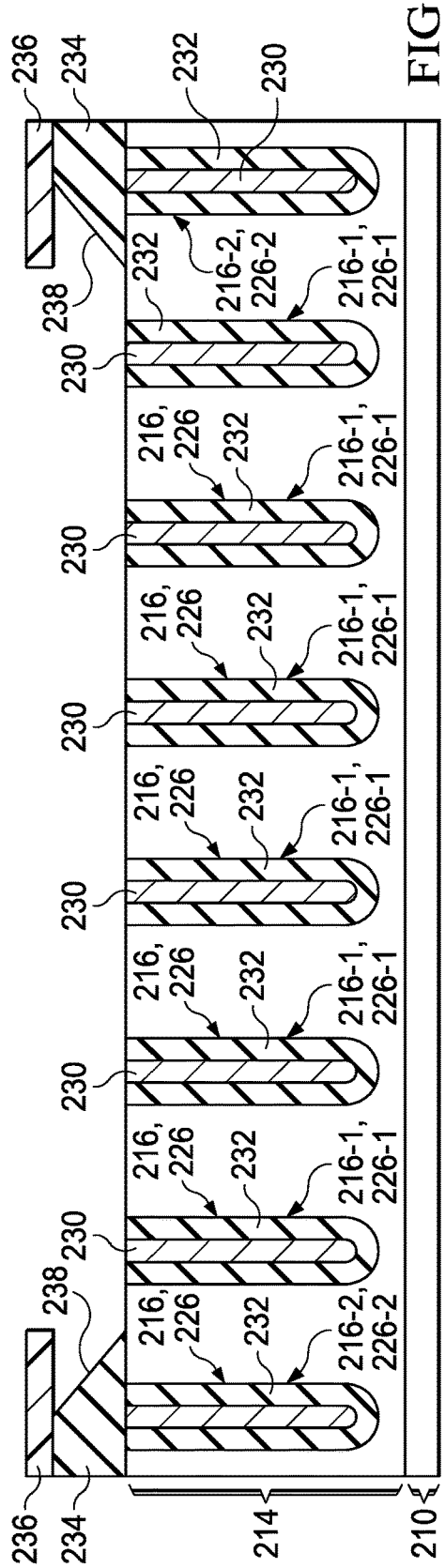

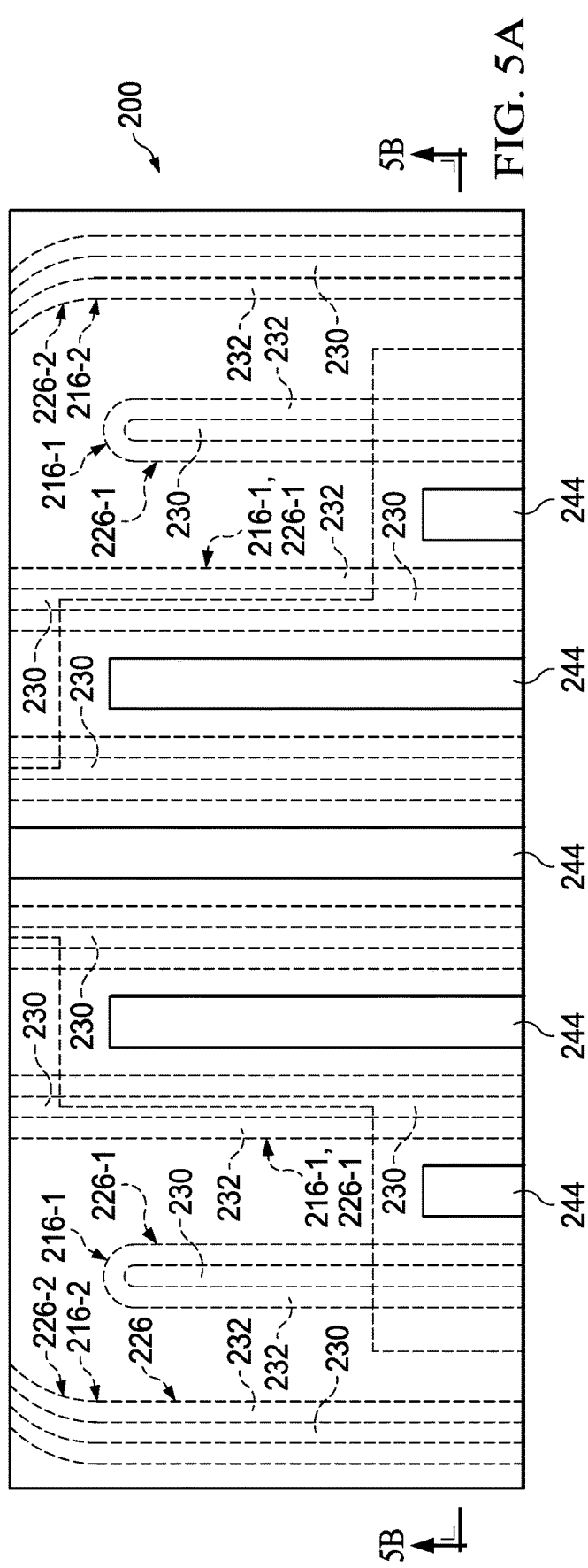
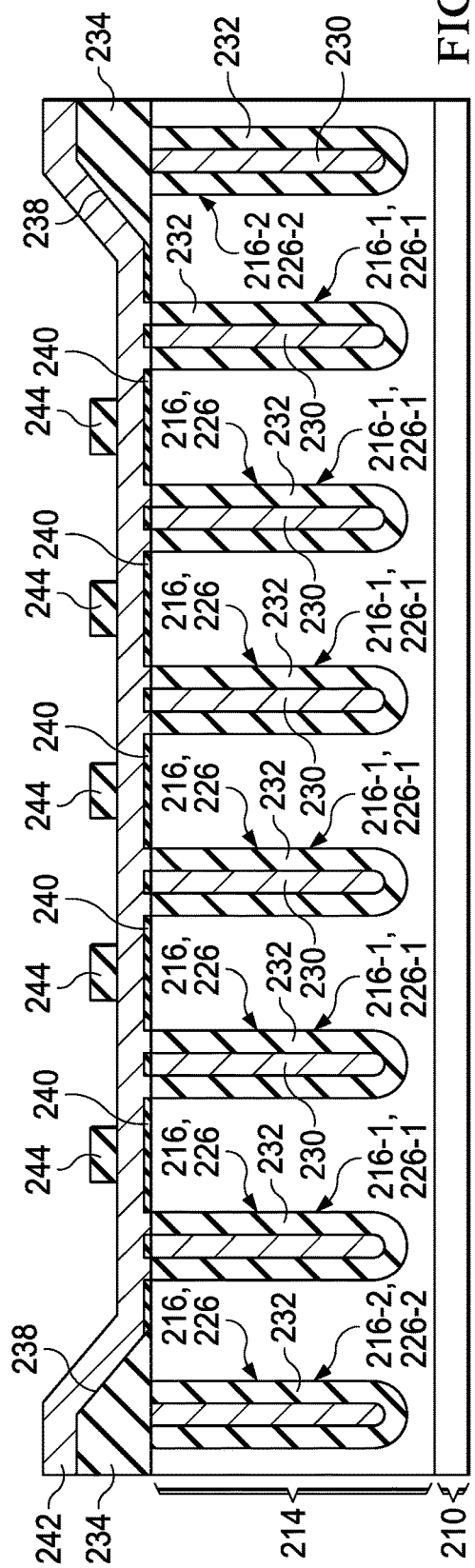
FIG. 5A
FIG. 5B

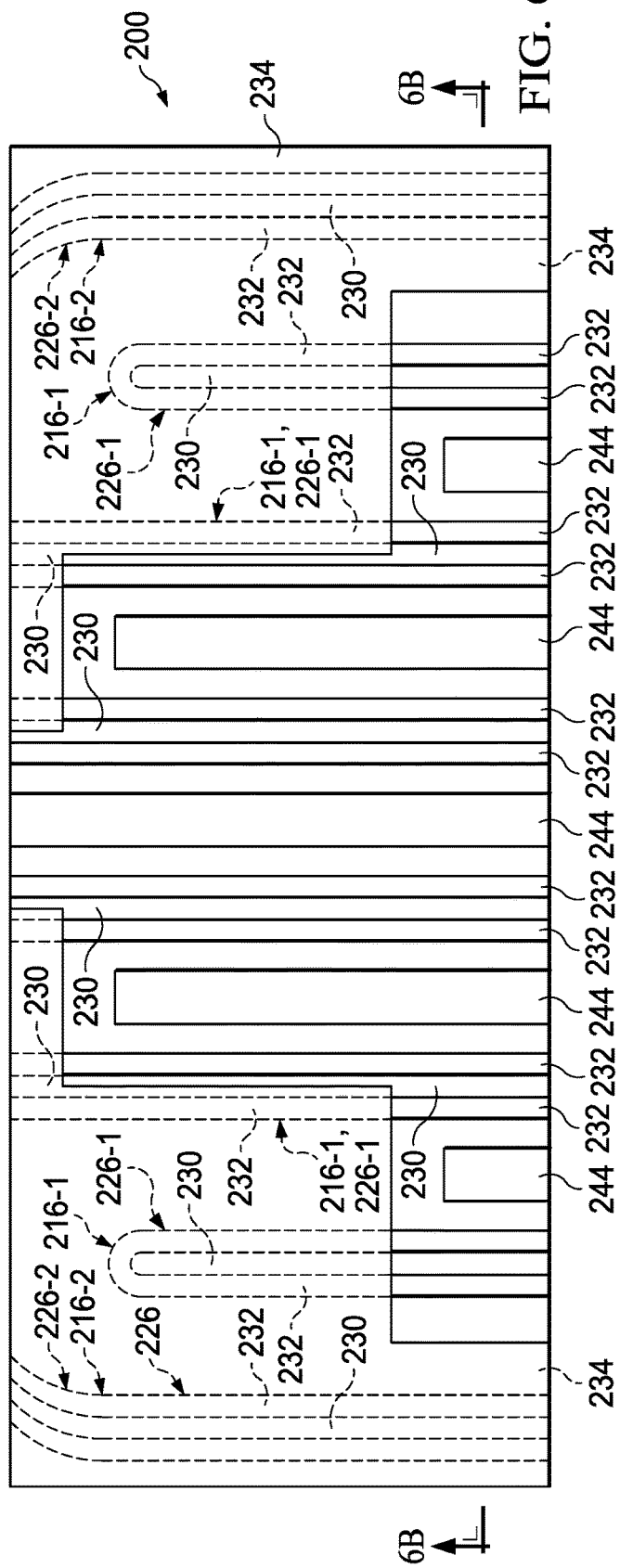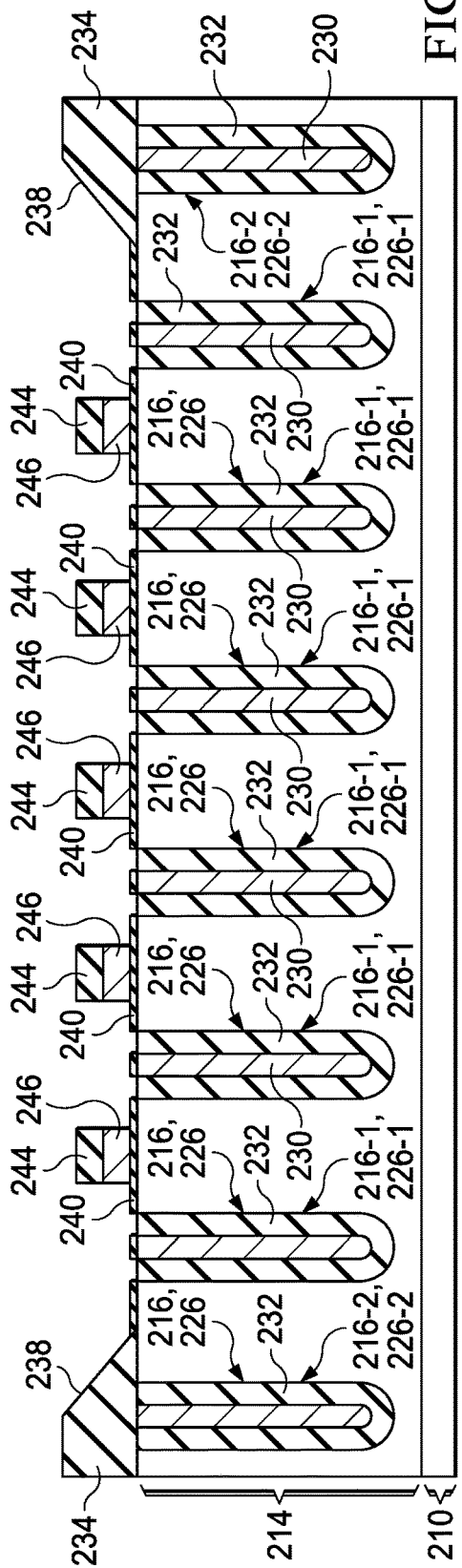

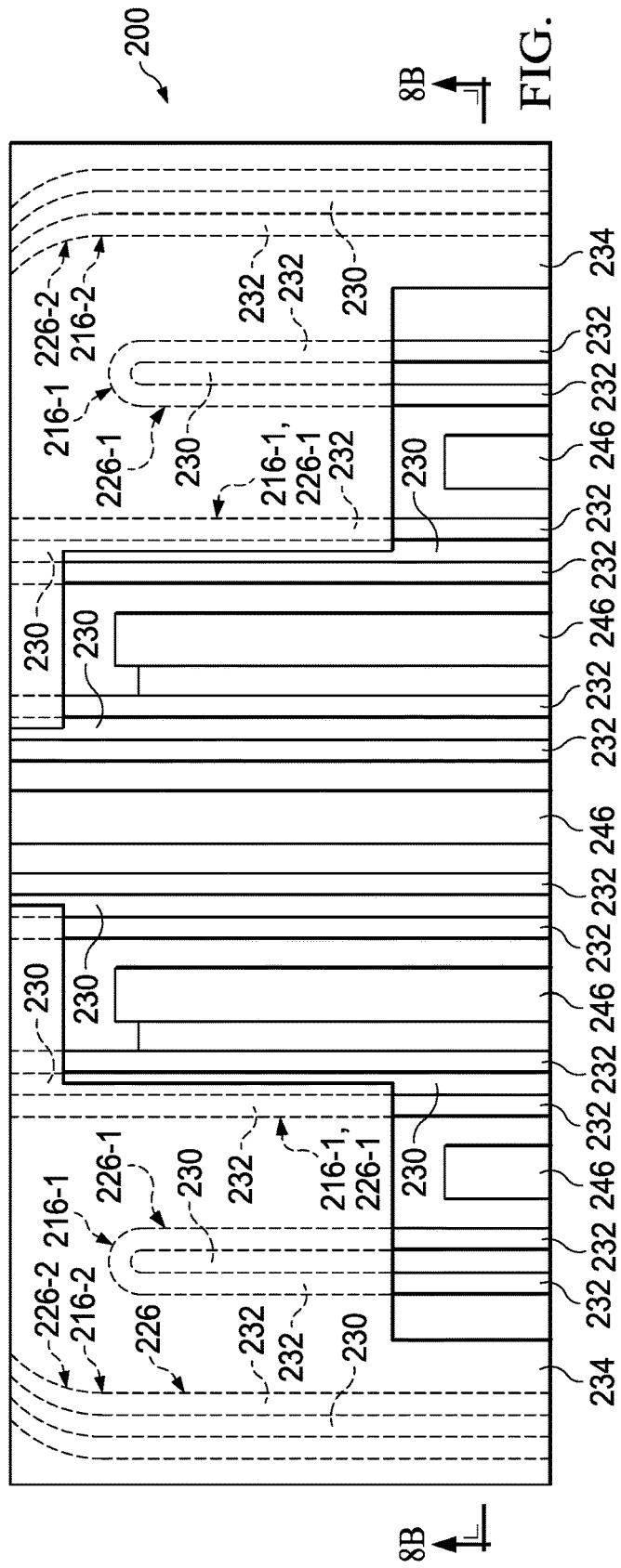
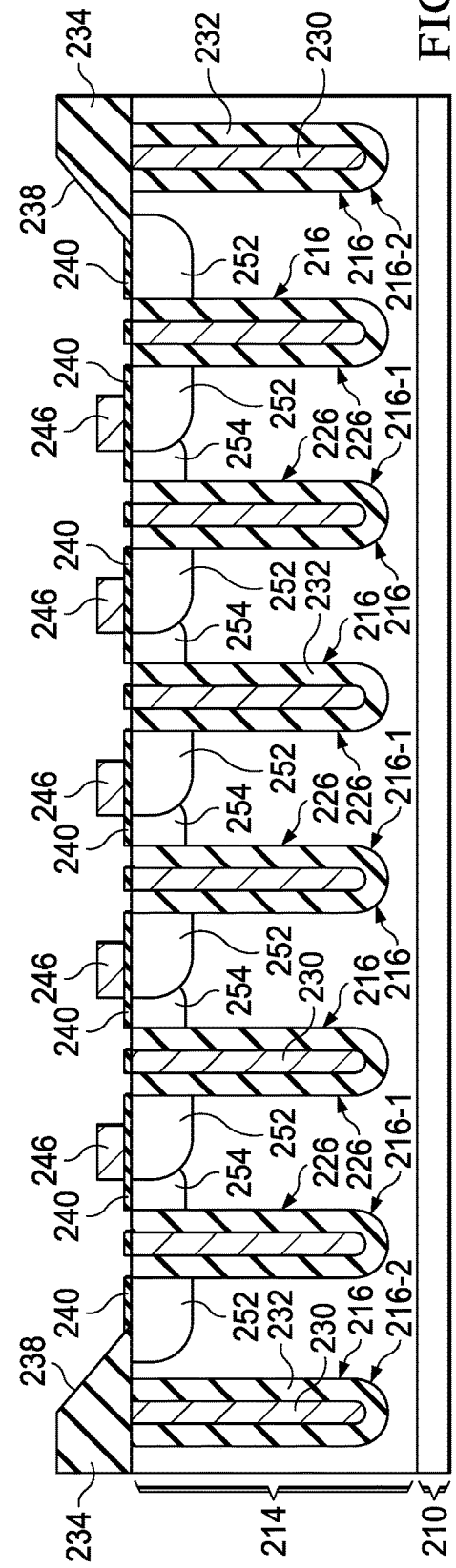
FIG. 8A
FIG. 8B

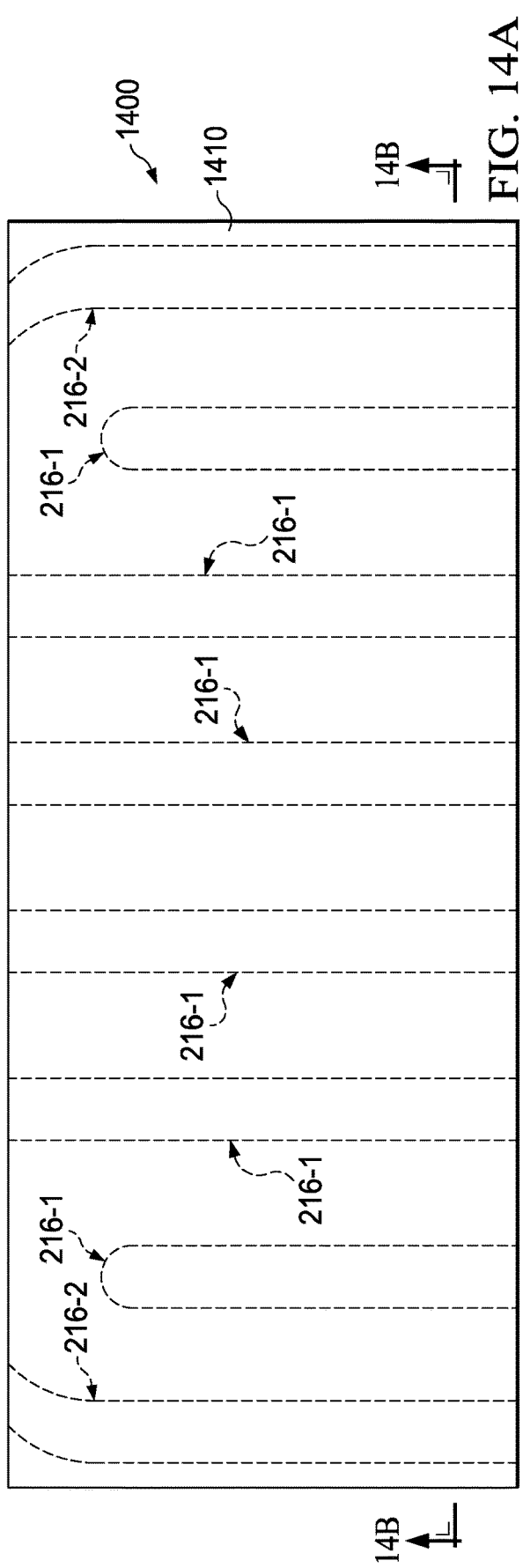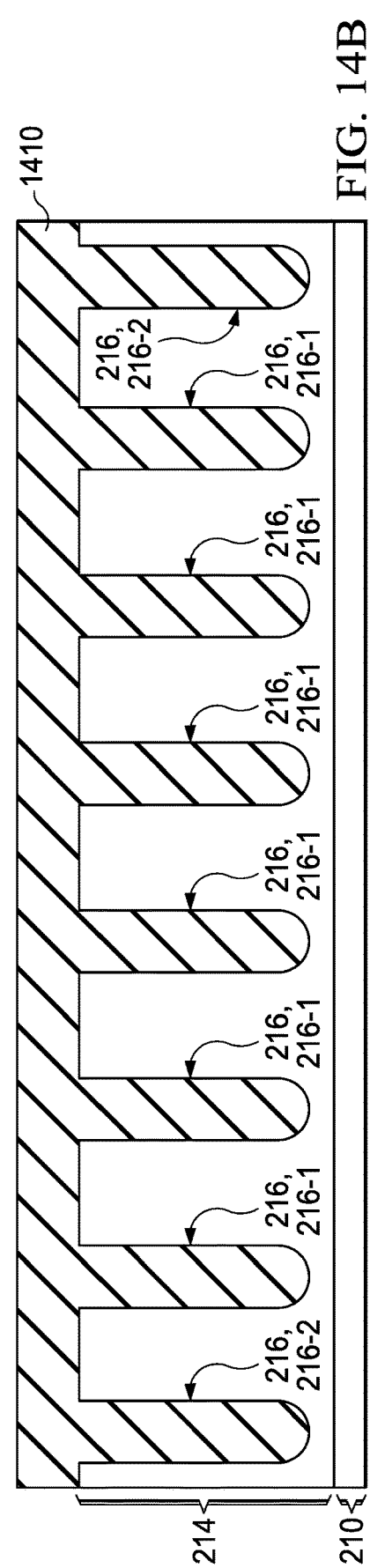

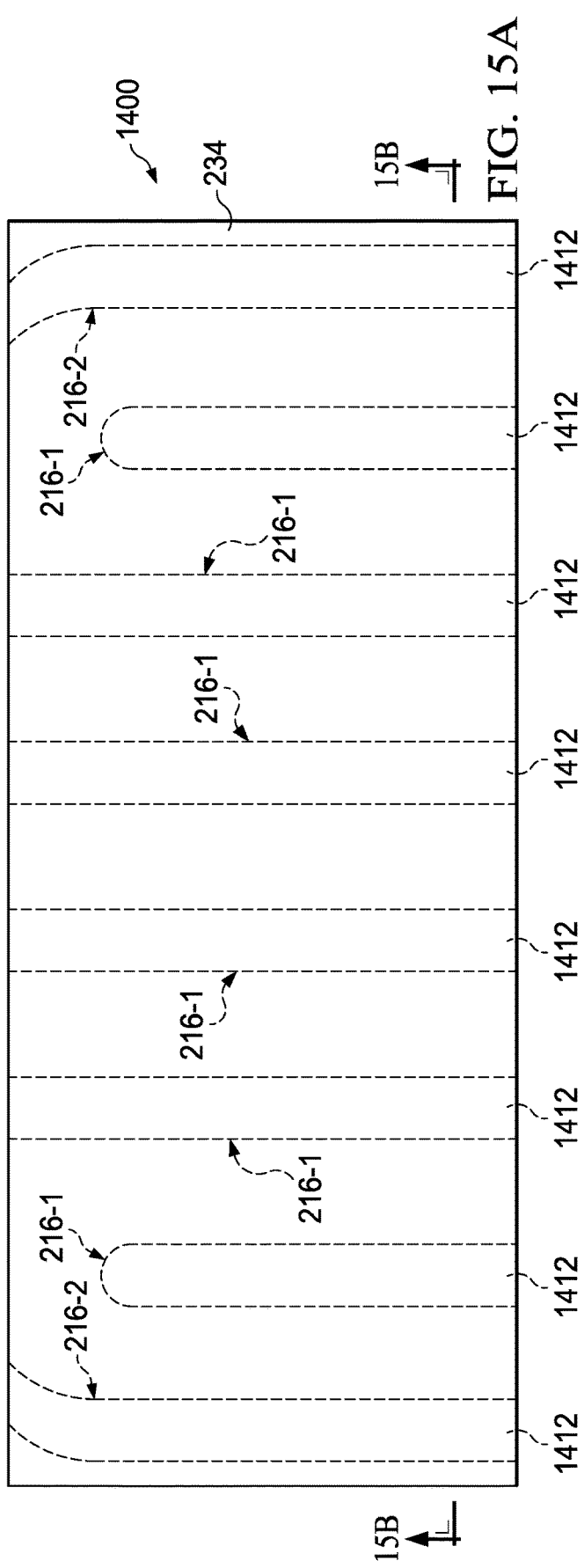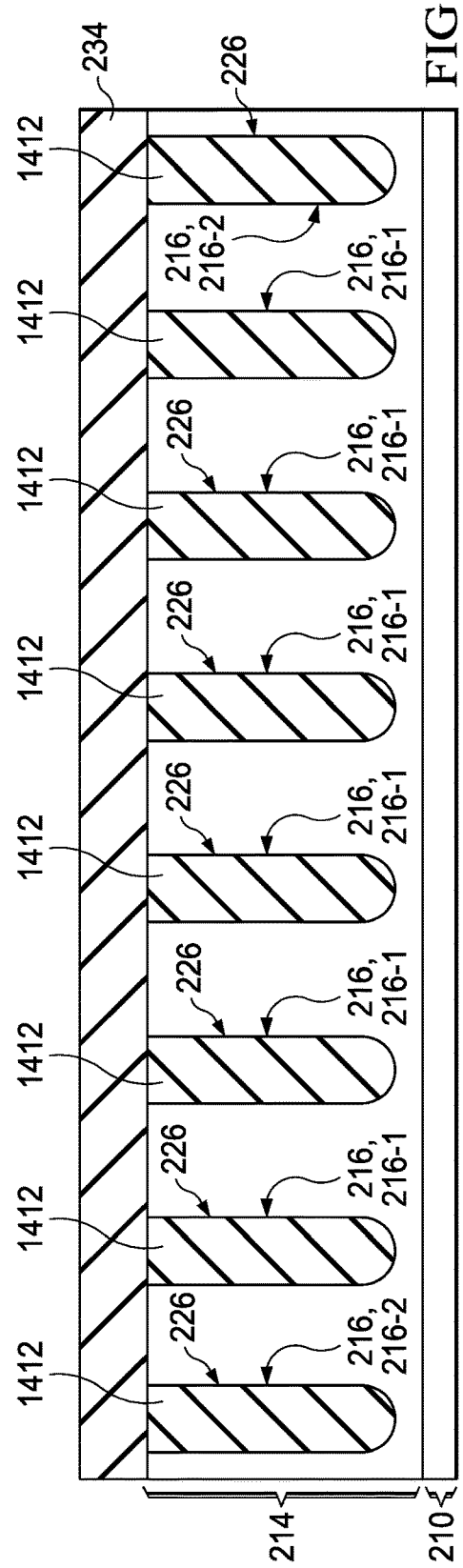

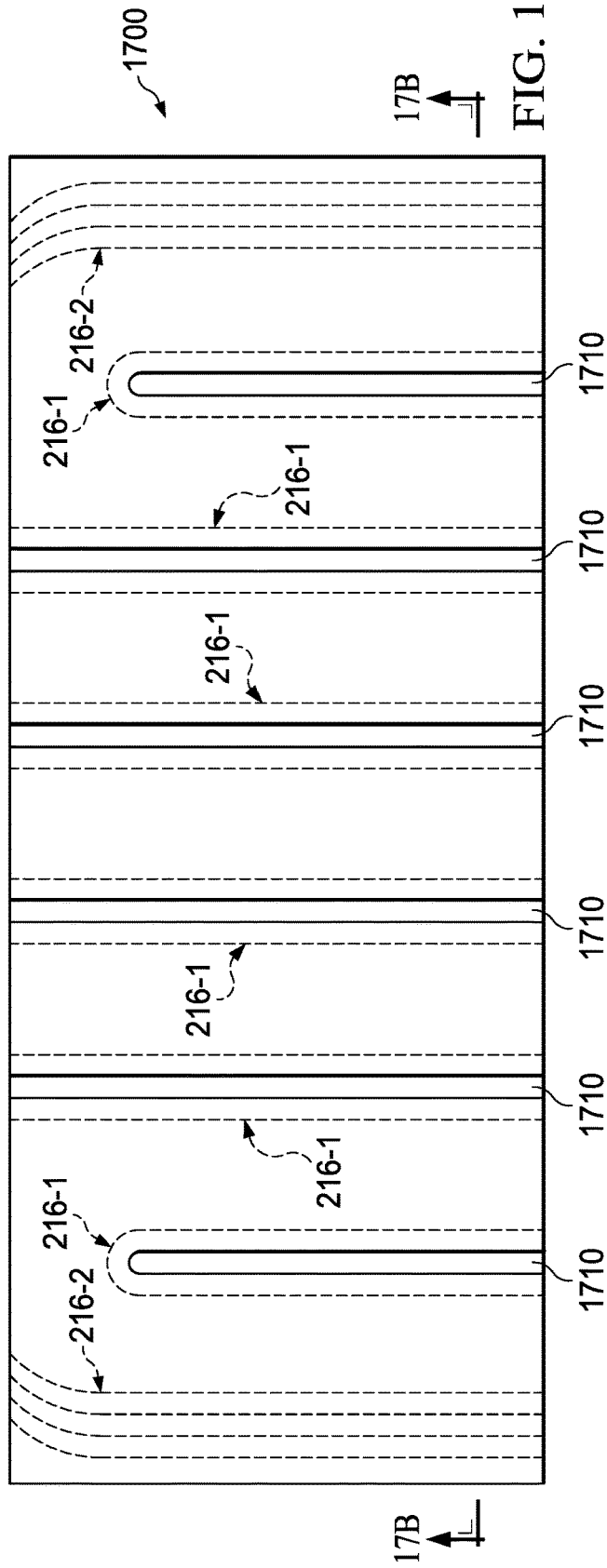
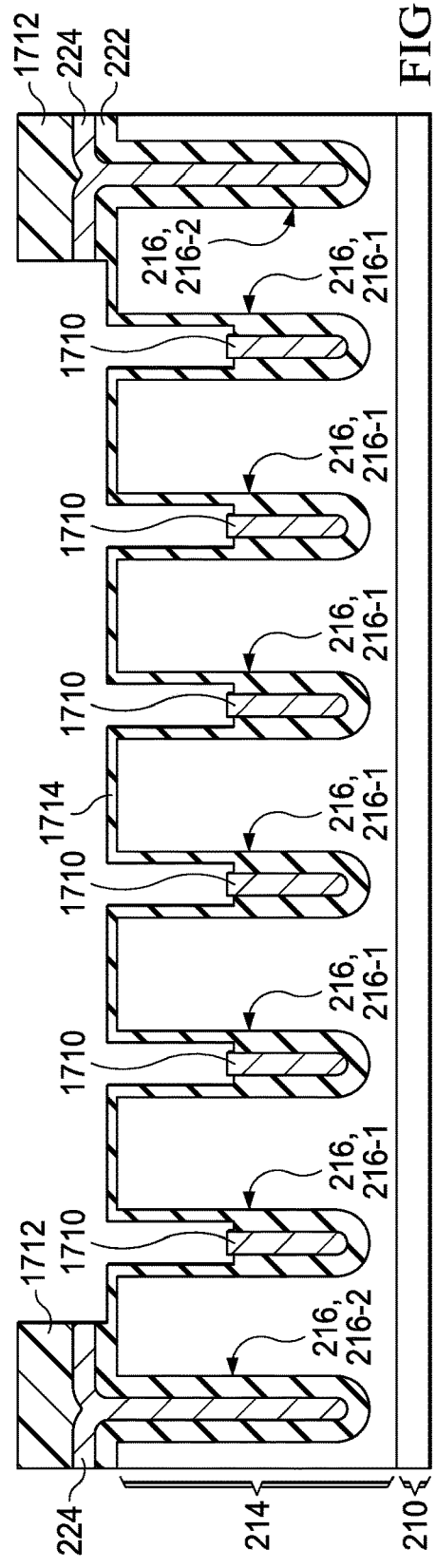
FIG. 17A
FIG. 17B

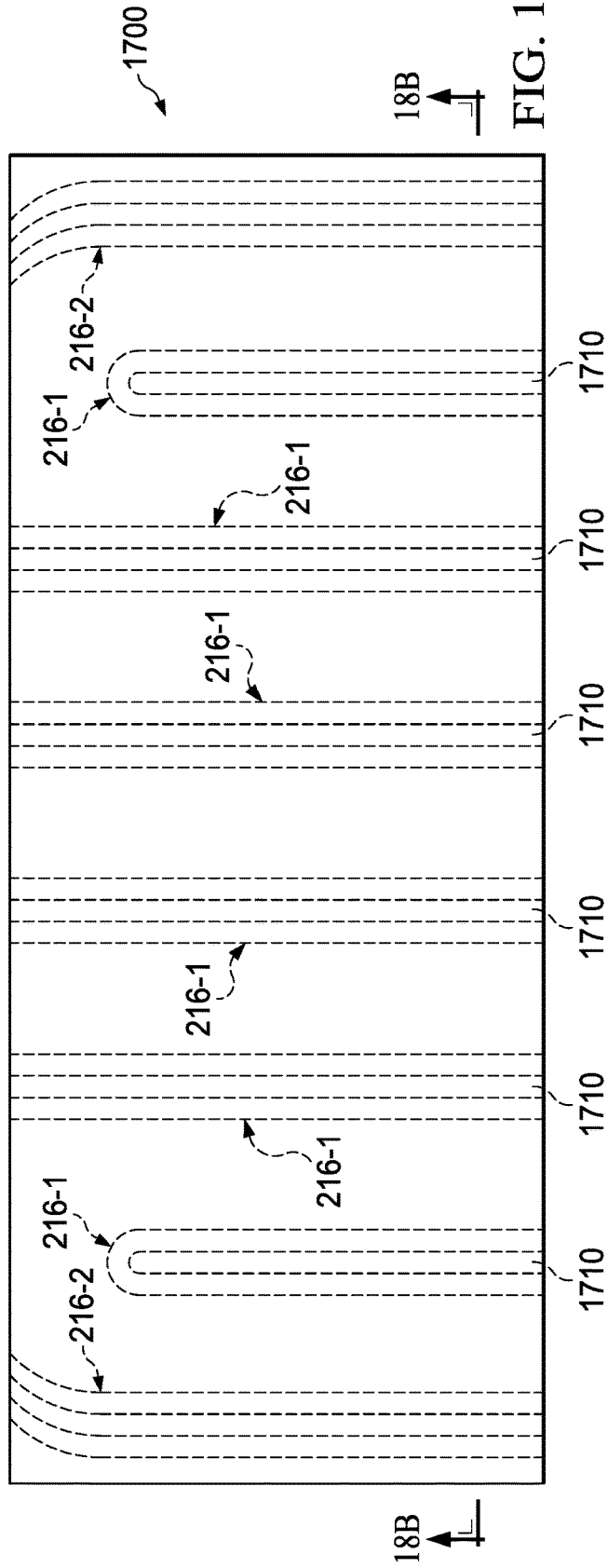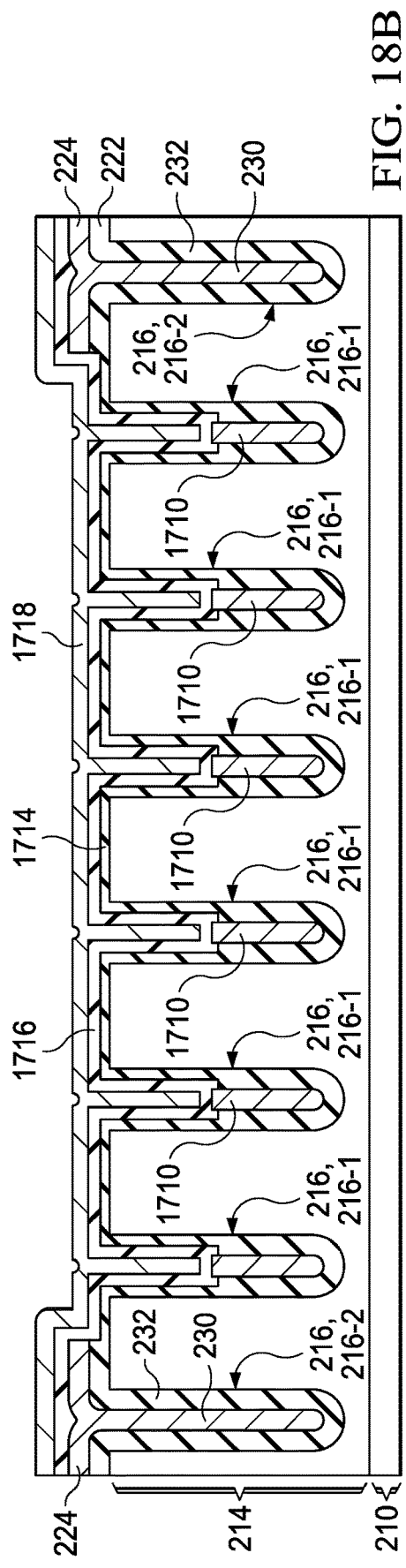

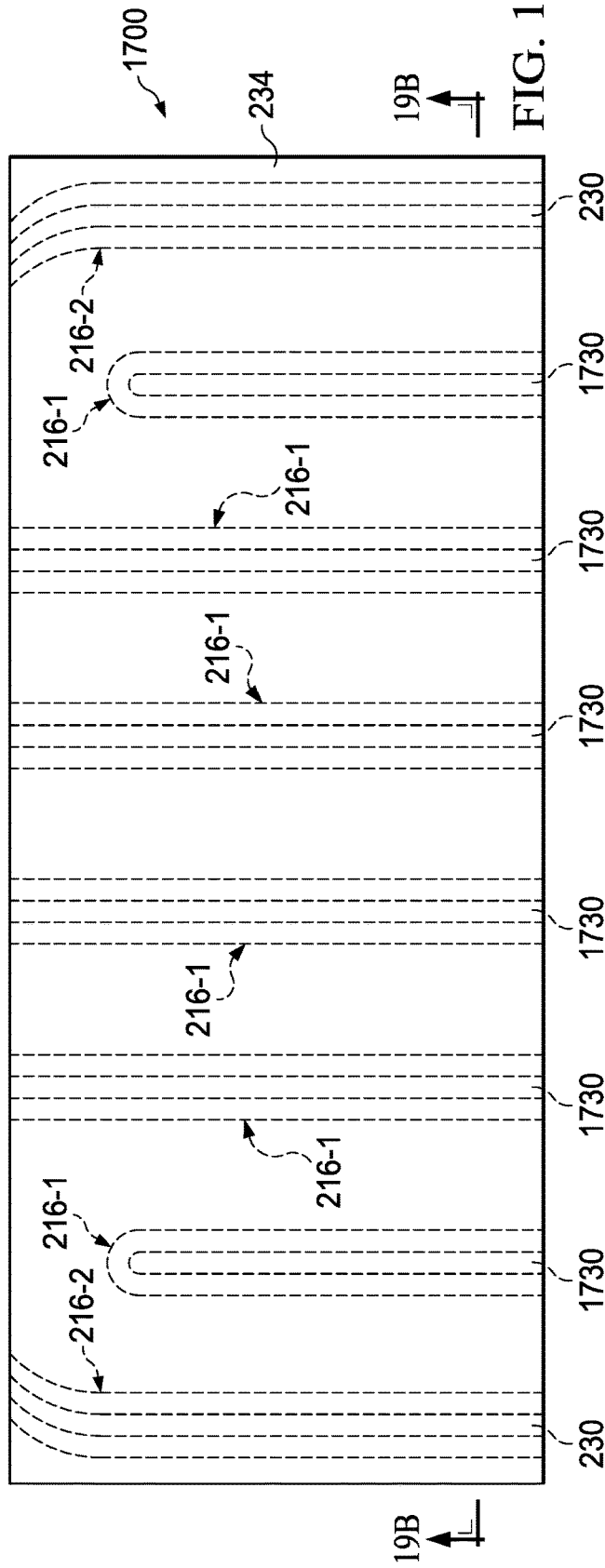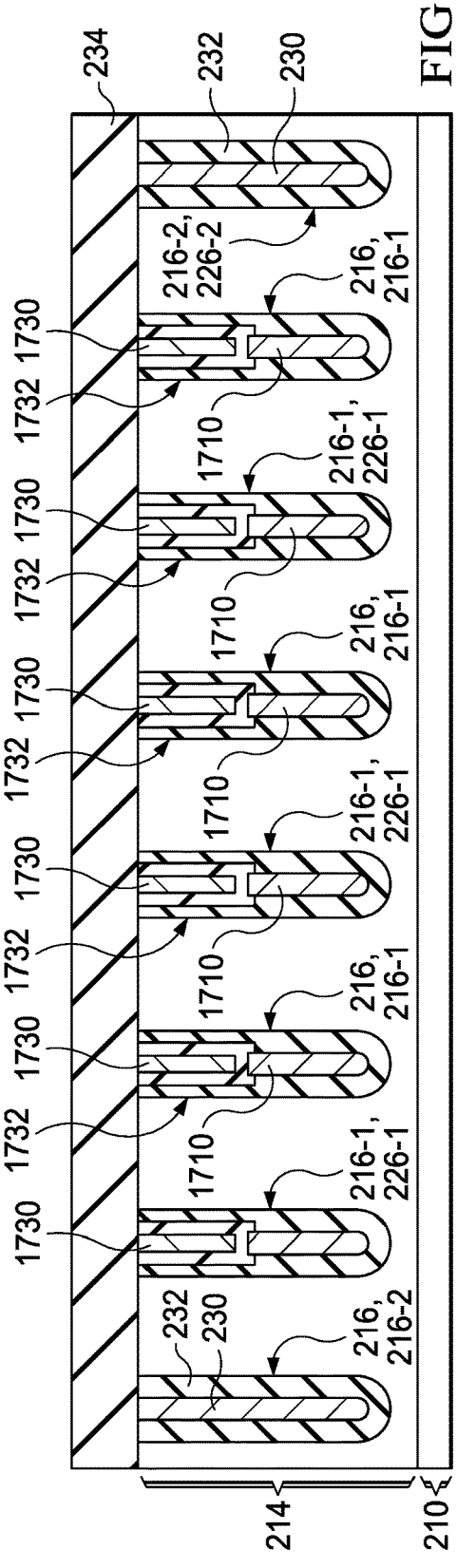
FIG. 19A
FIG. 19B

VERTICAL HIGH-VOLTAGE MOS TRANSISTOR

CROSS-REFERENCE TO RELATED APPLICATIONS

Under 35 U.S.C. § 120, this continuation application claims benefits of and priority to U.S. patent application Ser. No. 14/563,706, filed on Dec. 8, 2014, now U.S. Pat. No. 9,525,035 B2, the entirety of which are hereby incorporated herein by reference.

BACKGROUND

A metal oxide semiconductor (MOS) transistor is a well-known semiconductor device that has a source, a drain, a body that has a channel region that lies between and touches the source and drain, and a gate that lies over and is isolated from the channel region by a gate dielectric layer. There are two types of MOS transistors: an NMOS transistor that has n+source and drain regions with a p-type channel region, and a PMOS transistor that has p+source and drain regions with an n-type channel region.

In operation, when the source and the body are grounded, a positive voltage is placed on the drain to set up a drain-to-source electric field, and a voltage is placed on the gate that is greater than a threshold voltage, a current flows from the drain to the source. When the voltage placed on the gate is less than the threshold voltage, such as when the gate is pulled down to ground, no current flows.

Current-generation MOS transistors are commonly used in low-voltage environments that range from, for example, 1.2V to 5V. In contrast, a high-voltage MOS transistor is a transistor that operates with voltages in the range of, for example, 10V to 400V. High-voltage MOS transistors are bigger than low-voltage MOS transistors due to the need for a thicker layer of gate dielectric below the gate, and a drain drift region that lies between the drain and the channel region. In operation, the drain drift region reduces the magnitude of the drain-to-source electric field. The drain drift region, which is relatively large, has the same conductivity type as the drain, but a lower dopant concentration than the drain.

When formed to be structurally similar to a low-voltage MOS transistor, a high-voltage MOS transistor consumes a significant amount of silicon real estate due to the space required by the relatively large drain drift region. In an effort to reduce the required space and produce a more compact transistor, some high-voltage MOS transistors are vertically arranged so that the source lies above the drain.

One type of vertical high-voltage MOS transistor uses a pair of trench structures that lie on opposing sides of a drain drift region, which has a lower end region that touches the drain, and an upper end region that touches the body region. The trench structures have conductive field plates that can alter the electric field across the drain drift region when a voltage is placed on the field plates.

SUMMARY

The present disclosure is a vertical high-voltage MOS transistor that provides improved on-state resistance. The MOS transistor includes a semiconductor material that has a first conductivity type, and a plurality of trench structures that lie within the semiconductor material. The trench structures have depths that are substantially larger than the widths. The MOS transistor also includes a plurality of body regions that have a second conductivity type, and lie within the semiconductor material between the trench structures. In addition, the MOS transistor includes a plurality of LDD regions that have the first conductivity type, and lie within the semiconductor material between the trench structures. Each LDD region touches and lies laterally between a trench structure and a body region. Further, the MOS transistor includes a plurality of source regions and a drain region. The plurality of source regions have the first conductivity type, lie within the semiconductor material, and touch the plurality of body regions. The drain region has the first conductivity type, and lies within the semiconductor material below and spaced apart from the plurality of body regions and the plurality of source regions.

The present disclosure also includes a method of forming a vertical high-voltage MOS transistor that provides improved on-state resistance. The method includes forming a drain region that has a first conductivity type within a semiconductor material that has the first conductivity type. The method also includes forming a plurality of trench structures within the semiconductor material. The trench structures have depths that are substantially larger than the widths. In addition, the method includes forming a plurality of body regions that have a second conductivity type within the semiconductor material between the trench structures. The plurality of body regions lie above and spaced apart from the drain region. The method further includes forming a plurality of LDD regions that have the first conductivity type within the semiconductor material between the trench structures. Each LDD region touches and lies laterally between a trench structure and a body region. The method additionally includes forming a plurality of source regions that have the first conductivity type within the semiconductor material to touch the plurality of body regions. The plurality of source regions lies above and spaced apart from the drain region.

A better understanding of the features and advantages of the present disclosure will be obtained by reference to the following detailed description and accompanying drawings which set forth an illustrative embodiment in which the principals of the disclosure are utilized.

BRIEF DESCRIPTION OF THE DRAWINGS

FIG. 1A is a partial plan view. FIG. 1B is a cross-sectional view taken along lines 1B-1B of FIG. 1A.

FIGS. 2A-2B through 12A-12B are a series of views illustrating an example of a method 200 of forming a vertical high-voltage MOS transistor structure in accordance with the present disclosure. FIGS. 2A-12A are partial plan views. FIGS. 2B-12B are cross-sectional views taken along lines 2B-2B through 12B-12B in FIGS. 2A-12A, respectively.

FIG. 13A is a partial plan view. FIG. 13B is a cross-sectional view taken along lines 13B-13B of FIG. 13A.

FIGS. 14A-14B through 15A-15B are a series of views illustrating an example of a method 1400 of forming a vertical high-voltage MOS transistor structure in accordance with the first alternate embodiment of the present disclosure. FIGS. 14A-15A are partial plan views. FIGS. 14B-15B are cross-sectional views taken along lines 14B-14B through 15B-15B in FIGS. 14A-15A, respectively.

FIG. 16A is a partial plan view. FIG. 16B is a cross-sectional view taken along lines 16B-16B of FIG. 16A.

FIGS. 17A-17B through 19A-19B are a series of views illustrating an example of a method 1700 of forming a vertical high-voltage MOS transistor structure in accordance with the second alternate embodiment of the present disclosure. FIGS. 17A-19A are partial plan views. FIGS. 17B-19B are cross-sectional views taken along lines 17B-17B through 19B-19B in FIGS. 17A-19A, respectively.

FIG. 20A is a partial plan view. FIG. 20B is a cross-sectional view taken along lines 20B-20B of FIG. 20A.

FIGS. 21A-28A are partial plan views. FIGS. 21B-28B are cross-sectional views taken along lines 21B-21B through 28B-28B in FIGS. 21A-28A, respectively.

DETAILED DESCRIPTION

Figure 1A:
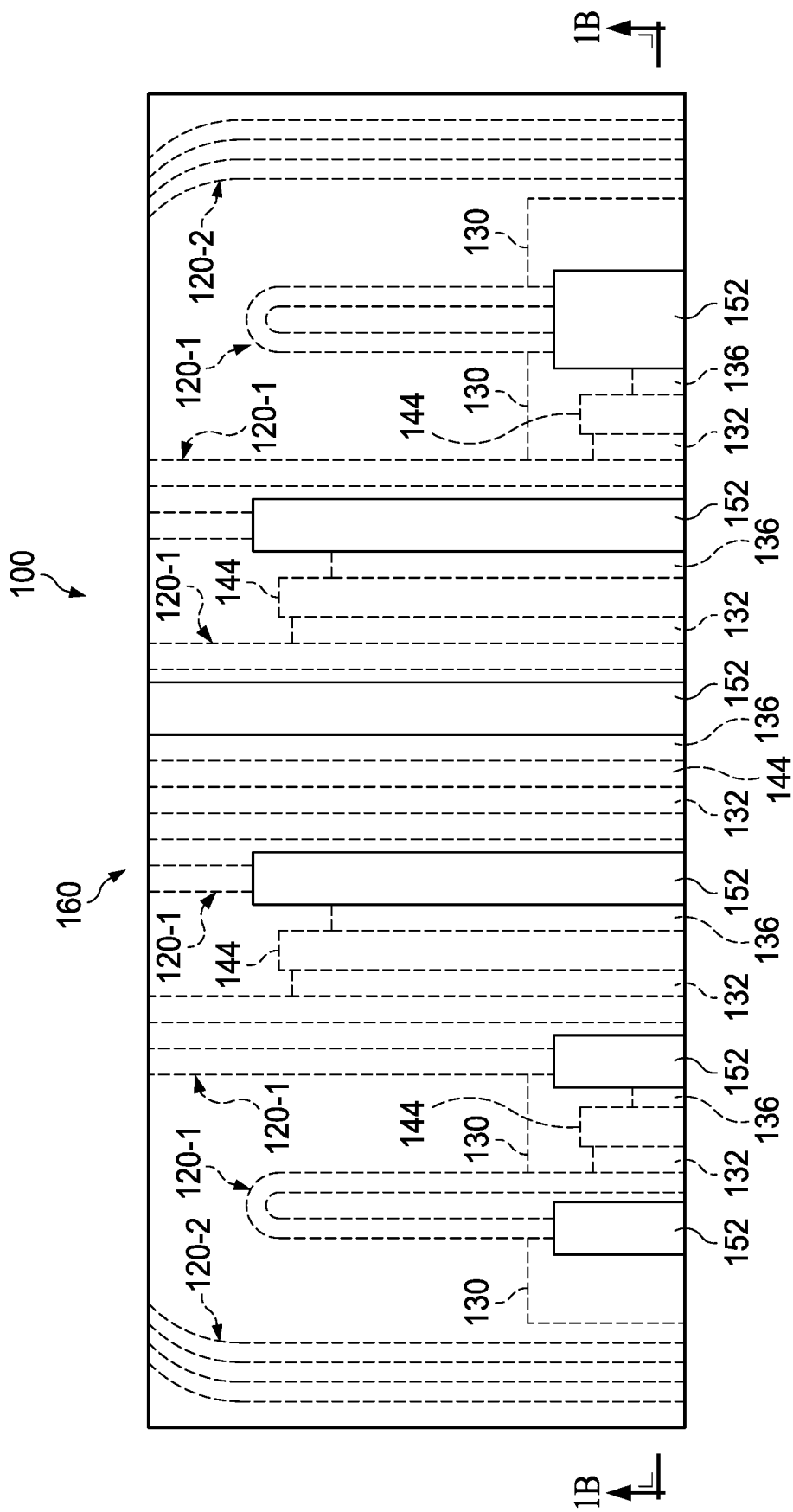
FIGS. 1A-1B are views illustrating an example of a vertical high-voltage MOS transistor 100 in accordance with the present disclosure.
Figure 1B:
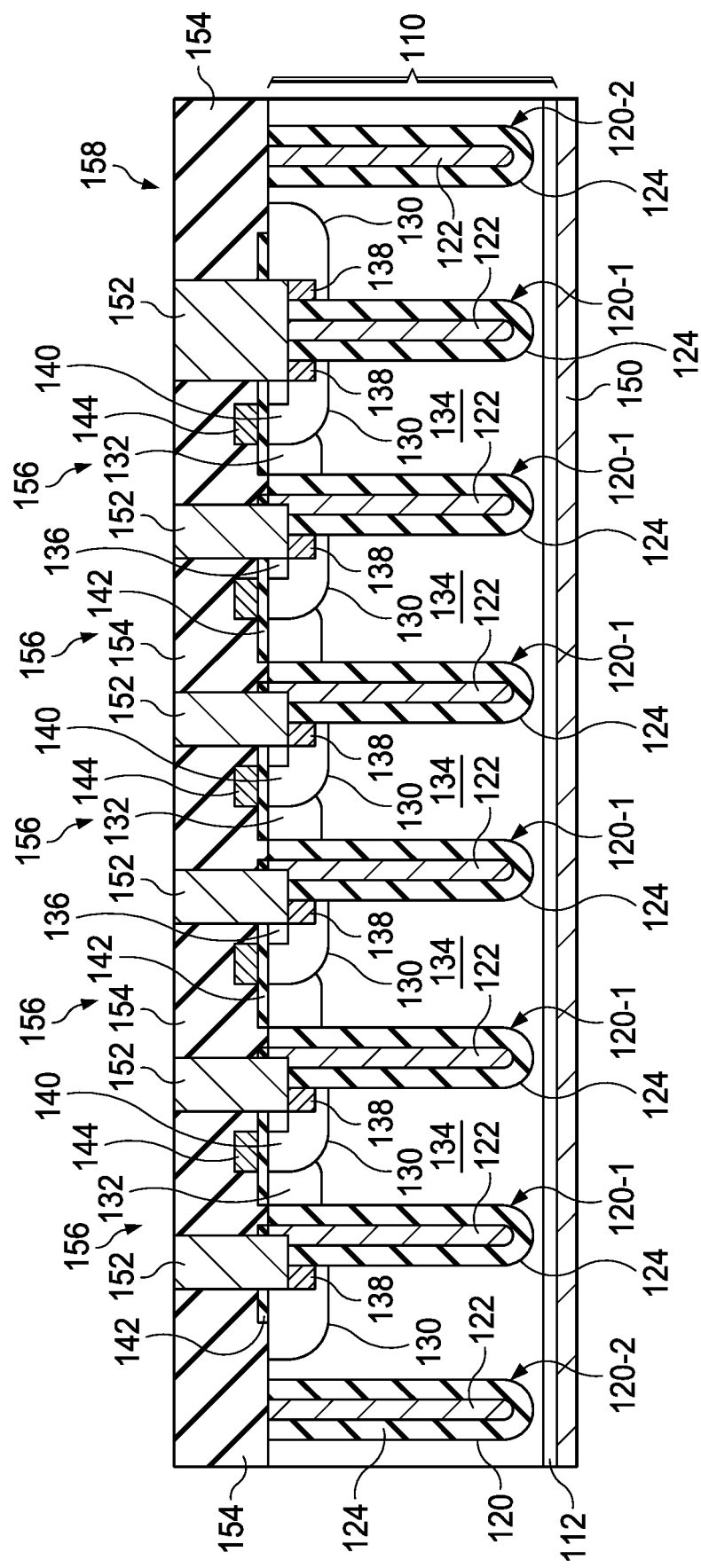

FIGS. 1A-1B show views that illustrate an example of a vertical high-voltage MOS transistor 100 in accordance with the present disclosure. FIG. 1A shows a partial plan view, while FIG. 1B shows a cross-sectional view taken along lines 1B-1B of FIG. 1A. As described in greater detail below, MOS transistor 100, which includes a number of trenches, increases the on-state resistance by reducing the trench pitch, which is the distance from a point on a trench to a corresponding point on an adjacent trench.

As shown in FIGS. 1A-1B, MOS transistor 100 includes a semiconductor region 110 and a drain region 112 that is formed to extend from the bottom surface of semiconductor region 110 up a distance into semiconductor region 110. In the present example, semiconductor region 110 and drain region 112 both have an n conductivity type, while drain region 112 has a much higher dopant concentration, being formed to be heavily doped.

As further shown in FIGS. 1A-1B, MOS transistor 100 also includes a number of trench structures 120 that lie within semiconductor region 110 to extend from the top surface of semiconductor region 110 down a distance into semiconductor region 110. The trench structures 120 have depths that are substantially larger than the widths.

The trench structures 120 include a number of transistor trench structures 120-1, and a perimeter trench structure 120-2 that laterally surrounds the transistor trench structures 120-1. In the present example, perimeter trench structure 120-2 has a generally rectangular shape with rounded corners. As shown in FIGS. 1A-1B, as a result of the loss of space due to the rounded corners, the transistor trench structures 120-1 that lie adjacent to the rounded corners can have different lengths.

In the present example, each of the trench structures 120 includes a field plate 122, which is conductive, and a dielectric structure 124 that touches field plate 122 and isolates field plate 122 from semiconductor region 110. In the present example, field plate 122 is implemented with a p-type polysilicon region.

In addition, MOS transistor 100 includes a number of body regions 130 that are formed in semiconductor region 110, and a number of low density drain (LDD) regions 132 that are formed in semiconductor region 110 to touch the body regions 130 and the transistor trench structures 120-1. Each LDD region 132 touches and lies laterally between a trench structure 120 and a body region 130. In the present example, the body regions 130 have a p conductivity type, while the LDD regions 132 have an n conductivity type. In addition, the LDD regions 132 do not touch the perimeter body regions 130.

MOS transistor 100 further includes a number of drain drift regions 134 of semiconductor region 110, along with a number of heavily-doped source regions 136 and a number of heavily-doped body contact regions 138 which are formed in semiconductor region 110. The drain drift regions 134 of semiconductor region 110 extend from drain region 112 up to the LDD regions 132.

The source regions 136 and the body contact regions 138 touch the body regions 130, which along with the source regions 136 and the body contact regions 138 lie above and spaced apart from drain region 112. In the present example, the drain drift regions 134 are n-type, the source regions 136 are n+ regions, and the body contact regions 138 are p+ regions.

MOS transistor 100 additionally includes a number of channel regions 140 of the body regions 130, a corresponding number of gate dielectric regions 142 that lie on the top surface of semiconductor region 110, and a corresponding number of gates 144 that lie on the gate dielectric regions 142 over the channel regions 140. The channel regions 140 touch and lie between the LDD regions 132 and the source regions 136, while the gate dielectric regions 142 touch and lie over the channel regions 140.

Further, MOS transistor 100 includes a number of metal contacts that include a drain contact 150 that touches drain region 112, and a number of source-body contacts 152 that sit on the trench structures 120 to touch the field plates 122, the heavily-doped source regions 136, and the heavily-doped body contact regions 138. The contacts 150 and 152 include one or more layers of metal. Contacts similar to contacts 150 and 152 touch the gates 144, while other similar contacts touch the field plates 122 in the perimeter trenches 120-2.

MOS transistor 100 also includes a non-conductive layer 154 that touches the gates 144 and the contacts 152. Non-conductive layer 154 and the contacts form the lower layer of a metal interconnect structure 158. Non-conductive layer 154 can include one or more layers of non-conductive material.

Each body region 130, LDD region 132, drain drift region 134, source region 136, body contact region 138, gate 144, and source-body contact 152 combination forms one vertical high-voltage MOS transistor cell 156. The metal interconnect structure 158 of MOS transistor 100 electrically connects the transistor cells 156 together to form, along with drain region 112, a vertical high-voltage MOS transistor 160.

In operation, when drain region 112, the body regions 130, the source regions 136, and the gates 144 are biased in the on state, current flows from drain region 112 to the source regions 136 through the drain drift regions 134, the LDD regions 132 and the channel regions 140. The voltage placed on the field plates 122 alters the electric fields that lie across the drain drift regions 134.

One of the advantages of MOS transistor 100 is that the trench structures 120 can be spaced closely together, which reduces the trench pitch and improves the on-state resistance. In addition, reducing the spacing between adjacent trench structures 120 reduces the foot print of transistor 100. The trench structures 120 can be spaced closer together because of the spaced saved due to the use of metal contacts that touch the field plates 122, the source regions 136, and the body contact regions 138 at the same time. The references to the present example describe an NMOS transistor. PMOS transistors having similar features can be formed by appropriate changes in dopant polarities and conductivity types.

FIGS. 2A-2B through 12A-12B show a series of views that illustrate an example of a method 200 of forming a vertical high-voltage MOS transistor structure in accordance with the present disclosure. FIGS. 2A-12A show plan views, while FIGS. 2B-12B show cross-sectional views taken along lines 2B-2B through 12B-12B in FIGS. 2A-12A, respectively.

Method 200 utilizes a semiconductor substrate 210 that is conventionally-formed using well-known steps. In the present example, substrate 210 is heavily doped (e.g., $5 \times 10^{19}$ to $8 \times 10^{19}$) with phosphorous to have an n conductivity type and a nominal resistivity of approximately as 1 mOhm-cm.

Method 200 begins by growing an epitaxial layer 214 on the top surface of semiconductor substrate 210 in a conventional manner. The growth of epitaxial layer 214 causes dopants from heavily-doped substrate 210 to diffuse up a short distance into epitaxial layer 214 and form a heavily-doped lower region. The heavily-doped lower region of epitaxial layer 214 and the upper region of substrate 210 can form drain region 112 of vertical high-voltage MOS transistor 100.

Epitaxial layer 214 has a number of regions 215 that touch and lie above the heavily-doped lower region that can form the drain drift regions 134 of vertical high-voltage MOS transistor 100. In addition, the thickness and dopant concentration of epitaxial layer 214 can be adjusted to accommodate the operating voltage of MOS transistor 100. For example, epitaxial layer 214 can have a thickness of 4 microns and a dopant concentration of $1 \times 10^{16}$ to $1 \times 10^{17}$ to support 30V operation. Further, epitaxial layer 214 can have a thickness of 6-7 microns and a dopant concentration of $2 \times 10^{16}$ to $3 \times 10^{16}$ to support 60V operation.

Alternately, epitaxial layer 214 can have a thickness of 10 and 20 microns to support 100V and 200V operation, respectively, each having a dopant concentration of $1 \times 10^{16}$ to $5 \times 10^{16}$. Epitaxial layer 214 can be in-situ doped during the epitaxial growth, or doped by ion implantation following the epitaxial growth. In the present example, epitaxial layer 214 is doped with phosphorous to have an n conductivity type.

After epitaxial layer 214 has been formed, a number of trenches 216 are formed in epitaxial layer 214. The trenches 216 can be formed by first forming a hard mask 220 on epitaxial layer 214 in a conventional manner. For example, a hard mask can be formed by forming an oxide layer on epitaxial layer 214, a nitride layer on the oxide layer, and a patterned photoresist layer on the nitride layer, and then etching the nitride layer and the oxide layer through the patterned photoresist layer to expose the top surface of epitaxial layer 214.

After hard mask 220 has been formed, the exposed regions of epitaxial layer 214 are etched through hard mask 220 using, for example, a reactive ion etch (RIE) process to form the trenches 216. During the etch, the RIE process forms polymers on the sidewalls of the trenches, which provides a nearly constant trench width. The trenches 216 have depths that are substantially larger than the widths. The trenches 216 can be, for example, 0.6 to 1.5 microns wide, and separated by 1.0 to 3.5 microns. In addition, the bottoms of the trenches 216 can be, for example, a half micron to a micron above substrate 210.

FIGS. 2A-2B show a semiconductor structure that results following the formation of the trenches 216. As shown in FIGS. 2A-2B, the trenches include a number of transistor trenches 216-1, and a perimeter trench 216-2 that laterally surrounds the transistor trenches 216-1. Following the etch, hard mask 220 is removed in a conventional fashion.

As shown in FIGS. 3A-3B, after hard mask 220 has been removed, a non-conductive layer 222 is formed on the top surface of epitaxial layer 214 to line the trenches 216. Non-conductive layer 222 can be formed, for example, by first growing a layer of thermal oxide, followed by the deposition of a layer of oxide using, for example, a chemical vapor deposition (CVD) process.

The thickness of non-conductive layer 222 varies according to the voltages to be used. For example, non-conductive layer 222 can have 50 nm of thermally grown silicon dioxide and 200 nm of deposited silicon dioxide to support 30V operation, or 40-160 nm of thermally grown silicon dioxide and 70-200 nm of deposited silicon dioxide to support 60V operation. Alternately, non-conductive layer 222 can have 150 nm of thermally grown silicon dioxide and 800 nm of CVD oxide to support 200V operation.

Following this, a conductive layer 224 is formed on non-conductive layer 224 to fill up the trenches 216. Conductive layer 224 can be formed, for example, as a layer of polysilicon by thermally decomposing silane gas inside a low-pressure reactor at a temperature between 580° C. to 650° C. Conductive layer 224 can alternately be formed with amorphous silicon by thermally decomposing silane gas inside a low-pressure reactor at a temperature below 580° C.

In the present example, conductive layer 224 is doped with a p-type dopant, such as boron, but can alternately be doped with an n-type dopant, such as phosphorus or arsenic. The dopants can be implanted at a dose of, for example, $8 \times 10^{14}$ to $1 \times 10^{16}$. A thermal drive operation diffuses the dopants into conductive layer 224. Alternately, conductive layer 224 can be doped to a desired level during formation using appropriate dopant reagents.

Next, as shown in FIGS. 4A-4B, conductive layer 224 and non-conductive layer 222 are removed from the top surface of epitaxial layer 214 with a planarization process, such as chemical-mechanical polishing or a plasma etch back, to form a number of trench structures 226 that lie in the trenches 216. The trench structures 226 have depths that are substantially larger than the widths. The trench structures 226 include a number of transistor trench structures 226-1 that lie in the transistor trenches 120-1, and a perimeter trench structure 226-2 that lies in perimeter trench 120-2 and laterally surrounds the transistor trench structures 226-1.

In the present example, each trench structure 226 has a conductive region 230 and a non-conductive region 232 that isolates the conductive region 230 from epitaxial layer 214. In addition, the planarization causes the top surfaces of the conductive regions 230 and the non-conductive regions 232 to lie substantially in the same plane as the top surface of epitaxial layer 214. The trench structures 226 can implement the trench structures 120 of vertical high-voltage MOS transistor 100 where the conductive regions 230 form the field plates 122 of vertical high-voltage MOS transistor 100.

After the trench structures 226 have been formed, a dielectric layer 234 is formed on epitaxial layer 214, the conductive regions 230, and the non-conductive regions 232. The thickness of dielectric layer 234 can be adjusted to accommodate the operating voltage of vertical high-voltage MOS transistor 100.

For example, dielectric layer 234 can have a thickness of 200 nm to support 30V operation, or a thickness of 1000 nm to support 200V operation. Dielectric layer 234 can be formed with, for example, silicon dioxide with a plasma enhanced chemical vapor deposition (PECVD) process using tetraethyl orthosilicate, also known as tetraethoxysilane or TEOS. Optionally, a phosphosilicate glass layer, for example 30 to 80 nm thick, may be formed on dielectric layer 234.

Following this, a patterned photoresist layer 236 is formed on dielectric layer 234 (or the glass layer if present). Patterned photoresist layer 236 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

After patterned photoresist layer 236 has been formed, the exposed regions of dielectric layer 234 are etched through patterned photoresist layer 236 until the top surface of epitaxial layer 214 has been exposed. The etch of dielectric layer 234 is performed so that an edge 238 of dielectric layer 234 has a sloped profile of, for example, 30° to 60° from a horizontal plane. The dielectric etch can include, for example, a dry etch followed by a wet etch to produce the desired sloped profile.

When the optional phosphosilicate glass layer is present, the dielectric etch can include a wet etch using buffered aqueous hydrofluoric acid to provide edge 238. The phosphosilicate glass layer etches more quickly than dielectric layer 234 does so that an edge of a top surface of dielectric layer 234 is continually exposed, producing the desired sloped profile. Following the etch, patterned photoresist layer 236 is removed in a conventional manner, such as with an ash process.

As shown in FIGS. 5A-5B, once patterned photoresist layer 236 has been removed, a gate dielectric layer 240 is formed on the top surface of epitaxial layer 214. A cleanup etch of, for example, a wet etch using dilute hydrofluoric acid, can be performed prior to forming gate dielectric layer 240 to remove any unwanted oxide on the top surface of epitaxial layer 214.

Gate dielectric layer 240 can be implemented with a thermally grown silicon dioxide, and have a thickness of, for example, 10 nm to 100 nm depending on the desired gate drive voltage. Gate dielectric layer 240 may include additional layers of other dielectric material such as silicon oxynitride or hafnium oxide.

Following this, a layer of gate material 242 is deposited on gate dielectric layer 240. The layer of gate material 242 can include 100 to 200 nm of polysilicon and possibly a layer of metal silicide on the polysilicon, such as 100 to 200 nm of tungsten silicide. Other materials which can be used to implement the layer of gate material 132 are within the scope of the instant example. The layer of gate material 242 is continuous over the sloped edge 238 of dielectric layer 234. Forming the sloped edge 238 advantageously allows the formation process of the layer of gate material 242 to have a wide process latitude and maintain continuity over the sloped edge 238 of dielectric layer 234.

A layer of cap dielectric can optionally be formed over the layer of gate material 242. The layer of cap dielectric can include 50 to 150 nm of silicon dioxide formed by a PECVD process. Next, a patterned mask layer 244 is formed over the layer of gate material 242 (or the cap dielectric if present). The patterned mask layer 244 can include a patterned photoresist, anti-reflection layer, and/or hard mask layer.

As shown in FIGS. 6A-6B, after patterned mask layer 244 has been formed, the exposed regions of the layer of gate material 242 are etched in a conventional manner to expose gate dielectric layer 240 and form a number of gates 246. Following the etch, patterned mask layer 244 is removed in a conventional fashion.

Figure 7A:
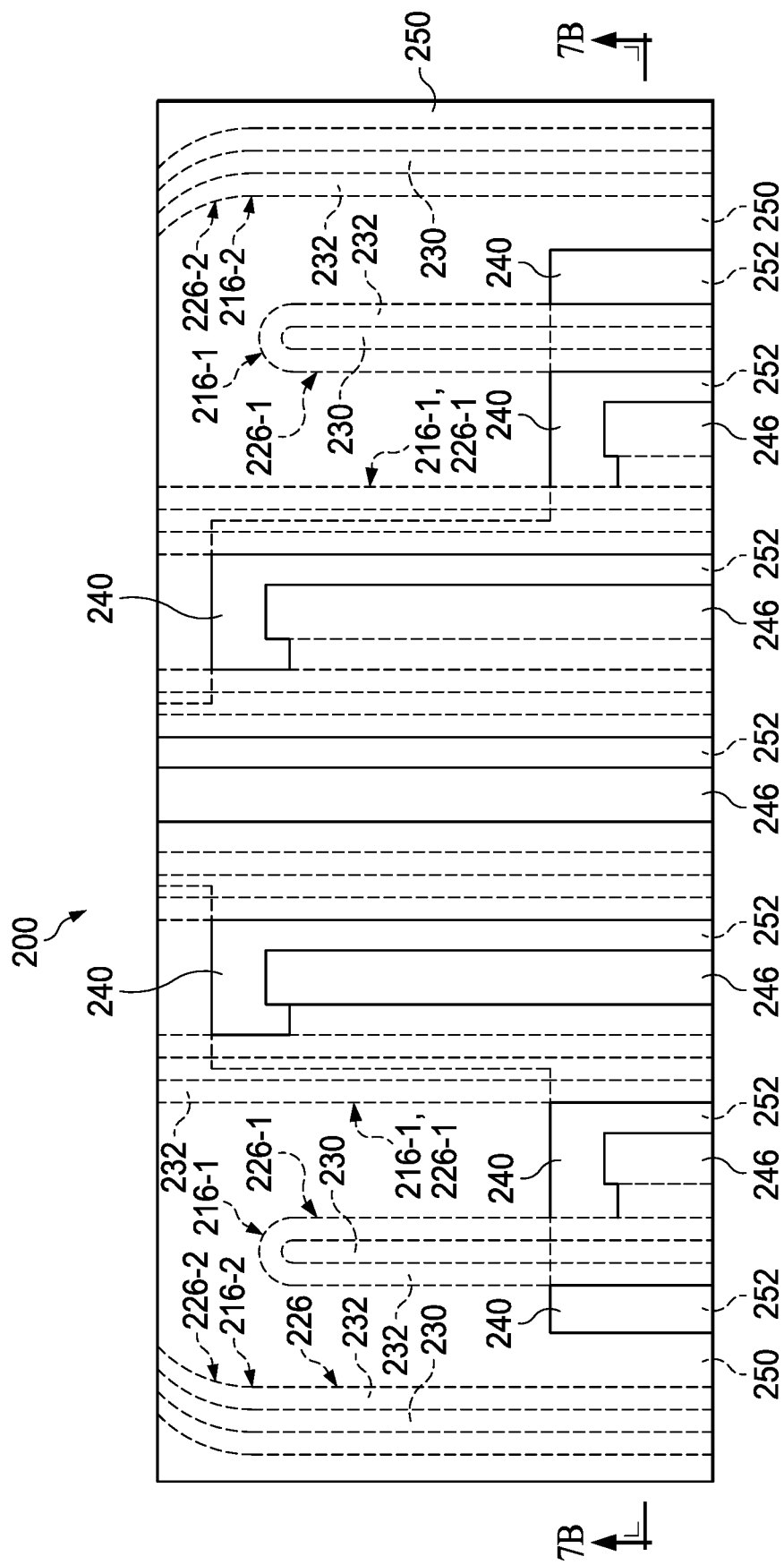
Figure 7B:
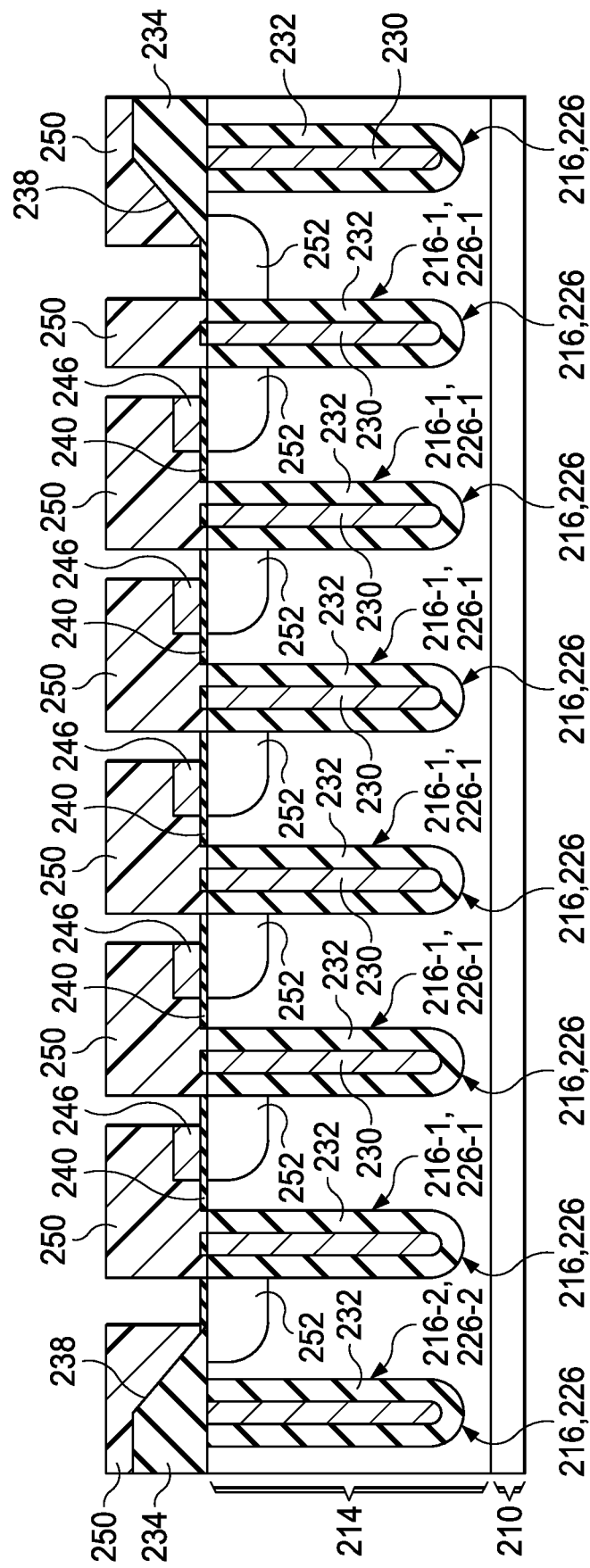

As shown in FIGS. 7A-7B, after patterned mask layer 244 has been removed, a patterned photoresist layer 250 is formed on gate dielectric layer 240 and the gates 246 in a conventional manner. Following this, dopants are implanted into epitaxial layer 214 through patterned photoresist layer 250 to form a number of body regions 252 that each touch a transistor trench structure 226. The dopants can be implanted at a dose of, for example, $3\times10^{13}$ to $2\times10^{14}$. Following the implant, patterned photoresist layer 250 is removed in a conventional manner.

After this, a thermal drive process diffuses and activates the dopants. In addition, a number of body regions 252 extend partway under the gates 246. The thermal drive process may include a heat treatment of 1100° C. for 90 minutes or equivalent conditions, for example, 1125° C. for 50 minutes, or 1050° C. for 270 minutes. In the present example, a p-type dopant, such as boron, is implanted to form the body regions 252.

As shown in FIGS. 8A-8B, following the thermal drive in, dopants having an opposite conductivity type are blanket implanted into epitaxial layer 214 to form a number of LDD regions 254 that touch the body regions 252. The LDD regions 254 can be used to implement the LDD regions 132. Each LDD region 254 touches and lies laterally between a trench structure 226 and a body region 252.

The dopants can be implanted at a dose of $7\times10^{11}$ to $1\times10^{13}$ and an energy of 100 keV to 200 keV to provide independent control of the drain-source breakdown voltage. Although dopants are also implanted into the body regions 252, the dose is insufficient to change the conductivity type of the body regions. In the present example, an n-type dopant, such as phosphorous or arsenic, is implanted to form the LDD regions 254. In addition, the LDD regions 254 do not touch the perimeter body regions 252.

Gate sidewall spacers can be optionally formed on the lateral surfaces of the gates 246. Gate sidewall spacers can be formed by forming a conformal layer of silicon dioxide 50 to 100 nm thick over the top surface of the semiconductor device, and then removing the silicon dioxide from horizontal surfaces using an anisotropic etch process, such as an RIE process.

Figure 9A:
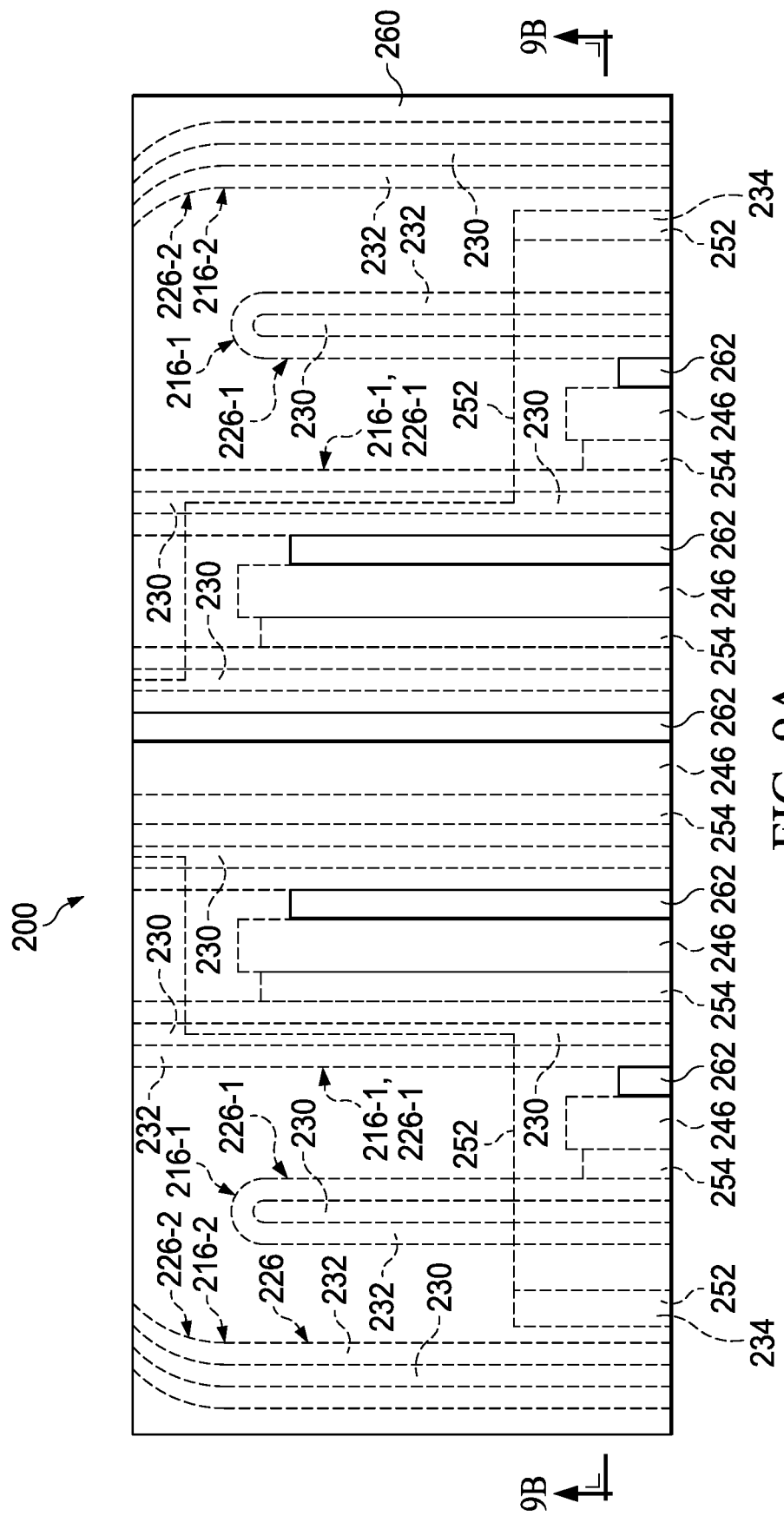
Figure 9B:
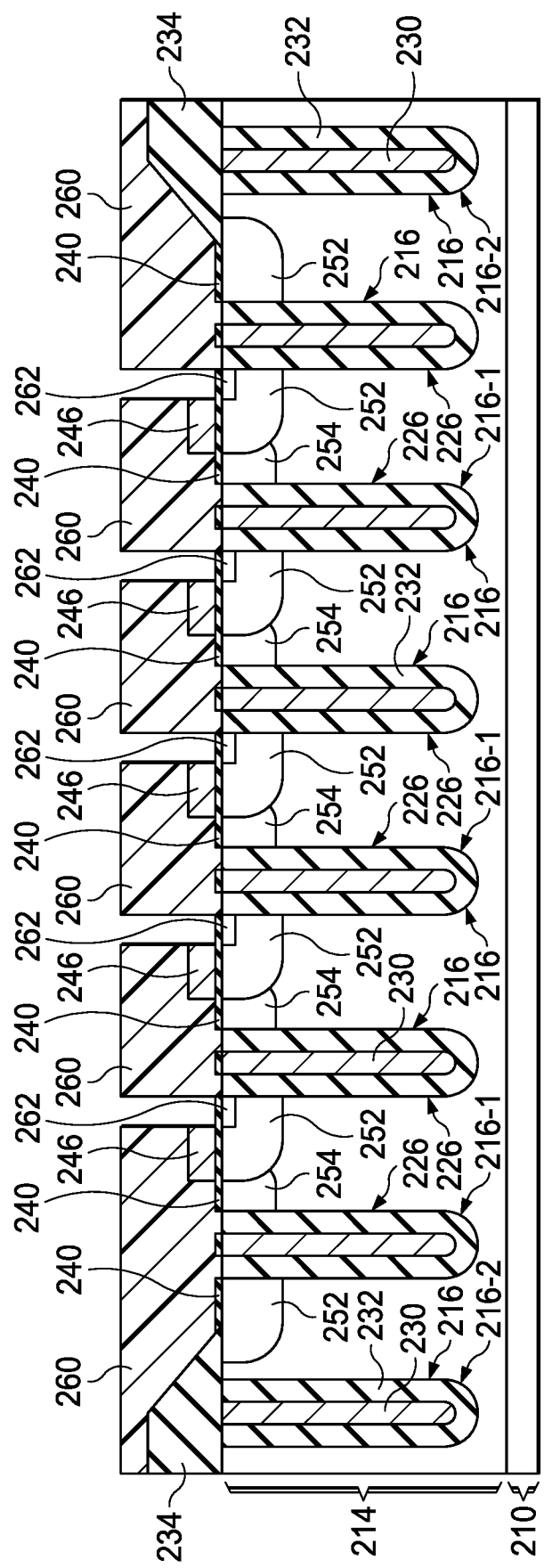

As shown in FIGS. 9A-9B, a patterned photoresist layer 260 is next conventionally formed on gate dielectric layer 240 and the gates 246. After this, dopants having the same conductivity type as epitaxial layer 214 are implanted through patterned photoresist layer 260 to form a number of source regions 262 that touch the body regions 252. The implant can have a dose of $8\times10^{14}$ to $1\times10^{16}$ and an energy of 20 keV to 70 keV. Following the implant, patterned photoresist layer 260 is removed in a conventional manner. In the present example, the source regions 262 are n+ regions.

Figure 10A:
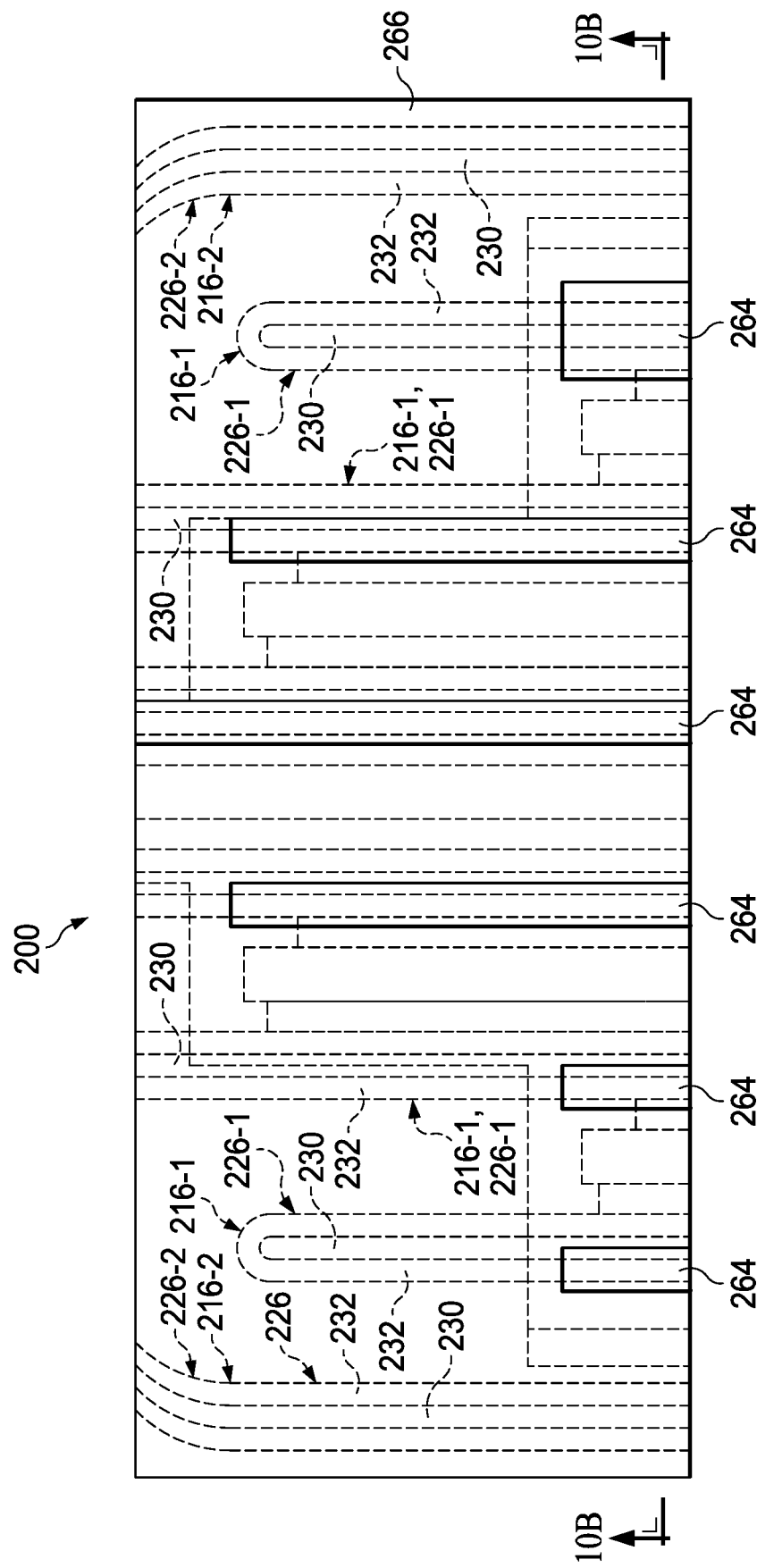
Figure 10B:
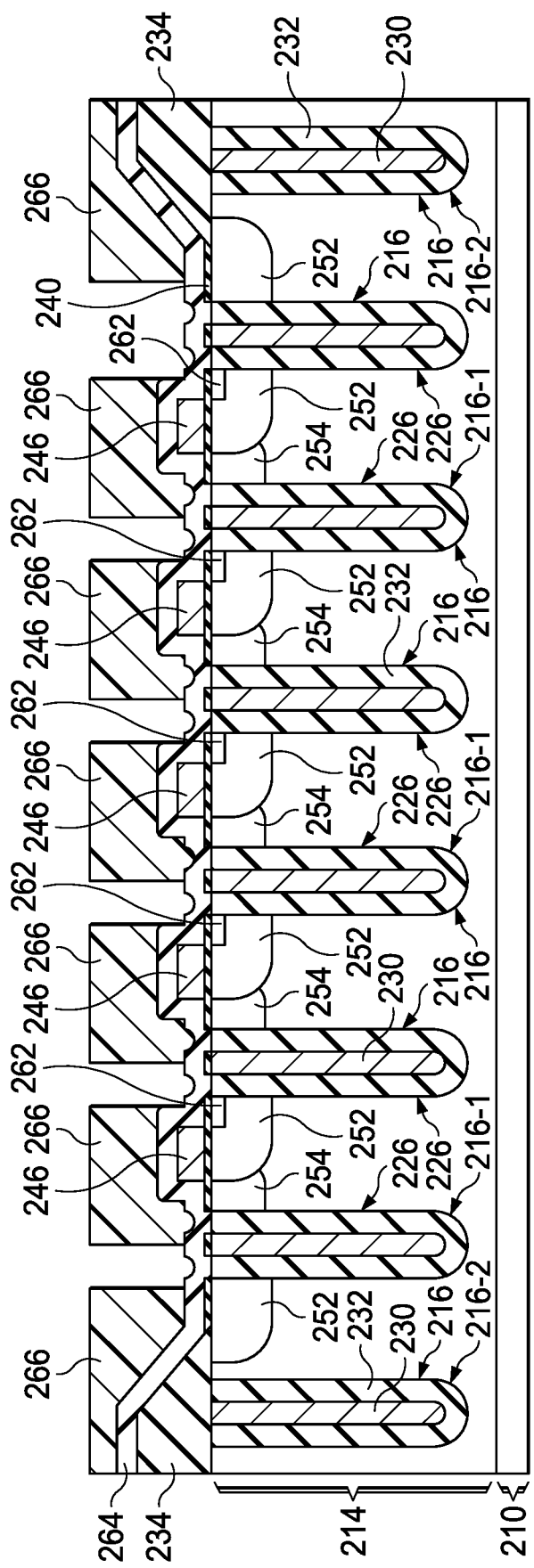

As shown in FIGS. 10A-10B, after patterned photoresist layer 260 has been removed, a dielectric layer 264 is deposited on the gate dielectric layers 240 and the gates 246. Dielectric layer 264 can include 70 nm to 200 nm of silicon dioxide formed using, for example, a PECVD process. Once dielectric layer 264 has been formed, a patterned photoresist layer 266 is conventionally formed on dielectric layer 264.

Figure 11A:
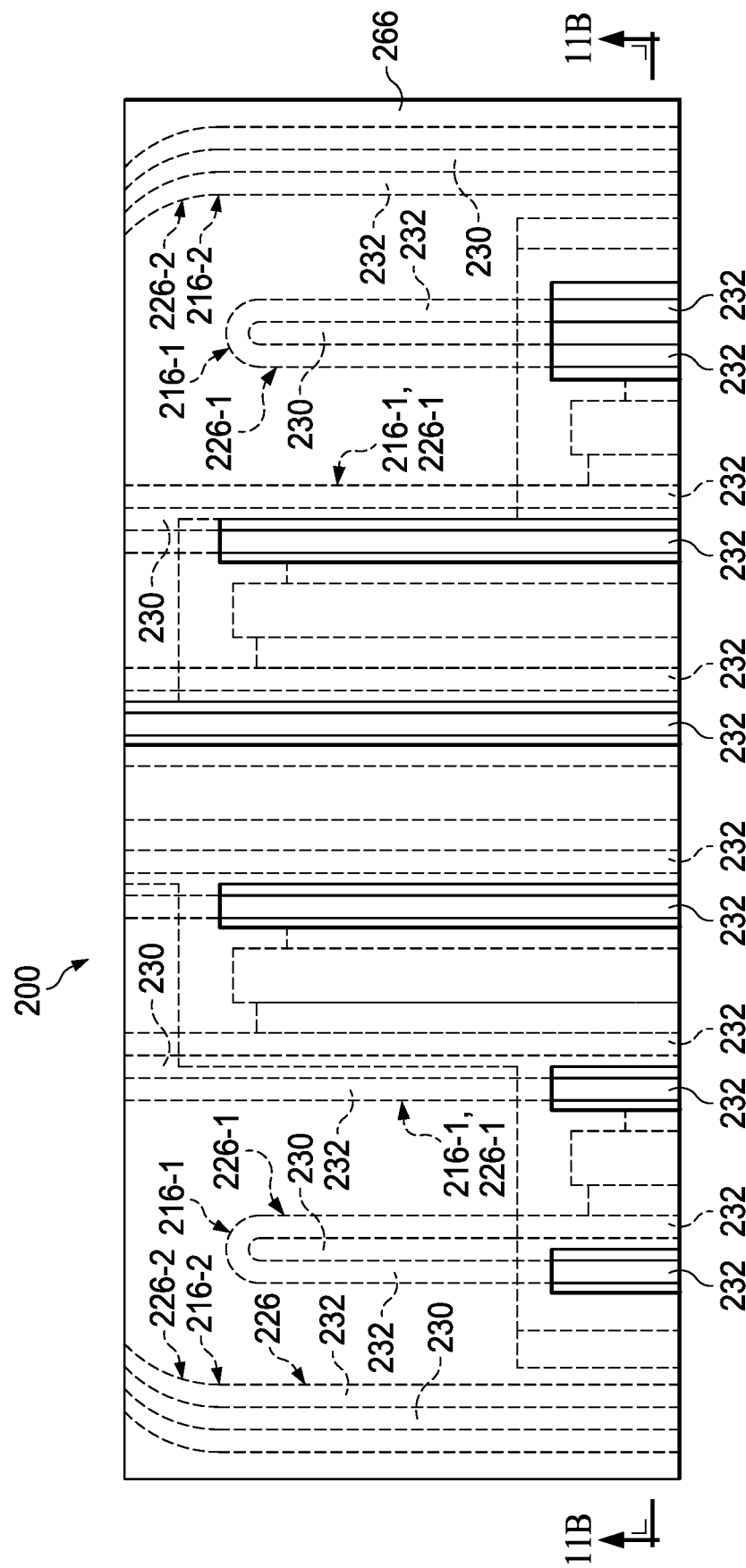
Figure 11B:
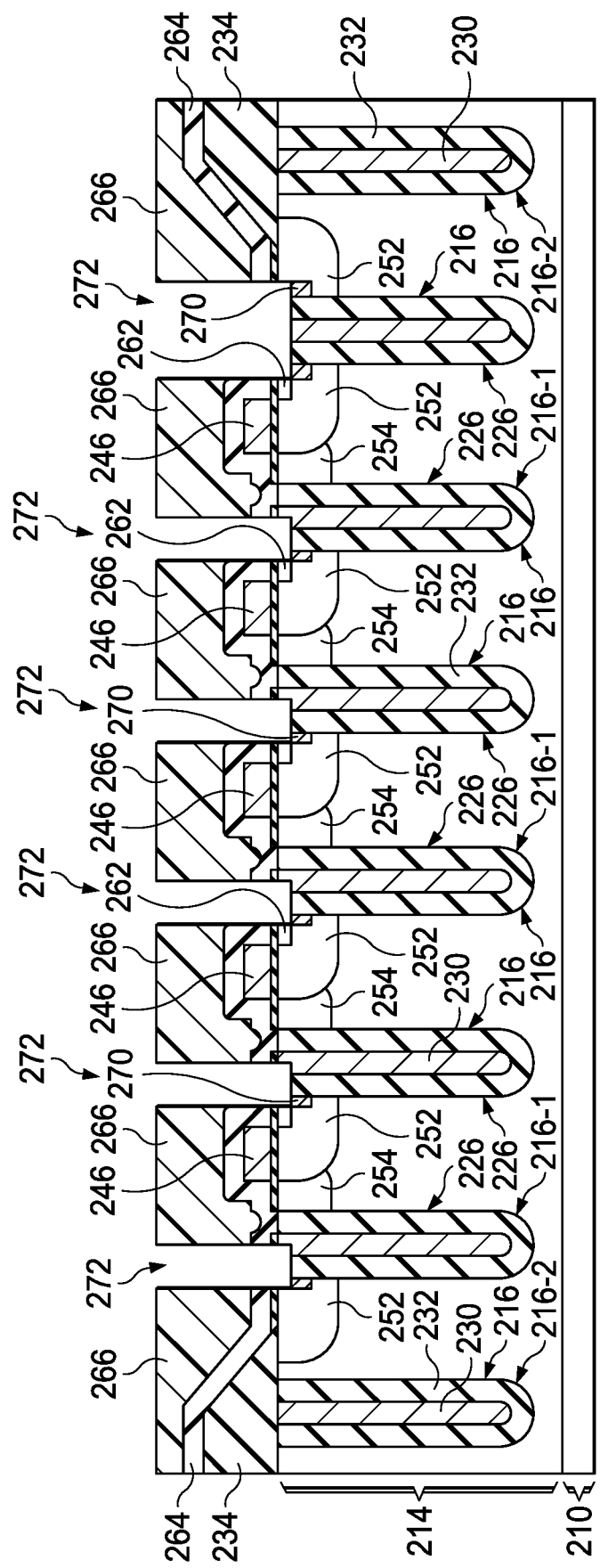

As shown in FIGS. 11A-11B, after patterned photoresist layer 266 has been formed, the exposed regions of dielectric layer 264 and the underlying portions of the source regions 262, the body regions 252, non-conductive region 232, and conductive region 230 are etched to form a number of openings 272 that extend down approximately 200 nm to 400 nm below the top surface of epitaxial layer 214. The openings 272 expose the conductive field plate regions 230 and the body regions 252. Many of the openings 272 also expose the source regions 262.

Following this, dopants having the opposite conductivity type as epitaxial layer 214 are implanted through patterned photoresist layer 266 to form a number of body contact regions 270 that touch the body regions 252. The implant can have a dose of $5 \times 10^{14}$ to $5 \times 10^{15}$ and an energy of 15 keV to 100 keV. In the present example, boron is implanted to form the body contact regions 270 as p+ regions. Following the implant, patterned photoresist layer 266 is removed in a conventional manner.

The dopants in the body contact regions 270, source regions 262, LDD regions 254 are diffused and activated by an anneal operation. The anneal operation may include heating at 1000° C. for 20 minutes in a nitrogen ambient or equivalent anneal conditions, for example, 1050° C. for 5 minutes, or 975° C. for 40 minutes.

Figure 12A:
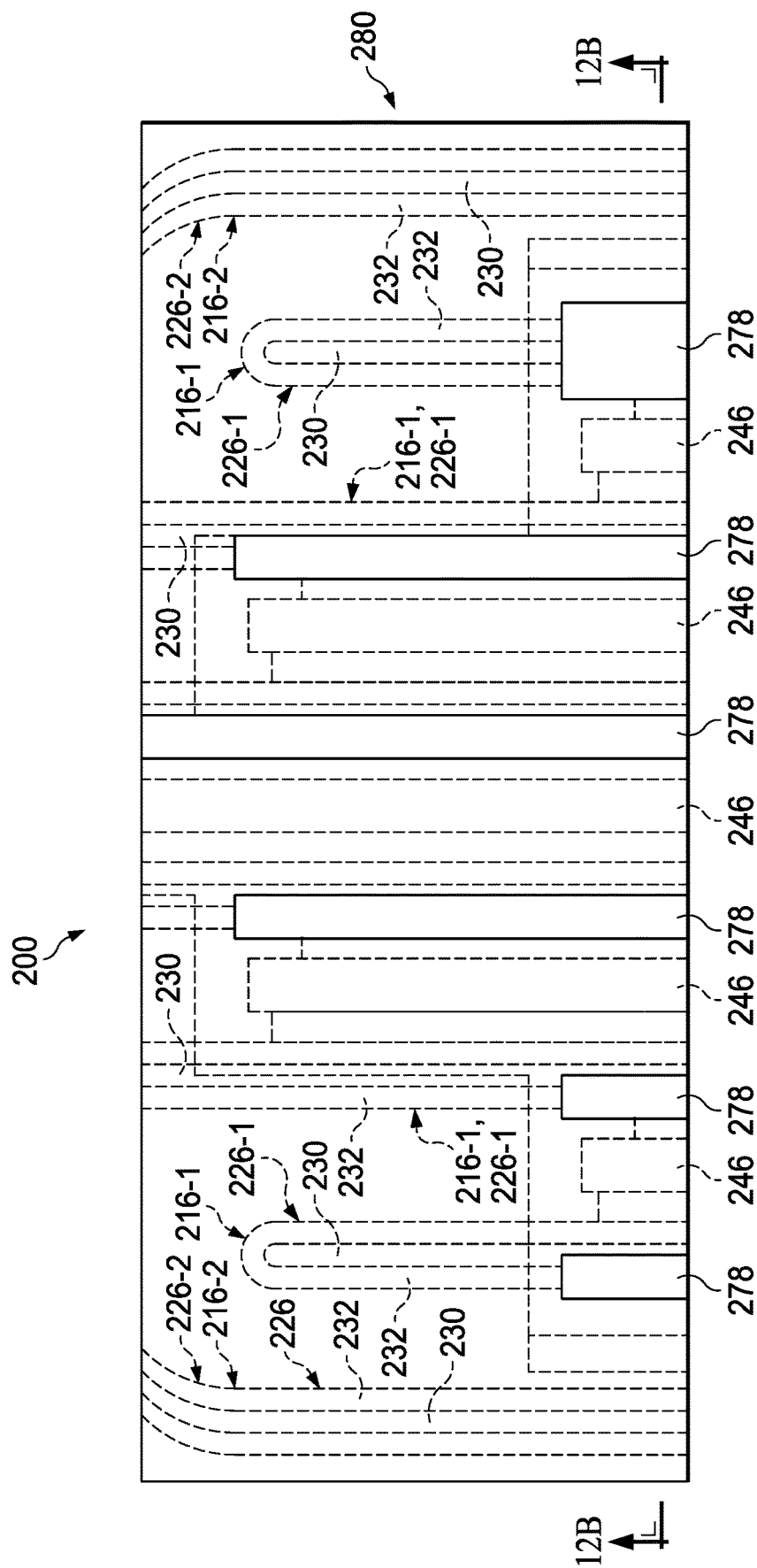
Figure 12B:
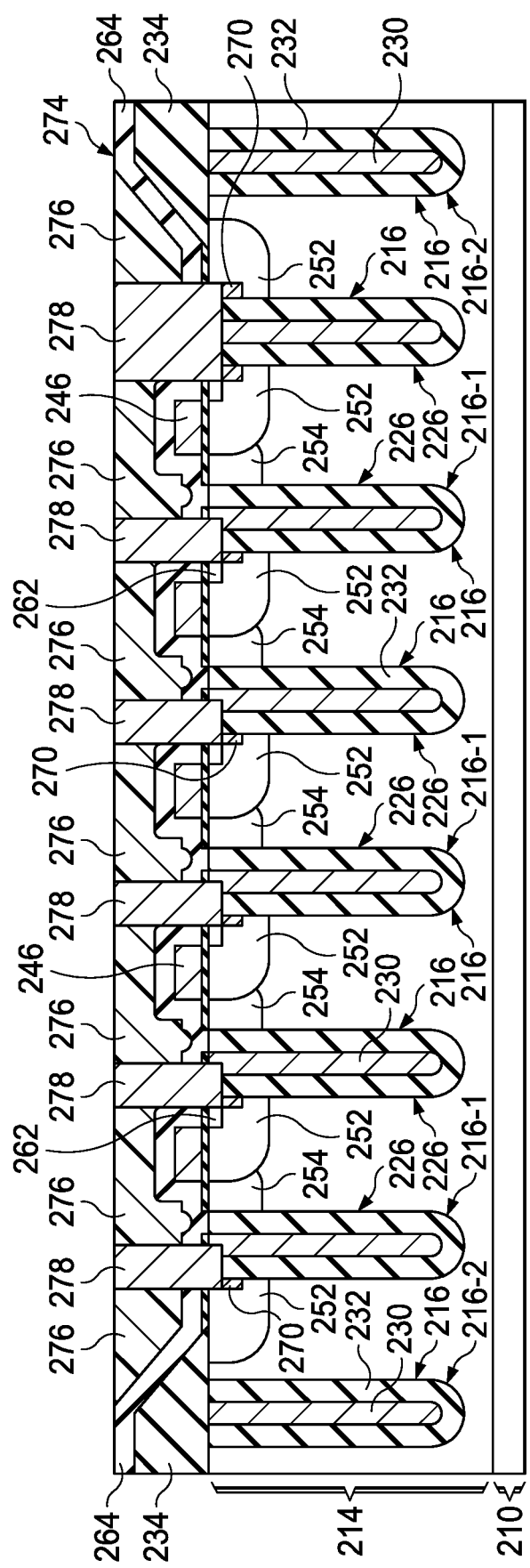

As shown in FIGS. 12A-12B, method 200 next forms a metal interconnect structure 274 using conventional steps to make electrical connections to the conductive (field plate) regions 230, the gates 246, the source regions 262, and the body contact regions 270. Metal interconnect structure 274 has a non-conductive layer 276 that touches dielectric layer 264, and a number of metal contacts 278 that extend through non-conductive layer 276 and dielectric layer 264. The metal contacts 278 include a number of source-body contacts that touch the conductive (field plate) regions 230, the source regions 262, and the body contact regions 270, and a number of gate contacts that touch the gates 246.

The non-conductive layer 276 and the metal contacts 278 can be conventionally formed. For example, the metal contacts 278 can be formed by forming a titanium liner approximately 25-50 nm thick with a sputter process on the existing top surface of the semiconductor device to contact the conductive field plate regions 230, the source regions 262, and the body contact regions 270.

A first titanium nitride layer approximately 15-30 nm thick is next formed by a reactive sputter process on the titanium liner. The titanium liner and the first titanium nitride layer are then heated, for example, to 700° C. to 740° C. for 20 to 60 seconds to form ohmic contacts to the conductive (field plate) regions 230, the source regions 262, and the body contact regions 270.

Following this, a second titanium nitride layer approximately 8-15 nm thick is formed on the first titanium nitride layer using a CVD process to provide a conformal layer. A third titanium nitride layer approximately 15-30 nm thick is next formed on the second titanium nitride layer using a reactive sputtering process. A layer of aluminum approximately 2-5 microns thick is then sputter deposited, followed by the formation of a patterned photoresist layer.

Once the patterned photoresist layer has been formed, the exposed regions of metal are etched to form the metal contacts 278. The patterned photoresist layer is then removed in a conventional fashion. Following this, a layer of dielectric material is deposited and then planarized to form non-conductive layer 276. Conventional steps are then followed to complete the formation of metal interconnect structure 274. Dielectric layer 264 and non-conductive layer 276 can be used to implement non-conductive layer 154.

After metal interconnect structure 274 has been formed, the backside is ground down and a metal contact is formed to touch and make an electrical connection to substrate 210 (or the heavily-doped lower region of epitaxial layer 214), and form a vertical high-voltage MOS transistor 280. Method 200 then continues with conventional back-end processing steps.

Figure 13A:
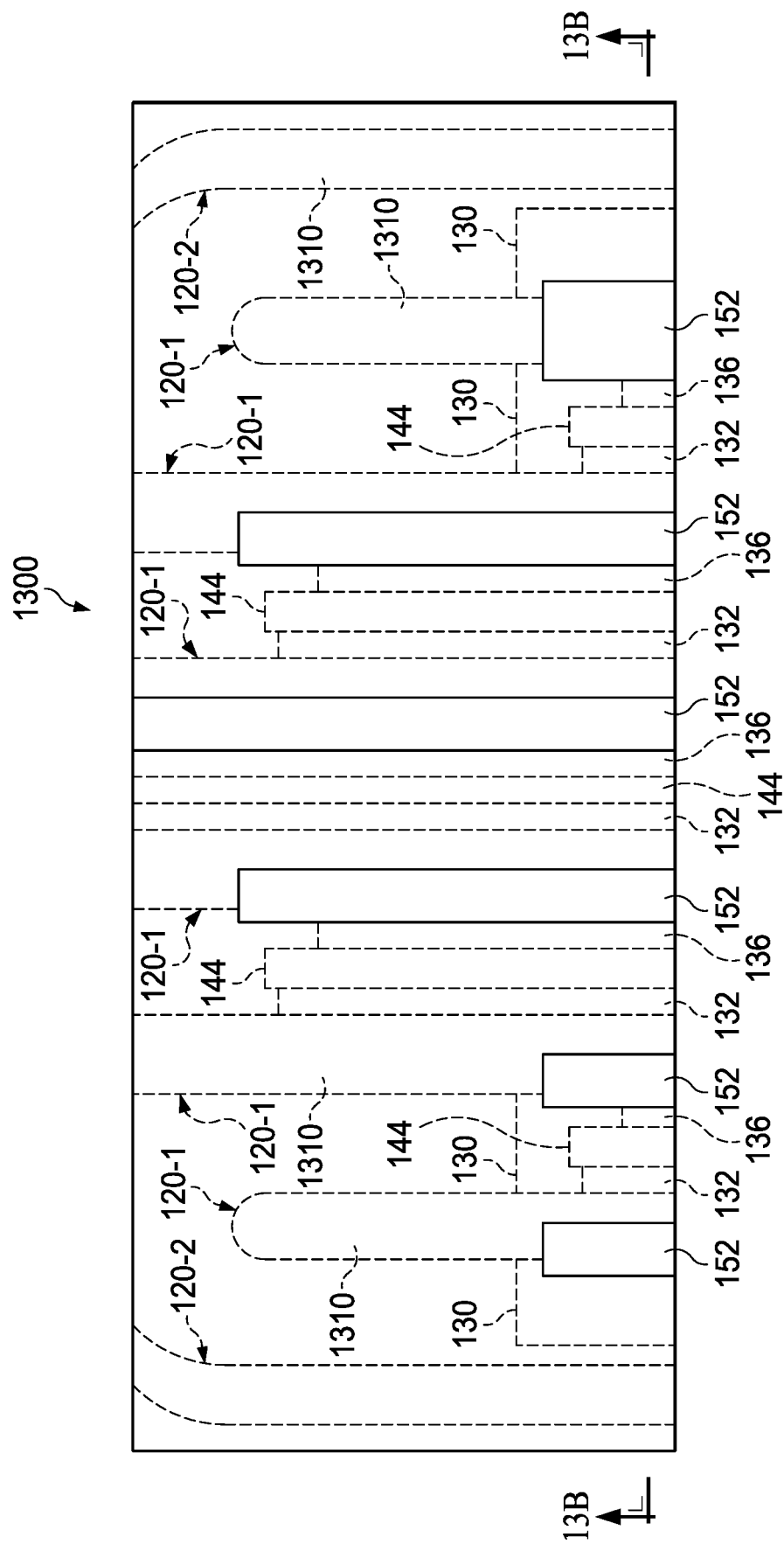
FIGS. 13A-13B are views illustrating an example of a vertical high-voltage MOS transistor 1300 in accordance with a first alternate embodiment of the present disclosure.
Figure 13B:
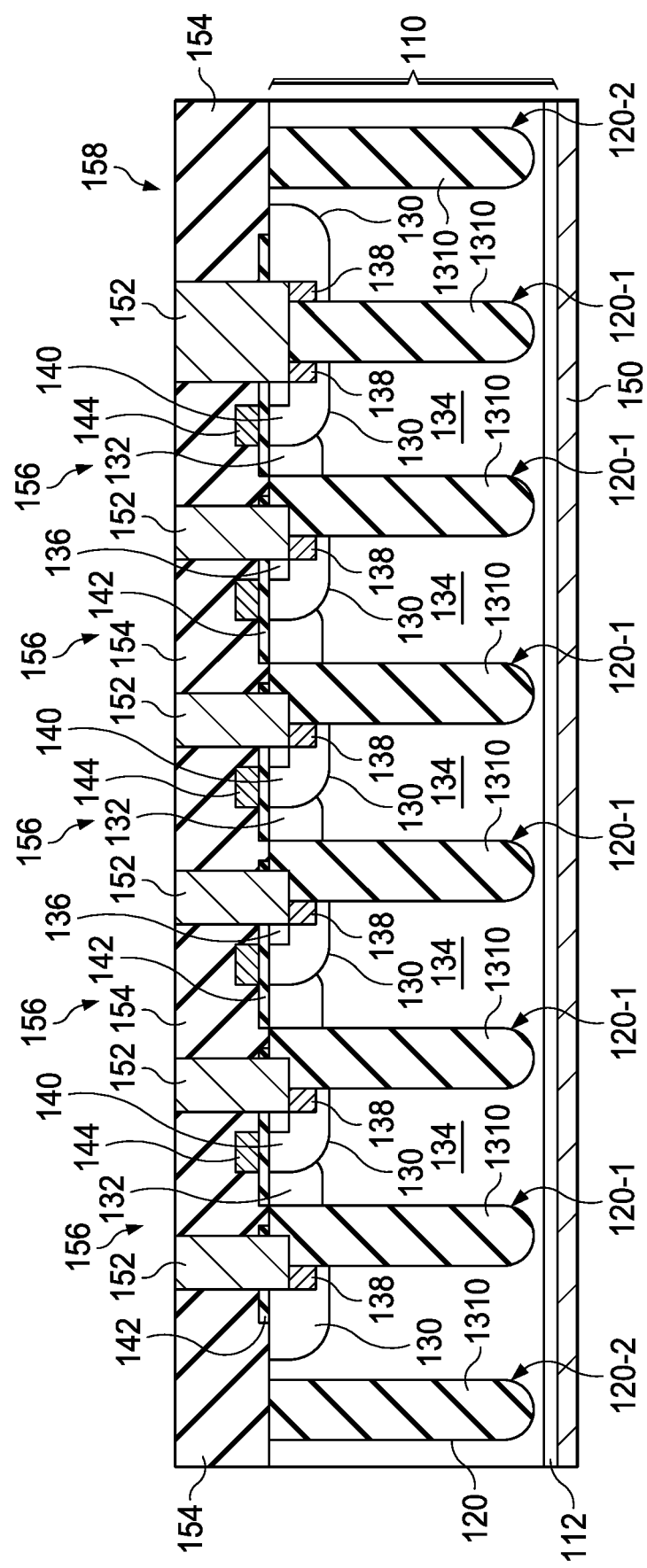

FIGS. 13A-13B are views that illustrate an example of a vertical high-voltage MOS transistor 1300 in accordance with a first alternate embodiment of the present disclosure. FIG. 13A shows a partial plan view. FIG. 13B shows a cross-sectional view taken along lines 13B-13B of FIG. 13A. Vertical high-voltage MOS transistor 1300 is similar to vertical high-voltage MOS transistor 100 and, as a result, utilizes the same reference numerals to designate the structures that are common to both transistors.

As shown in FIGS. 13A-13B, vertical high-voltage MOS transistor 1300 differs from vertical high-voltage MOS transistor 100 in that vertical high-voltage MOS transistor 1300 implements the trench structures 120 with single-crystal silicon regions 1310 as the field plates 122. Each of the single-crystal silicon regions 1310 has a conductivity type that is opposite to the conductivity type of the drain drift regions 134. In the present example, the single-crystal silicon regions 1310 have a p conductivity type.

FIGS. 14A-14B through 15A-15B show a series of views that illustrate an example of a method 1400 of forming a vertical high-voltage MOS transistor structure in accordance with the first alternate embodiment of the present disclosure. FIGS. 14A-15A show partial plan views, while FIGS. 14B-15B show cross-sectional views taken along lines 14B-14B through 15B-15B in FIGS. 14A-15A, respectively.

Method 1400 follows the same initial steps as method 200. As shown in FIGS. 14A-14B, method 1400 deviates from method 200 in that following the removal of hard mask 220, a single-crystal silicon layer 1410 is epitaxially grown on the top surface of epitaxial layer 214 and in the trenches 216 to fill up the trenches 216. Single-crystal silicon layer 1410 can be in-situ doped during the epitaxial growth, or doped by ion implantation following the epitaxial growth. In the present example, single-crystal silicon layer 1410 is formed to have a p conductivity type.

As shown in FIGS. 15A-15B, after single-crystal silicon layer 1410 has been formed, single-crystal silicon layer 1410 is planarized until single-crystal silicon layer 1410 has been removed from the top surface of epitaxial layer 214. The planarization forms the trench structures 226 as a number of single-crystal silicon (field plate) regions 1412 in the trenches 216. The single-crystal silicon regions 1412 can implement the single-crystal silicon regions 1310. Following this, dielectric layer 234 is deposited, and method 1400 continues with the same steps as method 200.

Figure 16A:
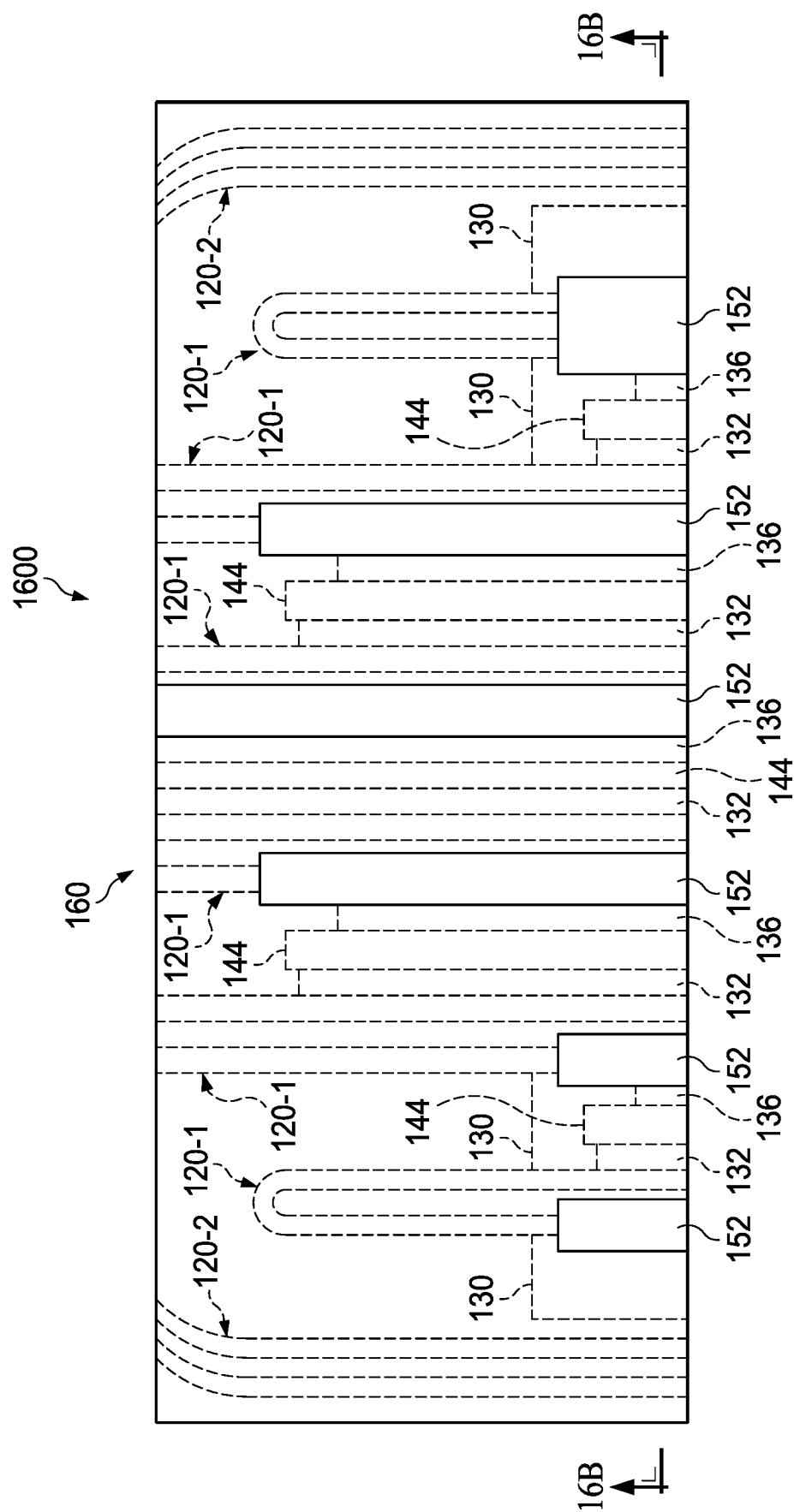
FIGS. 16A-16B are views illustrating an example of a vertical high-voltage MOS transistor 1600 in accordance with a second alternate embodiment of the present disclosure.
Figure 16B:
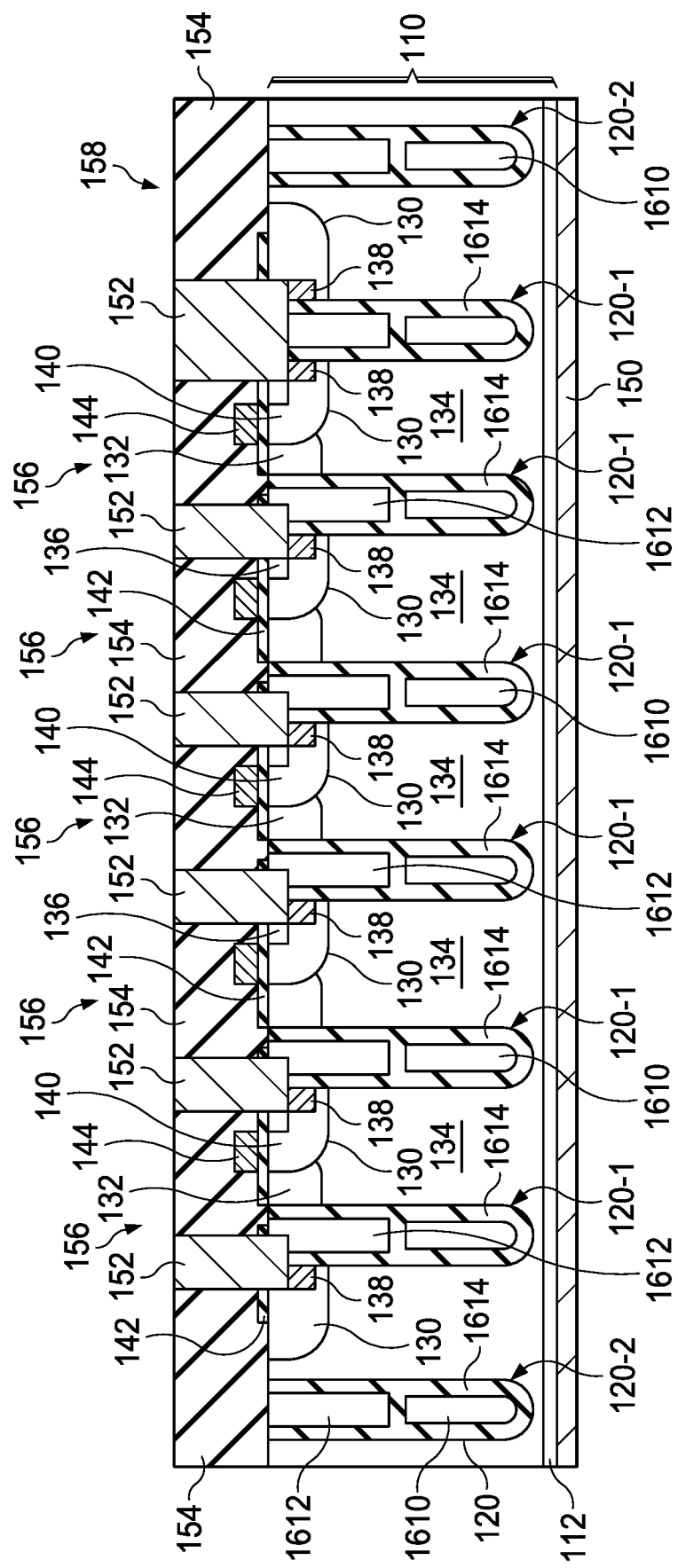

FIGS. 16A-16B are views that illustrate an example of a vertical high-voltage MOS transistor 1600 in accordance with a second alternate embodiment of the present disclosure. FIG. 16A shows a partial plan view, while FIG. 16B shows a cross-sectional view taken along lines 16B-16B of FIG. 16A. Vertical high-voltage MOS transistor 1600 is similar to vertical high-voltage MOS transistor 100 and, as a result, utilizes the same reference numerals to designate the structures that are common to both transistors.

As shown in FIGS. 16A-16B, vertical high-voltage MOS transistor 1600 differs from vertical high-voltage MOS transistor 100 in that vertical high-voltage MOS transistor 1600 implements the trench structures 120 with lower and upper field plates 1610 and 1612 in lieu of the field plates 122, and a dielectric structure 1614 in lieu of dielectric structure 124. Dielectric structure 1614, which isolates the lower and upper field plates 1610 and 1612 from drain drift region 134, has a first thickness laterally adjacent to lower field plate 1610 and a second thickness laterally adjacent to upper field plate 1612 that is less than the first thickness. In the present example, the lower and upper field plates 1610 and 1612 are implemented with p-type polysilicon.

FIGS. 17A-17B through 19A-19B show a series of views that illustrate an example of a method 1700 of forming a vertical high-voltage MOS transistor structure in accordance with the alternate embodiment of the present disclosure. FIGS. 17A-19A show partial plan views, while FIGS. 17B-19B show cross-sectional views taken along lines 17B-17B through 19B-19B in FIGS. 17A-19A, respectively.

Method 1700 follows the same initial steps as method 200. As shown in FIGS. 17A-17B, method 1700 deviates from method 200 in that after conductive layer 224 has been deposited, a patterned photoresist layer 1712 is formed on conductive layer 224 in a conventional manner. After patterned photoresist layer 1712 has been formed, the exposed regions of conductive layer 224 are etched through patterned photoresist layer 1712 until conductive layer 224 has been removed from the top portions of the trenches 216. The etch forms a number of lower conductive regions 1710 which can be used to implement the lower field plates 1610.

After the lower conductive regions 1710 have been formed, non-conductive layer 222 is etched through patterned photoresist layer 1712 to form a thinned non-conductive layer 1714, which results from reducing the thickness of non-conductive layer 222 by a predetermined amount. The etch can include, for example, a timed wet etch using a buffered hydrofluoric acid solution.

An example of a buffered hydrofluoric acid solution is 10 parts of 40% ammonium fluoride in deionized water and 1 part of 49% hydrofluoric acid in deionized water. This example buffered hydrofluoric acid solution etches densified SACVD silicon dioxide at more than twice the rate of thermal oxide. Following the etch, patterned photoresist layer 1712 is removed in a conventional fashion.

As shown in FIGS. 18A-18B, after thinned non-conductive layer 1714 has been formed, a non-conductive layer 1716 is formed on thinned non-conductive layer 1714 and the exposed top regions of the lower conductive regions 1710. Non-conductive layer 1716 can be, for example, 160 nm to 280 nm thick, and formed by an SACVD process or a PECVD process. Non-conductive layer 1716 can be subsequently densified in an anneal step.

Following this, a conductive layer 1718 is formed on non-conductive layer 1716 to fill up the trenches 216. Conductive layer 1718 can be, for example, 550 nm to 700 nm thick, and can be formed, for example, as a layer of polysilicon by thermally decomposing silane gas inside a low-pressure reactor at a temperature between 580° C. to 650° C. Conductive layer 1718 can alternately be formed with amorphous silicon by thermally decomposing silane gas inside a low-pressure reactor at a temperature below 580° C.

Conductive layer 1718 can be doped during formation. Alternatively, conductive layer 1718 can be doped by ion implanting dopants, and subsequent annealed at 900° C. to 1000° C. for 20 to 60 minutes. Conductive layer 1718 is electrically isolated from the lower conductive regions 1710 by non-conductive layer 1716.

In the present example, conductive layer 1718 is doped with a p-type dopant, such as boron, but can alternately be doped with an n-type dopant, such as phosphorus or arsenic. The dopants can be implanted at a dose of, for example, $8 \times 10^{14}$ to $1 \times 10^{16}$. Alternately, conductive layer 1718 can be doped to a desired level during formation using appropriate dopant reagents.

Following this, as shown in FIGS. 19A-19B, conductive layer 1718, non-conductive layer 1716, conductive layer 230, and non-conductive layer 232 are removed from the top surface of epitaxial layer 214 with a planarization process, such as chemical-mechanical polishing. The planarization forms a number of upper conductive regions 1730 which can be used to implement the upper field plates 1612.

The planarization also forms a number of thinner dielectric structures 1732 (from the remaining portions of the upper non-conductive regions 232 and thinned non-conductive layer 1714) that isolate the upper conductive regions 1730 from epitaxial layer 214. In addition, the planarization causes the top surfaces of the upper conductive regions 1730 and the thinner dielectric structures 1732 to lie substantially in the same plane as the top surface of epitaxial layer 214. Method 1700 continues on as in method 200 with the deposition of dielectric layer 234. The lower non-conductive regions 232 and the thinner dielectric structures 1732 can be used to implement the dielectric structures 1614.

In the present example, each transistor trench structure 226-1 has a lower conductive region 1710, a non-conductive region 232 that isolates the lower conductive region 1710 from epitaxial layer 214, an upper conductive region 1730, and a thinner dielectric structure 1732 that isolates the upper conductive region 1730 from epitaxial layer 214 and the lower conductive region 1710.

Figure 20A:
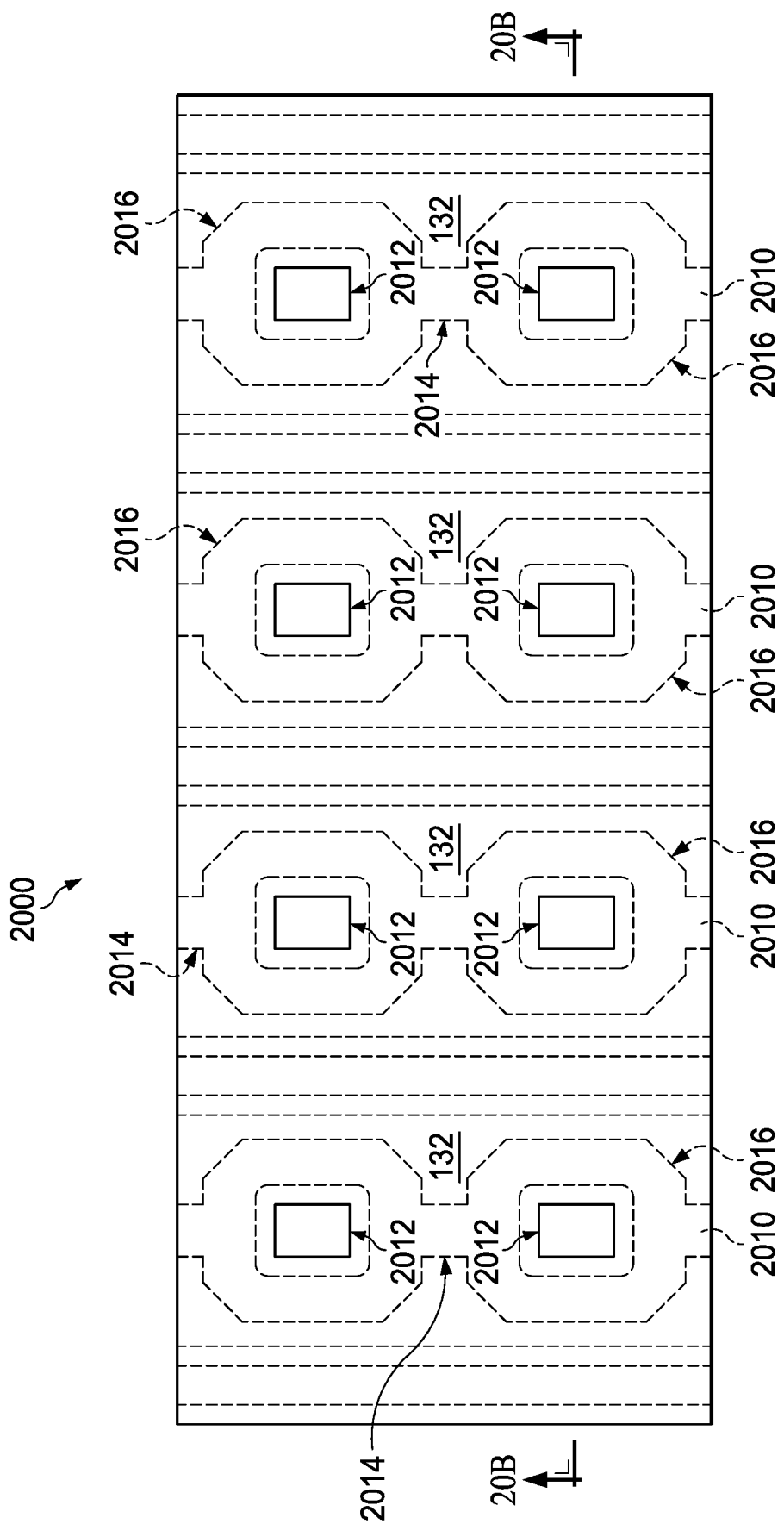
FIGS. 20A-20B are views that illustrate an example of a vertical high-voltage MOS transistor 2000 in accordance with a third alternate embodiment of the present disclosure.
Figure 20B:
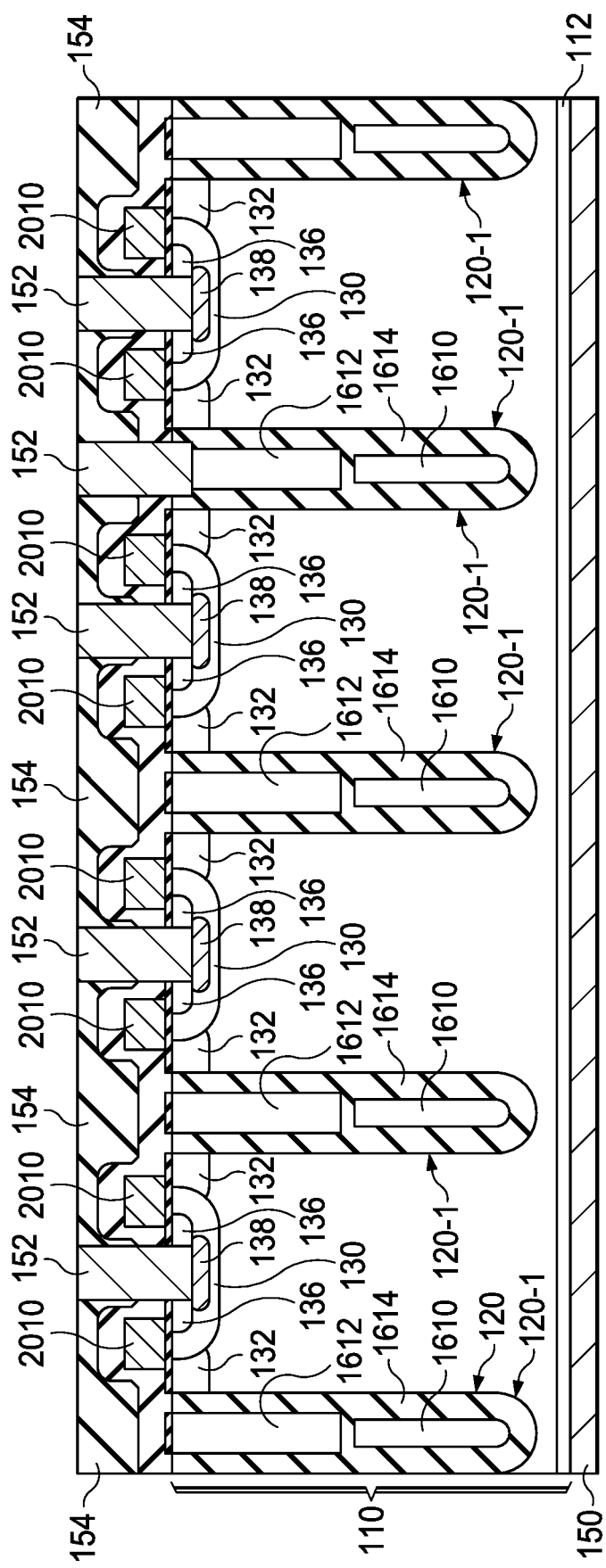

FIGS. 20A-20B are views that illustrate an example of a vertical high-voltage MOS transistor 2000 in accordance with a third alternate embodiment of the present disclosure. FIG. 20A shows a partial plan view, while FIG. 20B shows a cross-sectional view taken along lines 20B-20B of FIG. 20A. Vertical high-voltage MOS transistor 2000 is similar to vertical high-voltage MOS transistor 1600 and, as a result, utilizes the same reference numerals to designate the structures that are common to both transistors.

As shown in FIGS. 20A-20B, vertical high-voltage MOS transistor 2000 differs from vertical high-voltage MOS transistor 1600 in that vertical high-voltage MOS transistor 2000 utilizes a number of gates 2010 in lieu of the gates 144. Each gate 2010 has a series of openings 2012, a series of connecting segments 2014, and a series of split-gate segments 2016 that laterally surround the openings 2012. The segments are connected together such that each adjacent pair of split-gate segments 2016 is connected together by a connecting segment 2014. In the present example, each split-gate segment 2016 has an octagonal shape.

In addition, MOS transistor 2000 also differs from MOS transistor 1600 in that the transistor trench structures 120-1 of MOS transistor 2000 have moved and now lie between and spaced apart from adjacent body regions 130. Further, each of the LDD regions 132 in MOS transistor 2000 touch and lie laterally between a transistor trench structure 120-1 and a body region 130. Also, the same source-body contact 152 in MOS transistor 2000 does not touch source region 136, body contact region 138, and upper field plate 1612 at the same time.

One of the advantages of MOS transistor 2000 is that the LDD regions 132 are relatively narrow, which allows the trench structures 120 to be more closely spaced which, in turn, reduces the trench pitch. The LDD regions 132 can be narrower because the shapes of the gates 2010 provide a substantial amount of additional LDD space adjacent to each connecting segment 2014.

FIGS. 21A-21B through 28A-28B show a series of views that illustrate an example of a method 2100 of forming a vertical high-voltage MOS transistor structure in accordance with the third alternate embodiment of the present disclosure. FIGS. 21A-28A show partial plan views, while FIGS. 21B-28B show cross-sectional views taken along lines 21B-21B through 28B-28B in FIGS. 21A-28A, respectively.

Figure 21A:
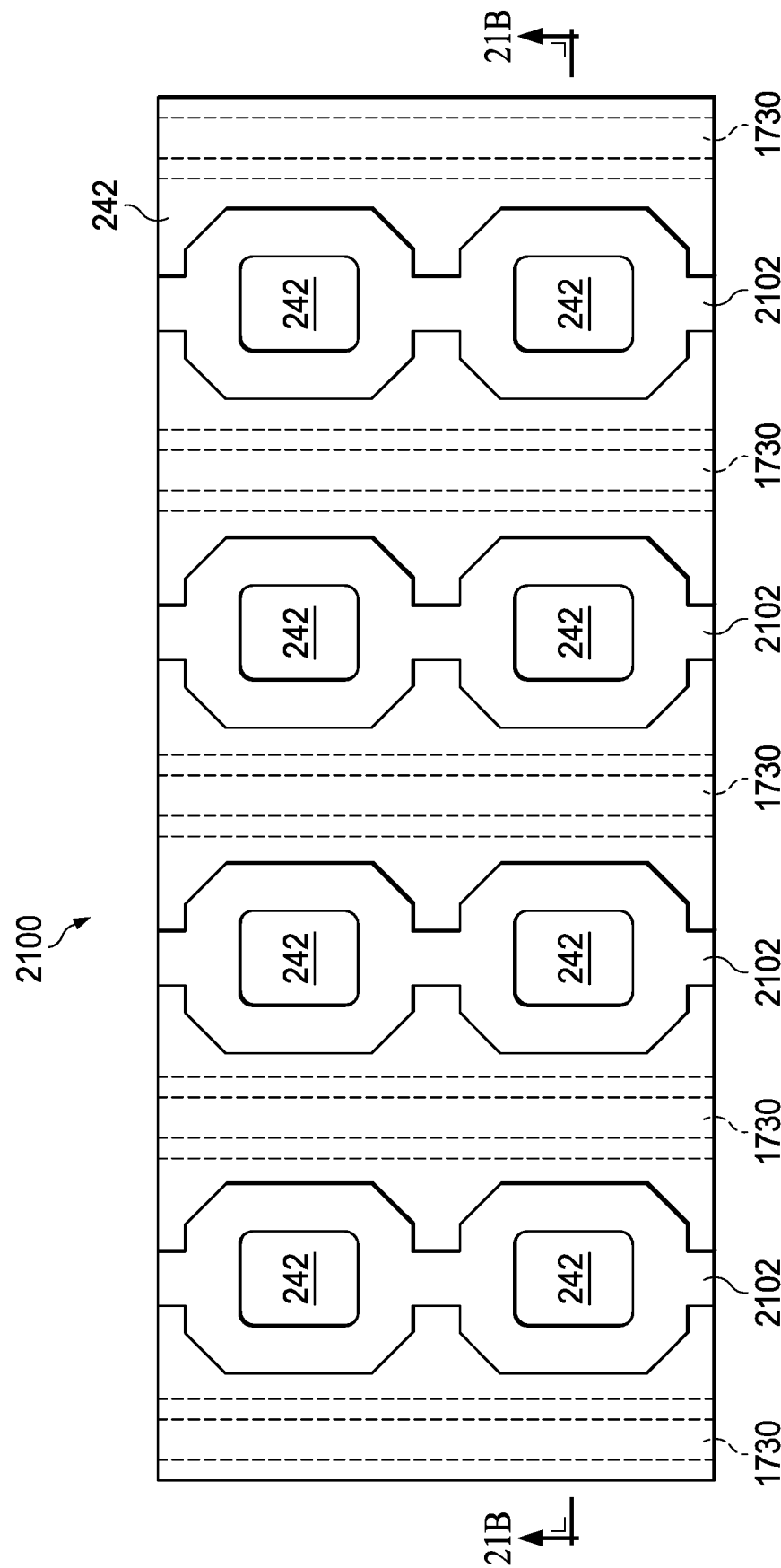
FIGS. 21A-21B through 28A-28B are a series of views illustrating an example of a method 2100 of forming a vertical high-voltage MOS transistor structure in accordance with the second alternate embodiment of the present disclosure.
Figure 21B:
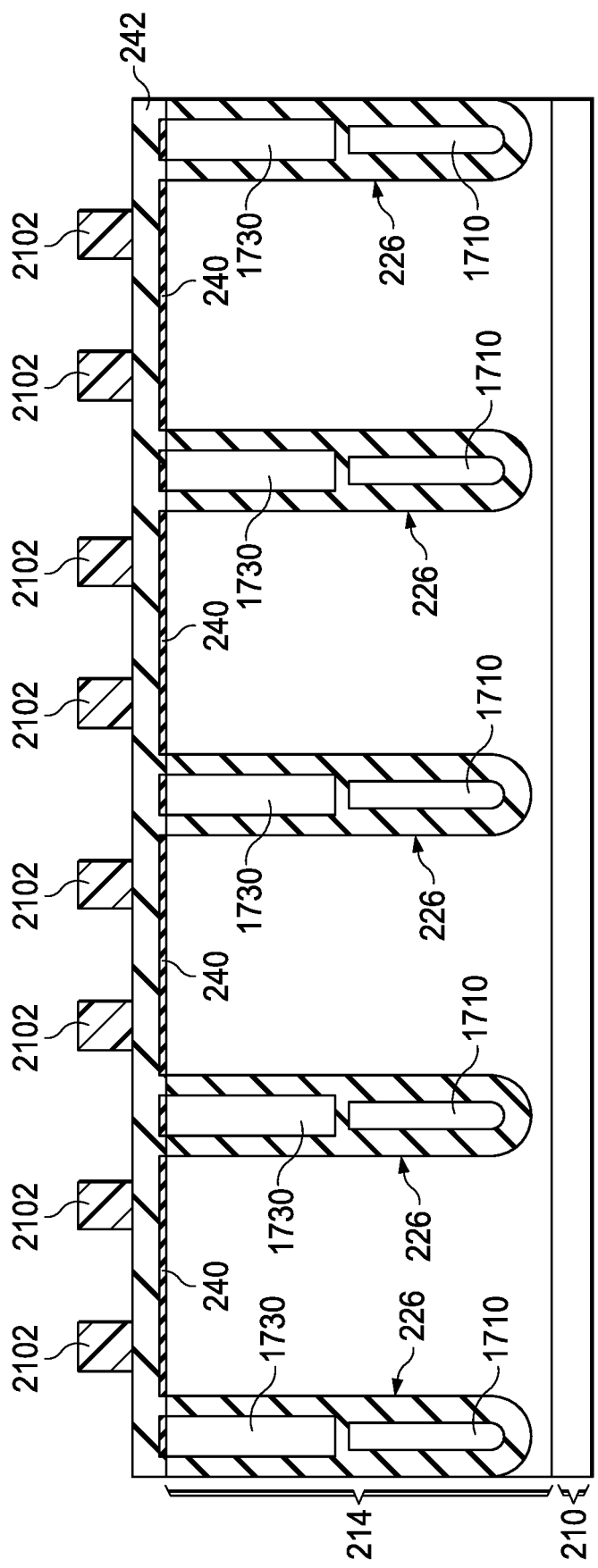

Method 2100 is the same as method 1700 except that the masks and photoresist layers of method 2100 are patterned differently. As shown in FIGS. 21A-21B, after the layer of gate material 242 has been deposited, a patterned mask layer 2102 is formed over the layer of gate material 242 (or the cap dielectric if present) in lieu of patterned mask layer 244. Patterned mask layer 2102 can include photoresist, an anti-reflection layer, and/or a hard mask layer.

Figure 22A:
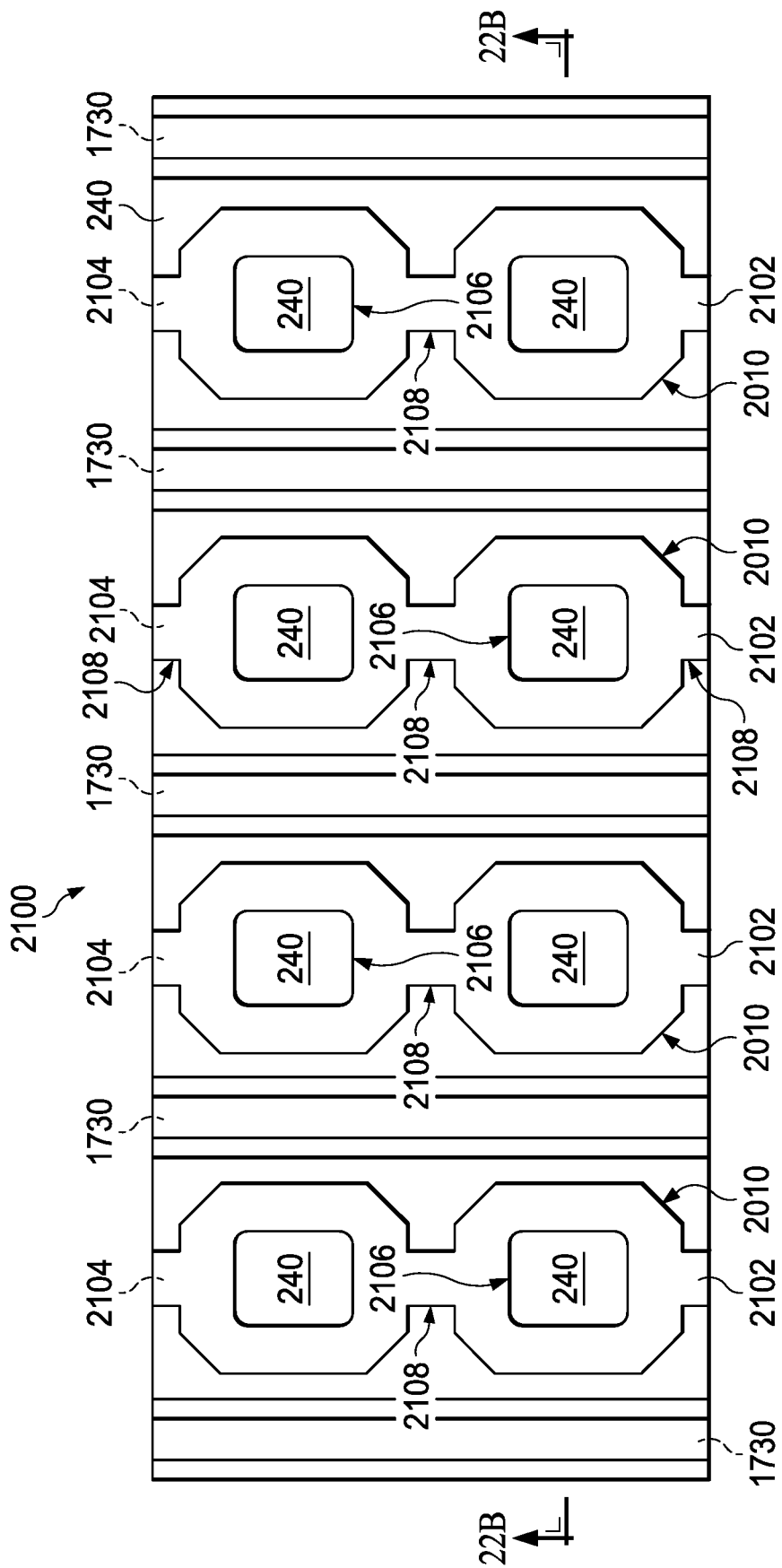
Figure 22B:
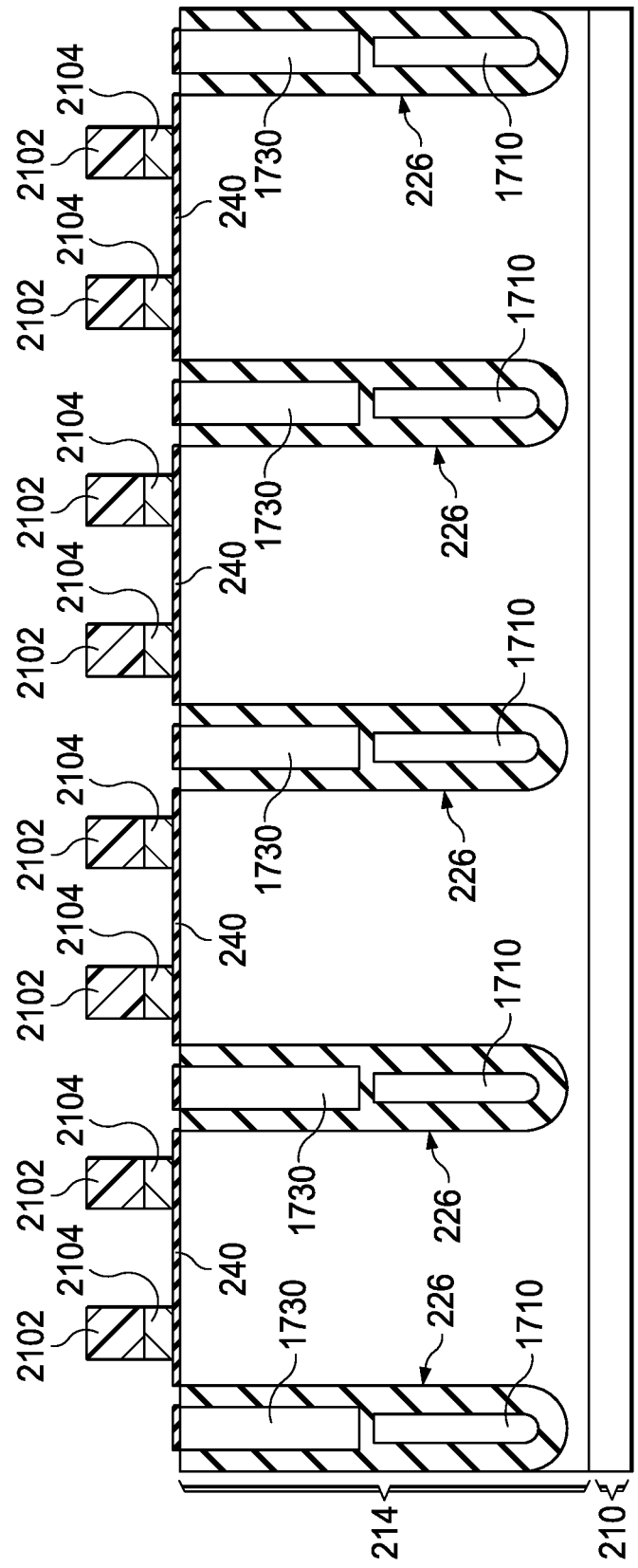

As shown in FIGS. 22A-22B, after patterned mask layer 2102 has been formed, the exposed regions of the layer of gate material 242 are etched in a conventional manner to expose gate dielectric layer 240 and form a number of gates 2104. The gates 2104 differ from the gates 246 in that, as shown in FIG. 22A, the gates 2104 have a series of openings 2106, a series of connecting segments 2108, and a series of split-gate segments 2110 that laterally surround the openings 2106. The segments are connected together such that each adjacent pair of split-gate segments 2110 is connected together by a connecting segment 2108.

The openings 2106 can implement the openings 2012 of MOS transistor 2000, the connecting segments 2108 can implement the connecting segments 2014, and the split-gate segments 2110 can implement the split-gate segments 2016. Following the etch, patterned mask layer 2102 is removed in a conventional fashion.

Figure 23A:
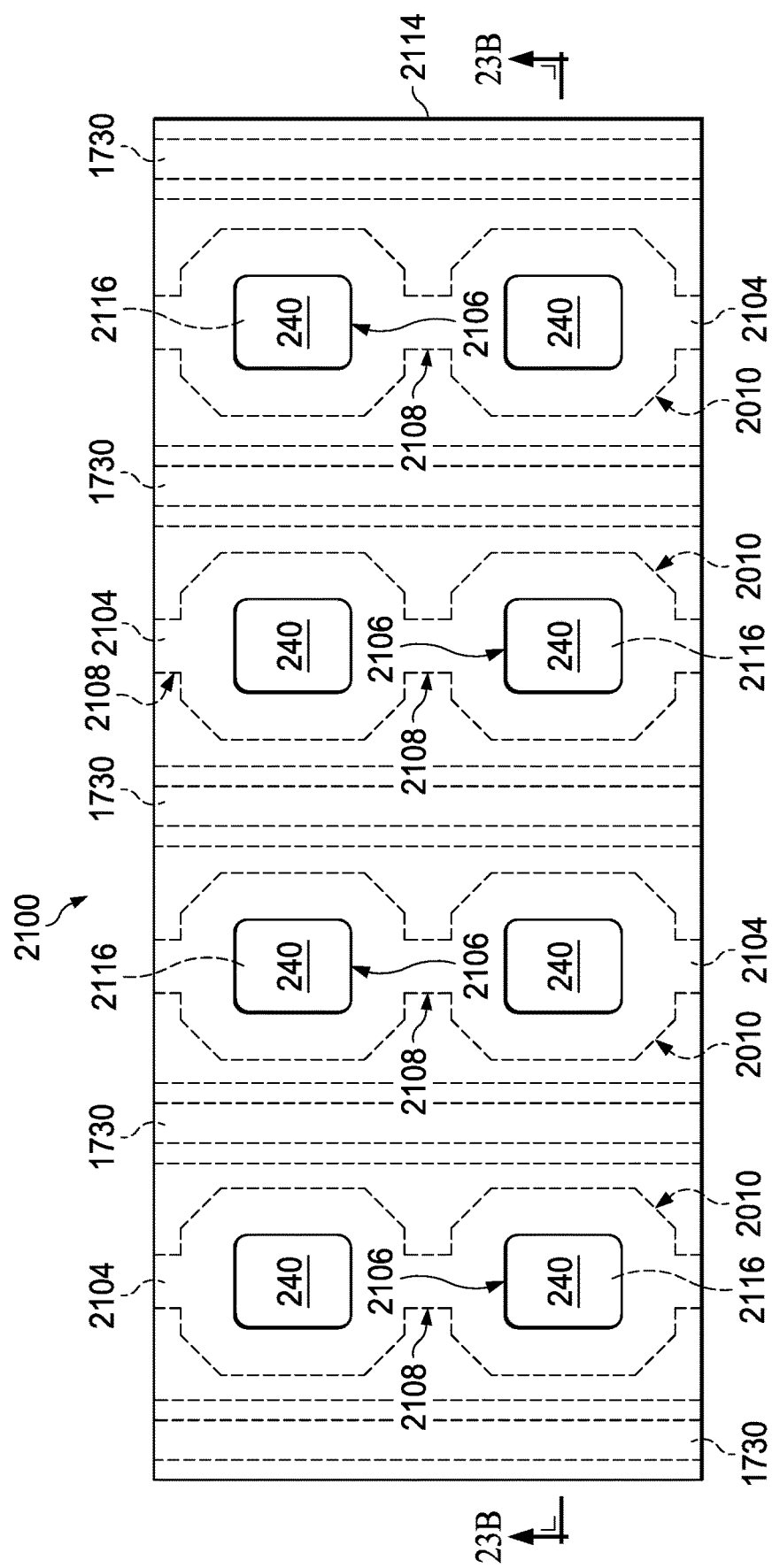
Figure 23B:
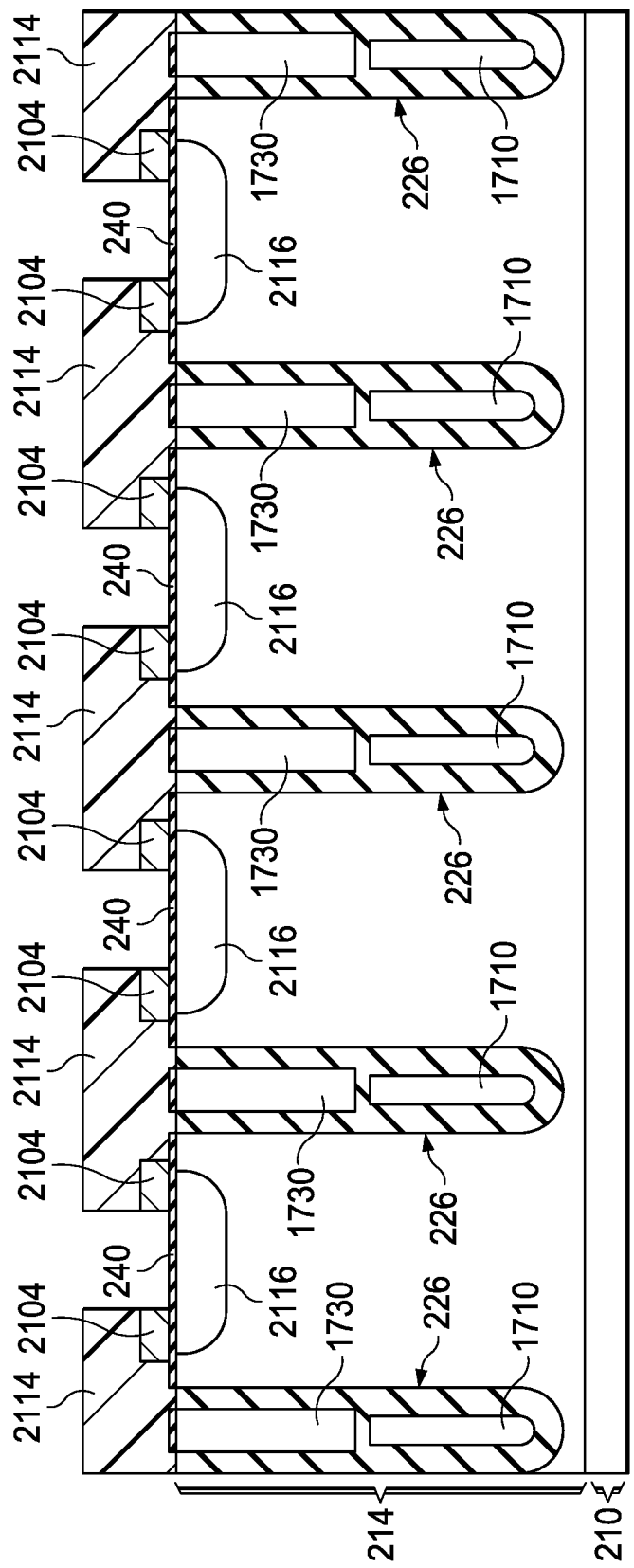

As shown in FIGS. 23A-23B, after patterned mask layer 2102 has been removed, a patterned photoresist layer 2114 is formed on gate dielectric layer 240 and the gates 2104 in a conventional manner. Following this, dopants are implanted into epitaxial layer 214 through patterned photoresist layer 2114 to form a number of body regions 2116 in the same manner as the body regions 252 are formed.

The body regions 2116 differ from the body regions 252 in that each body region 2116 lies below both of the split gates 2104 of each split-gate segment 2110, and laterally between and spaced apart from a pair of adjacent trench structures 226. Following the implant, patterned photoresist layer 2114 is removed in a conventional manner. In the present example, a p-type dopant, such as boron, is implanted to form the body regions 2116.

Figure 24A:
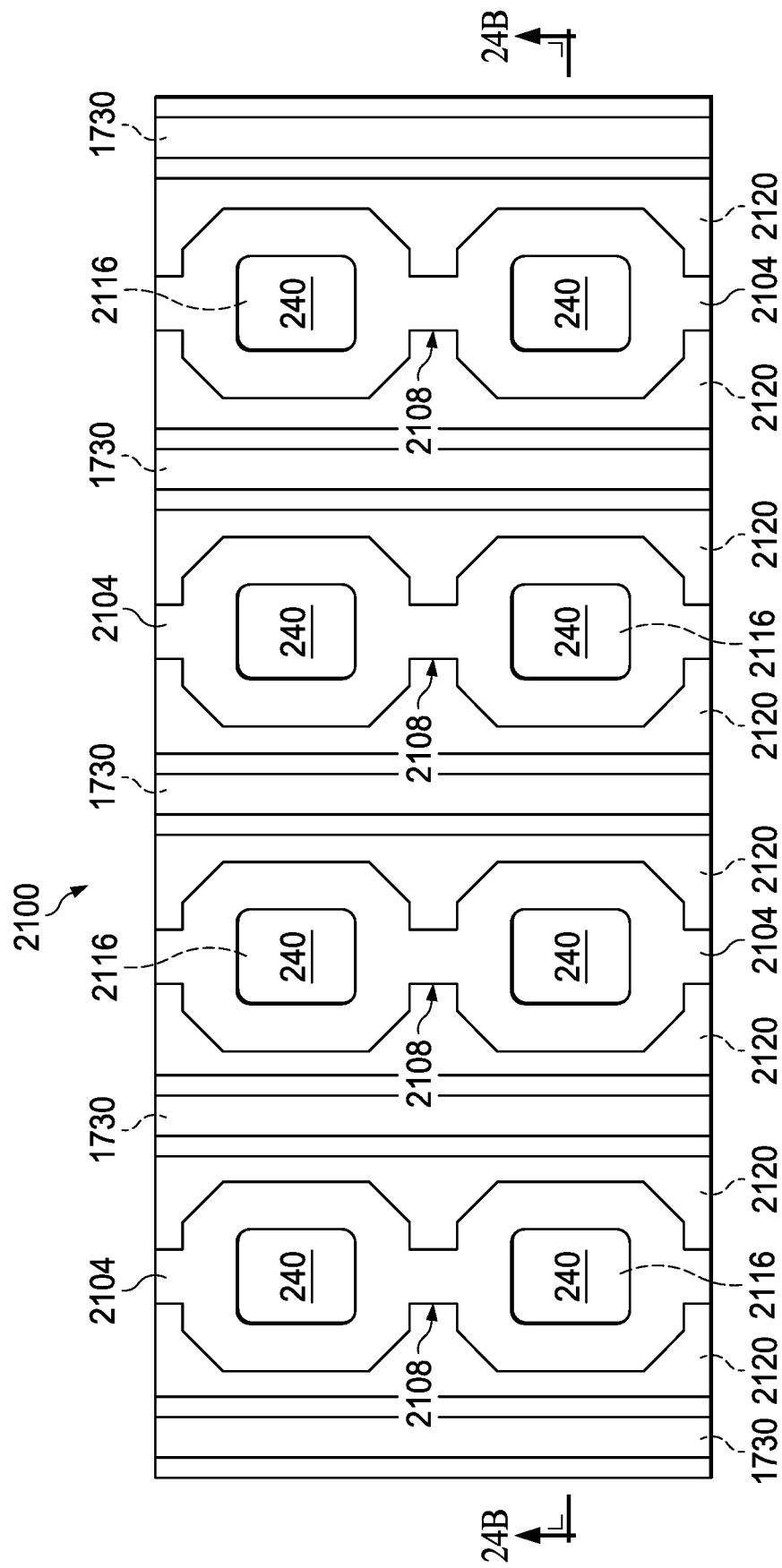
Figure 24B:
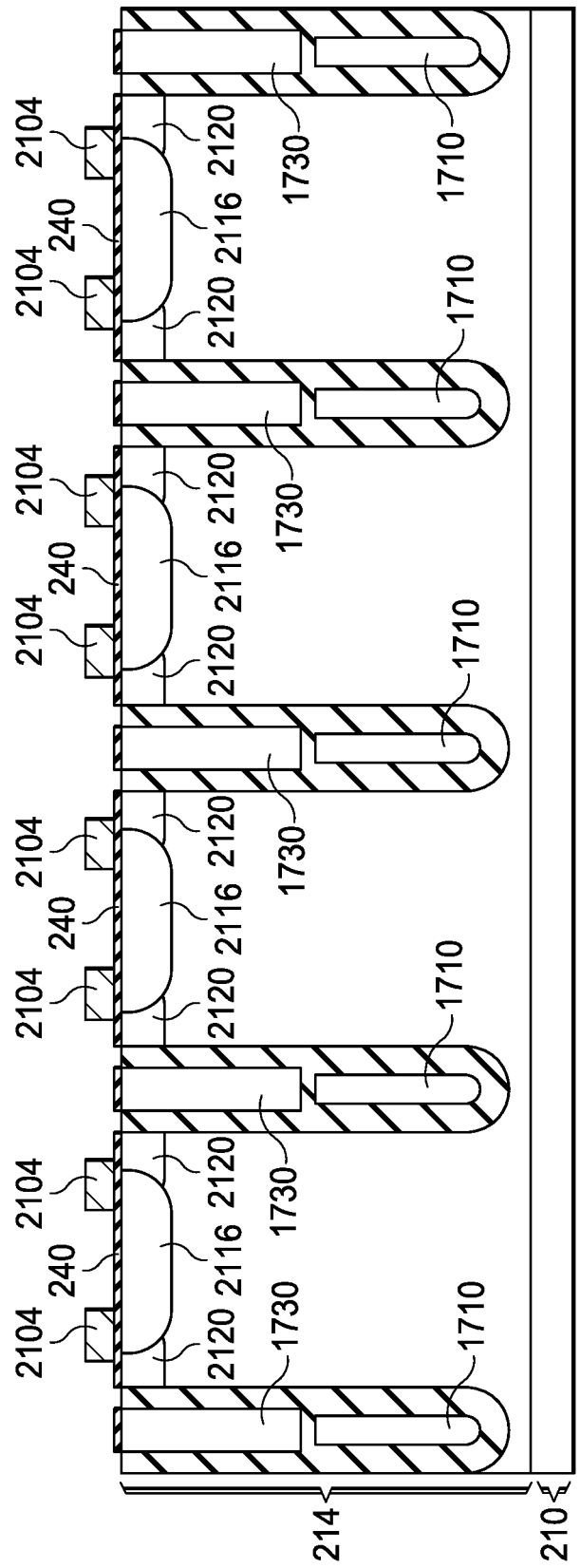

As shown in FIGS. 24A-24B, following the formation of the body regions 2116, dopants having an opposite conductivity type are blanket implanted into epitaxial layer 214 to form a number of LDD regions 2120 in the same manner as the LDD regions 254 are formed. Although dopants are also implanted into the body regions 2116, the dose is insufficient to change the conductivity type of the body regions. In the present example, an n-type dopant, such as phosphorous or arsenic, is implanted to form the LDD regions 2120.

Figure 25A:
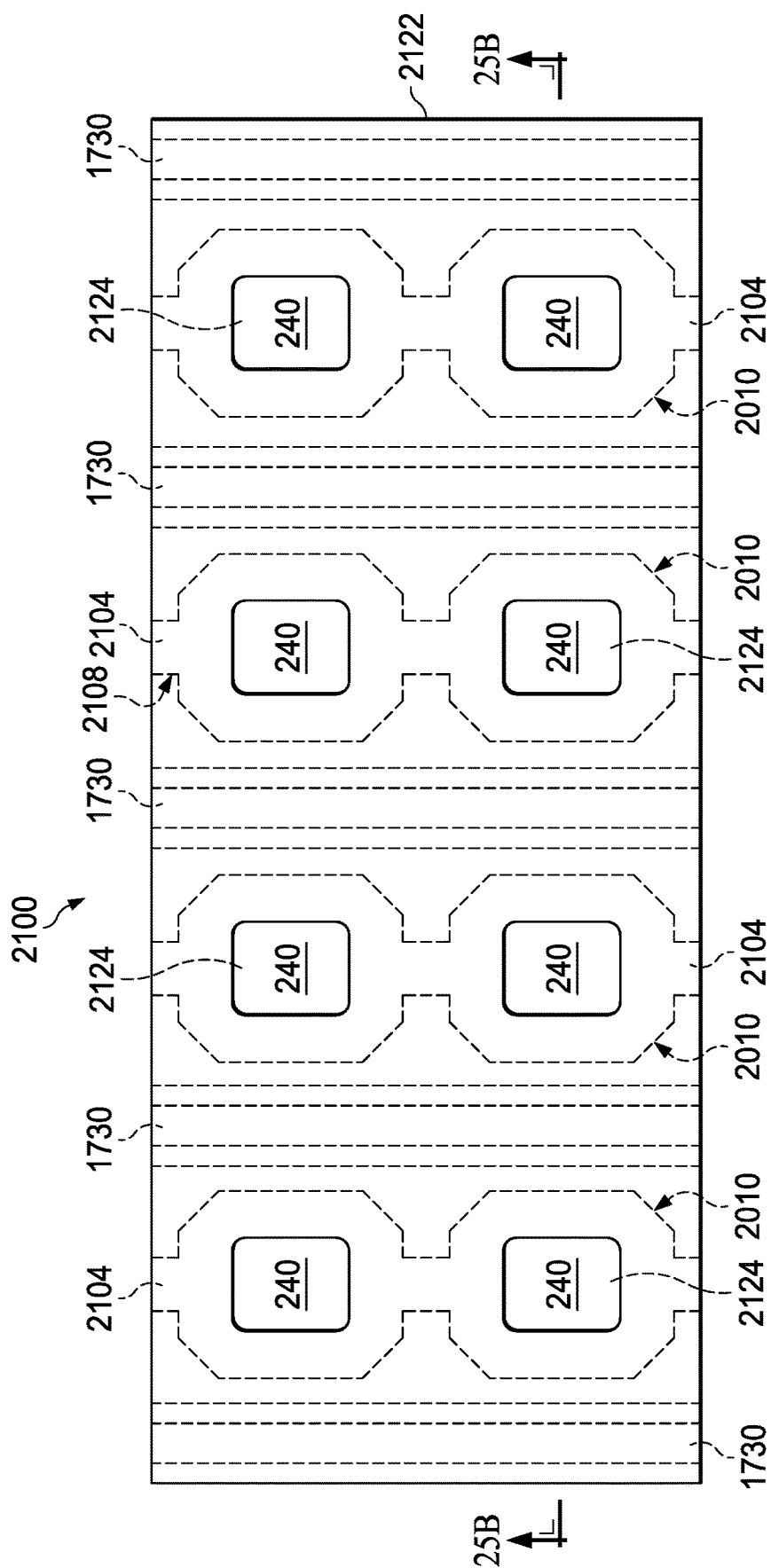
Figure 25B:
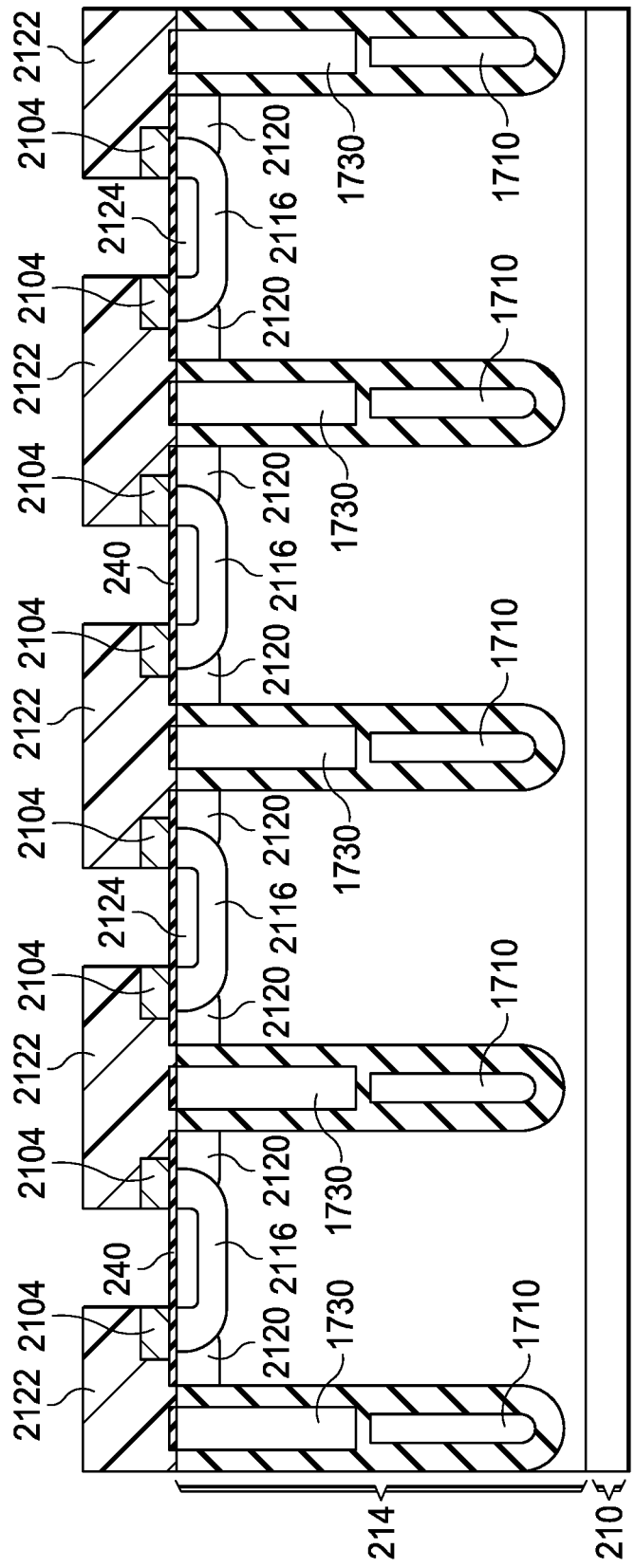

As shown in FIGS. 25A-25B, a patterned photoresist layer 2122 is next conventionally formed on gate dielectric layer 240 and the gates 2104. After this, dopants having the same conductivity type as epitaxial layer 214 are implanted through patterned photoresist layer 2122 to form a number of source regions 2124 in the same manner as the source regions 262 are formed. Following the implant, patterned photoresist layer 2122 is removed in a conventional manner. In the present example, the source regions 2124 are n+ regions.

Figure 26A:
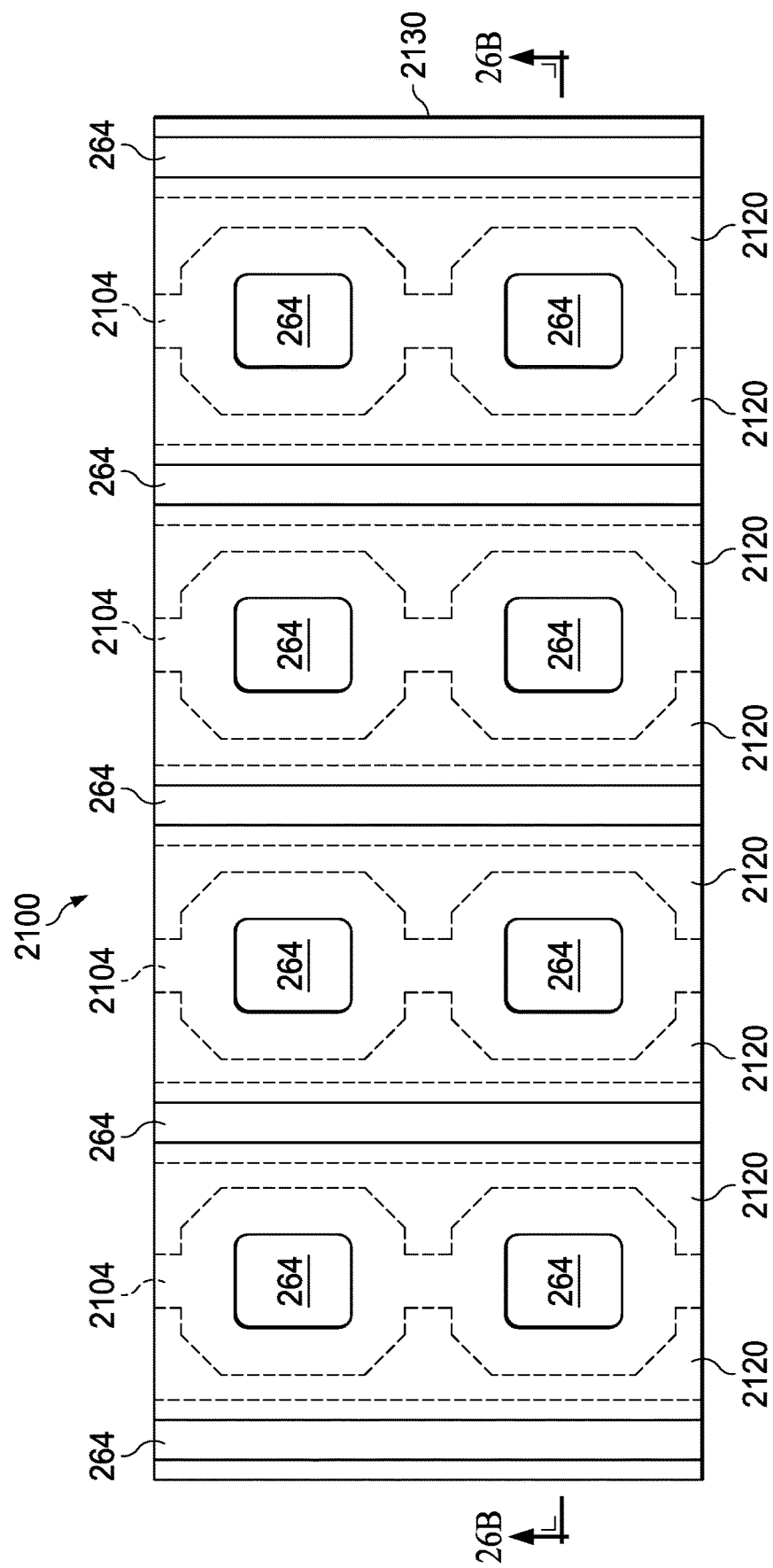
Figure 26B:
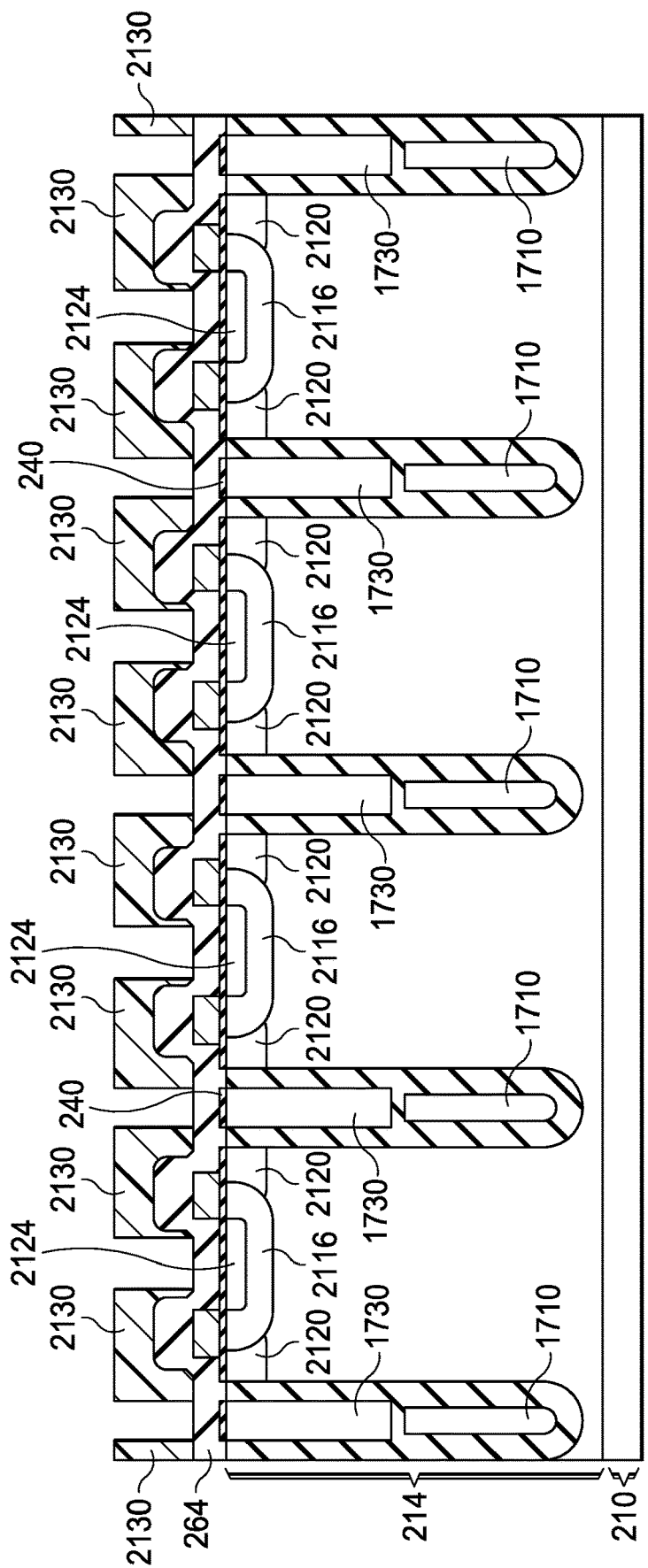

As shown in FIGS. 26A-26B, after patterned photoresist layer 2122 has been removed, dielectric layer 264 is deposited on the gate dielectric layers 240 and the gates 2104. Once dielectric layer 264 has been formed, a patterned photoresist layer 2130 is conventionally formed on dielectric layer 264.

Figure 27A:
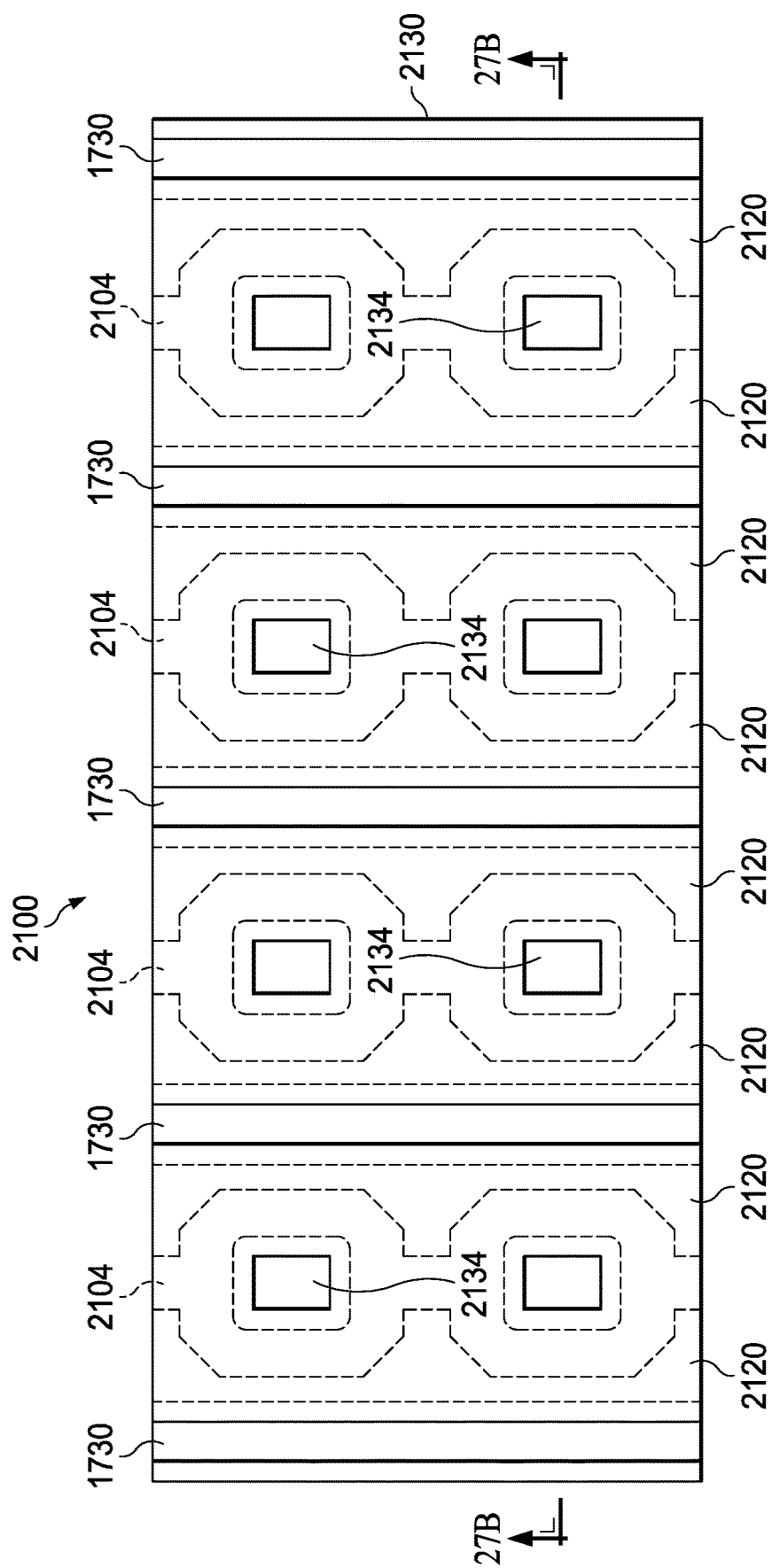
Figure 27B:
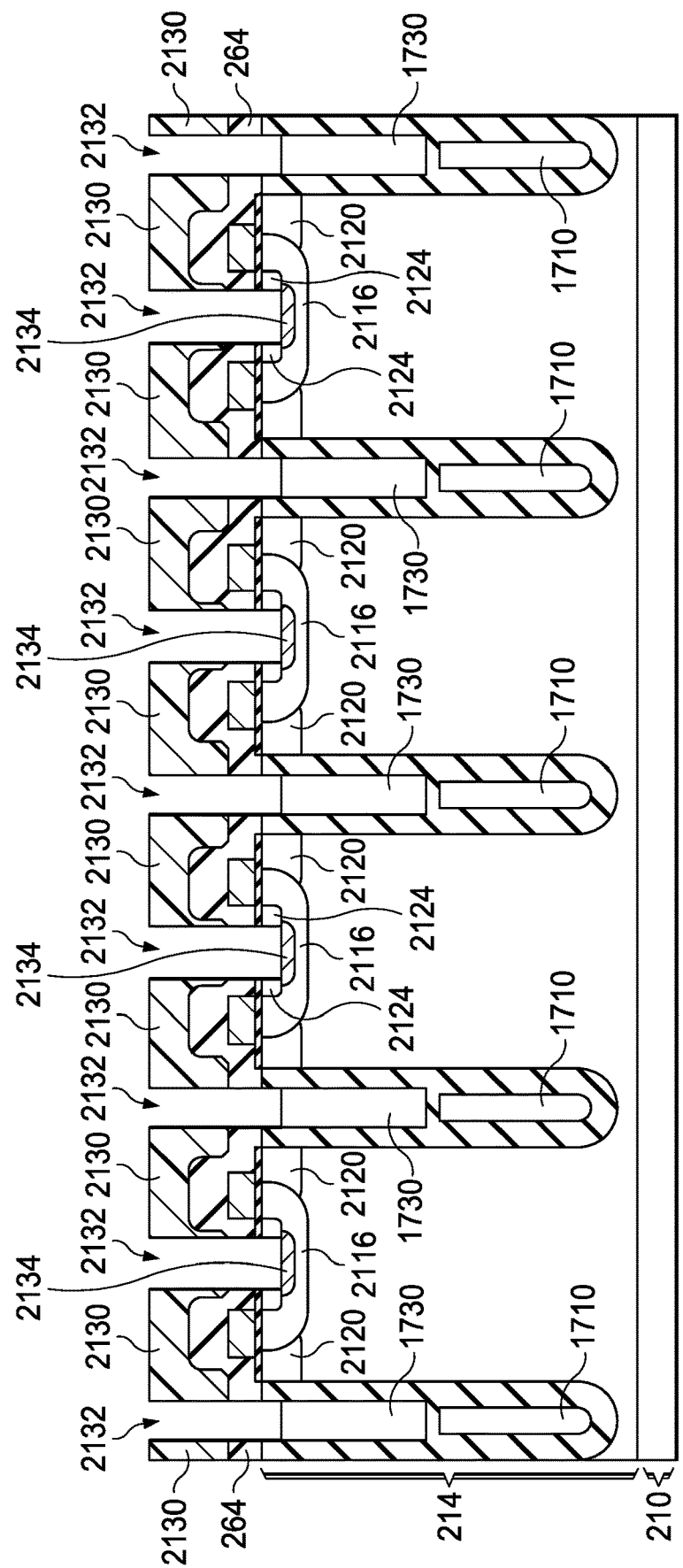

As shown in FIGS. 27A-27B, after patterned photoresist layer 2130 has been formed, the exposed regions of dielectric layer 264 and the underlying portions of the source regions 2124, the body regions 2116, non-conductive region 1732, and conductive region 1730 are etched to form a number of openings 2132 that extend down approximately 200 nm to 400 nm below the top surface of epitaxial layer 214. The openings 2132 extend through and expose the source regions 2124, expose the body regions 2116, and expose the upper conductive (field plate) regions 1730.

Following this, dopants having the opposite conductivity type as epitaxial layer 214 are implanted through patterned photoresist layer 2130 to form a number of body contact regions 2134 in the same manner that the body contact regions 270 are formed. In the present example, boron is implanted to form the body contact regions 2134 as p+ regions. Following the implant, patterned photoresist layer 2130 is removed in a conventional manner.

The dopants in the body contact regions 2134, source regions 2124, LDD regions 2120 are diffused and activated by an anneal operation. The anneal operation may include heating at 1000° C. for 20 minutes in a nitrogen ambient or equivalent anneal conditions, for example, 1050° C. for 5 minutes, or 975° C. for 40 minutes.

Figure 28A:
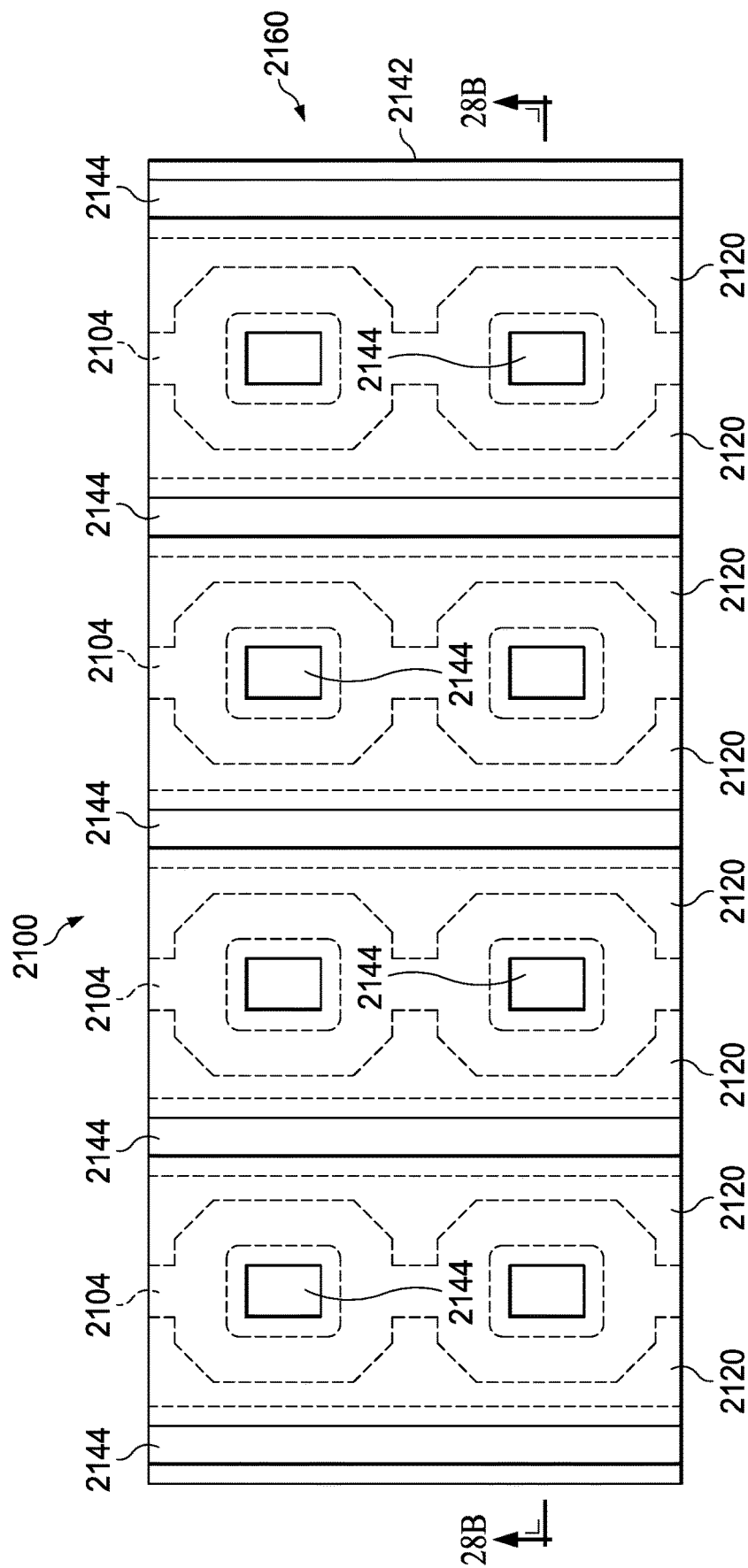
Figure 28B:
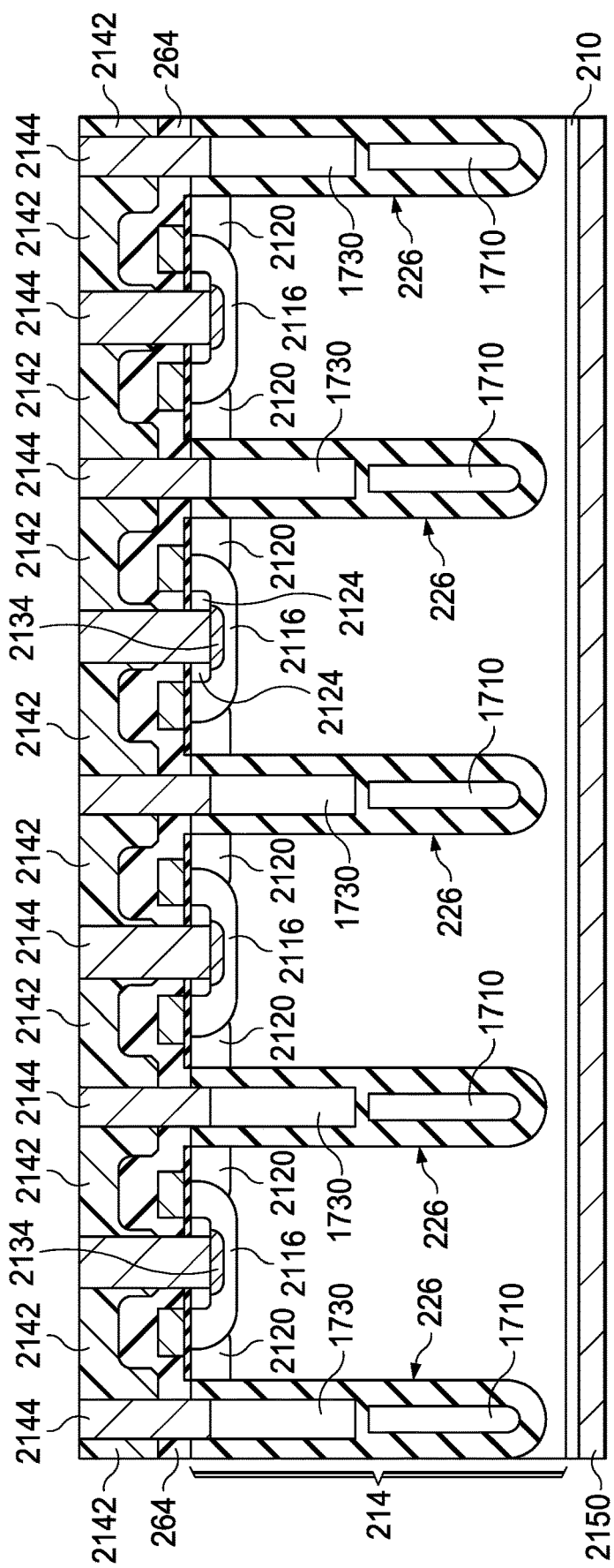

As shown in FIGS. 28A-28B, method 2100 next forms a metal interconnect structure 2140 in the same manner that metal interconnection structure 274 is formed. Metal interconnect structure 2140 has a non-conductive layer 2142, which is the same as non-conductive layer 276, that touches dielectric layer 264, and a number of metal contacts 2144, which are the same as the metal contacts 278, that extend through non-conductive layer 2142 and dielectric layer 264. The metal contacts 2144 include a number of source-body contacts that touch the source regions 2124 and the body contact regions 2134, a number of plate contacts that touch the upper conductive (field plate) regions 1730, and a number of gate contacts that touch the gates 2104. (The plate contacts 2144 are illustrated as strips, but can alternately be formed as periodic contacts by modifying patterned photoresist layer 2130.) Dielectric layer 264 and non-conductive layer 2142 can be used to implement non-conductive layer 154 of MOS transistor 2000.

After metal interconnect structure 2140 has been formed, the backside is ground down and a metal contact 2150 is formed to touch and make an electrical connection to substrate 210, and form a vertical high-voltage MOS transistor 2160. Method 2100 then continues with conventional back-end processing steps. MOS transistor 2160 can alternately be formed with a polysilicon field plate or a single-crystal silicon field plate.

It should be understood that the above descriptions are examples of the present disclosure, and that various alternatives of the disclosure described herein may be employed in practicing the disclosure. Thus, it is intended that the following claims define the scope of the disclosure and that structures and methods within the scope of these claims and their equivalents be covered thereby.

What is claimed is:

1. A transistor, comprising:
a semiconductor material having a first surface and a second surface opposite the first surface;
a first drain region between the second surface and the first surface;
a second drain region between the first drain region and the first surface;
a body region between the first drain region and the first surface;
a trench structure extending from the first surface of the semiconductor device toward the first drain region and between the second drain region and the body region, the trench structure having a first sidewall and an opposite second sidewall, the first sidewall abutting the body region, the second sidewall abutting the second drain region; and
a body contact region completely within the body region and abutting the first sidewall, the body contact region and the body region having a same conductivity type.

2. The transistor of claim 1, wherein:
the body region includes a p-type dopant; and
the second drain region includes an n-type dopant and has a lower implant dosage than the body region.

3. The transistor of claim 1, further comprising:
a source region within the body region and adjacent to the first sidewall.

4. The transistor of claim 1, further comprising:
a source-body metal layer extending downward from the first surface of the semiconductor material and penetrating the trench structure along the first sidewall.

5. The transistor of claim 1, further comprising:
a gate electrode above the body region; and
a gate dielectric layer between the first surface of the semiconductor material and the gate electrode.

6. The transistor of claim 1, wherein the trench structure includes a conductive field plate and a non-conductive liner insulating the conductive field plate from the first drain region, the second drain region, and the body region.

7. The transistor of claim 1, wherein the trench structure includes:
a lower conductive field plate;
an upper conductive field plate spaced apart from the lower conductive field plate; and
a non-conductive liner insulating the lower and upper conductive field plates from the first drain region, the second drain region, and the body region.

8. The transistor of claim 1, further comprising:
a conductive field plate in the trench structure;
a source region within the body region and intersecting the first surface; and
a source-body metal contact contacting the body contact region, the source region, and the conductive field plate in the trench structure.

9. The transistor of claim 1, wherein the trench structure extends to a position adjacent the first drain region.

10. The transistor of claim 1, wherein the semiconductor material is a substrate.

11. A transistor, comprising:
a semiconductor material having a first surface and a second surface opposite the first surface;
a first drain region intersecting the second surface;
a second drain region between the first drain region and the first surface;
a body region between the first drain region and the first surface;
a trench structure extending from the first surface of the semiconductor material between the second drain region and the body region toward the first drain region, the trench structure having a first sidewall and an opposite second sidewall, the first sidewall abutting the body region but not the second drain region the second sidewall abutting the second drain region but not the body region; and
a body contact region completely within the body region and abutting the first sidewall, the body contact region and the body region having a same conductivity type.

12. The transistor of claim 11, wherein:
the body region includes a p-type dopant; and
the second drain region includes an n-type dopant and has a lower dopant concentration than the body region.

13. The transistor of claim 11, further comprising:
a gate electrode located proximate the body region; and
a gate dielectric layer between the gate electrode and the body region.

14. The transistor of claim 11, wherein the trench structure includes a conductive field plate and a non-conductive liner insulating the conductive field plate from the first drain region, the second drain region, and the body region.

15. The transistor of claim 11, wherein the trench structure includes:
a lower conductive field plate;
an upper conductive field plate spaced apart from the lower conductive field plate; and
a non-conductive liner insulating the lower conductive field plate and the upper conductive field plate from the first drain region, the second drain region, and the body region.

16. The transistor of claim 11, further comprising:
a conductive field plate in the trench structure;
a source region within the body region and above the body contact region; and
a source-body metal contact contacting the body contact region, the source region, and the conductive field plate in the trench structure.

17. The transistor of claim 11, wherein the trench structure extends to a position adjacent the first drain region.

18. The transistor of claim 11, wherein the semiconductor material is a substrate.

19. A device, comprising:
a semiconductor material having a first surface and a second surface; and
a transistor having transistor cells, each of the transistor cells including:
a first drain region above the second surface;
a trench structure extending from the first surface toward the first drain region;
a second drain region above the first drain region and abutting the trench structure;
a body region above the first drain region and abutting the trench structure; and
a body contact region completely within the body region and abutting the trench structure, the body contact region and the body region having a same conductivity type.

20. The transistor of claim 19, wherein:
the body region includes a p-type dopant and abuts the second drain region; and
the second drain region is outside the body region, the second drain region includes an n-type dopant and has a lower implant dosage than the body region.

21. The transistor of claim 19, further comprising:
a conductive field plate in the second trench structure;
a source region within the body region and above the body contact region; and
a source-body metal contact contacting the body contact region, the source region, and the conductive field plate in the second trench structure.

22. The transistor of claim 19, wherein each of the first and second trench structures includes:
a lower conductive field plate;
an upper conductive field plate spaced apart from the lower conductive field plate; and
a non-conductive liner insulating the lower conductive field plate and the upper conductive field plate from the first drain region, the second drain region, and the body region.

23. The transistor of claim 19, further comprising:
a perimeter trench structure laterally surrounding the transistor cells.

24. The transistor of claim 16, wherein the trench structures extend to a position adjacent the first drain region.

25. The transistor of claim 19, wherein the semiconductor material is a substrate.

26. A transistor, comprising:
a semiconductor material having a first surface and a second surface opposite the second surface;
a drain region between the second surface and the first surface;
a body region between the second surface and the first surface;
a trench structure extending from the first surface of the semiconductor material toward the second surface, the trench structure having a first sidewall and a second sidewall opposite the first sidewall, the first sidewall abutting the body region but not the drain region, the second sidewall abutting the drain region but not the body region; and
a body contact region completely within the body region and abutting the first sidewall, the body contact region and the body region having a same conductivity type,
wherein the drain region abuts the first surface and the body region abuts the first surface.

* * * * *